US008824183B2

(12) United States Patent
Samachisa et al.

(10) Patent No.: US 8,824,183 B2
(45) Date of Patent: Sep. 2, 2014

(54) NON-VOLATILE MEMORY HAVING 3D ARRAY OF READ/WRITE ELEMENTS WITH VERTICAL BIT LINES AND SELECT DEVICES AND METHODS THEREOF

(75) Inventors: George Samachisa, San Jose, CA (US); Johann Alsmeier, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 169 days.

(21) Appl. No.: 13/323,780

(22) Filed: Dec. 12, 2011

(65) Prior Publication Data

US 2012/0147650 A1 Jun. 14, 2012

Related U.S. Application Data

(60) Provisional application No. 61/423,007, filed on Dec. 14, 2010.

(51) Int. Cl.
G11C 5/02 (2006.01)
(52) U.S. Cl.
USPC .......................................................... 365/51
(58) Field of Classification Search
USPC .......................................................... 365/51
See application file for complete search history.

(56) References Cited

U.S. PATENT DOCUMENTS

| 5,172,338 | A | 12/1992 | Mehrotra et al. |
| 5,172,338 | B1 | 12/1992 | Mehrotra et al. |
| 5,570,315 | A | 10/1996 | Tanaka et al. |
| 5,774,397 | A | 6/1998 | Endoh et al. |
| 6,046,935 | A | 4/2000 | Takeuchi et al. |
| 6,222,762 | B1 | 4/2001 | Guterman et al. |
| 6,373,746 | B1 | 4/2002 | Takeuchi et al. |
| 6,456,528 | B1 | 9/2002 | Chen |
| 6,522,580 | B2 | 2/2003 | Chen et al. |
| 6,538,922 | B1 | 3/2003 | Khalid et al. |
| 6,643,188 | B2 | 11/2003 | Tanaka et al. |
| 6,678,192 | B2 | 1/2004 | Gongwer et al. |

(Continued)

FOREIGN PATENT DOCUMENTS

WO WO 2010/117912 10/2010

OTHER PUBLICATIONS

Notification of Transmittal of the International Search Report and the Written Opinion of the International Searching Authority, or the Declaration for Int'l Application No. PCT/US2011/064700 dated Mar. 9, 2012, 11 pages.

(Continued)

*Primary Examiner* — Huan Hoang
*Assistant Examiner* — Pablo Huerta
(74) *Attorney, Agent, or Firm* — Davis Wright Tremaine LLP

(57) ABSTRACT

A three-dimensional memory is formed as an array of memory elements that are formed across multiple layers of planes positioned at different distances above a semiconductor substrate. The memory elements reversibly change a level of electrical conductance in response to a voltage difference being applied across them. The three-dimensional array includes a two-dimensional array of pillar lines acting as local vertical bit lines through the multiple layers of planes which together with arrays of word lines on each plane are used to access the memory elements. The three-dimensional memory is formed over a CMOS substrate with an intermediate pillar select layer. The pillar select layer is formed with a plurality of pillar select devices which are switching transistors formed outside the CMOS and serve to switch selected rows of pillar lines to corresponding metal lines on the substrate.

20 Claims, 70 Drawing Sheets

(56) References Cited

U.S. PATENT DOCUMENTS

| | | |
|---|---|---|
| 6,771,536 B2 | 8/2004 | Li et al. |
| 6,781,877 B2 | 8/2004 | Cernea et al. |
| 7,023,739 B2 | 4/2006 | Chen et al. |
| 7,177,191 B2 | 2/2007 | Fasoli et al. |
| 7,237,074 B2 | 6/2007 | Guterman et al. |
| 7,324,393 B2 | 1/2008 | Chan et al. |
| 7,342,279 B2 | 3/2008 | Harari et al. |
| 7,983,065 B2 | 7/2011 | Samchisa |
| 8,351,236 B2 | 1/2013 | Yan et al. |
| 2006/0184720 A1 | 8/2006 | Sinclair et al. |
| 2008/0101109 A1 | 5/2008 | Haring-Bolivar et al. |
| 2008/0175032 A1* | 7/2008 | Tanaka et al. .................. 365/51 |
| 2009/0001344 A1 | 1/2009 | Schricker et al. |
| 2010/0259961 A1* | 10/2010 | Fasoli et al. .................. 365/51 |
| 2012/0147649 A1 | 6/2012 | Samachisa et al. |

OTHER PUBLICATIONS

Notification of Transmittal of the International Search Report and the Written Opinion of the International Searching Authority, or the Declaration for Int'l Application No. PCT/US2011/064695 dated Mar. 9, 2012, 11 pages.

Office Action, U.S. Appl. No. 13/323,766, mailed on Mar. 15, 2013, 12 pages.

Notice of Allowance and Fees Due, U.S. Appl. No. 3/323,766, mailed on Sep. 16, 2013, 9 pages.

* cited by examiner

READ Bias Voltage and Leakage Current Flow
Double Global Bit line Structure

FIG. 19  Single-Sided Word line Structure

READ Bias Voltage and Leakage Current Flow
Single-Sided Word line Structure

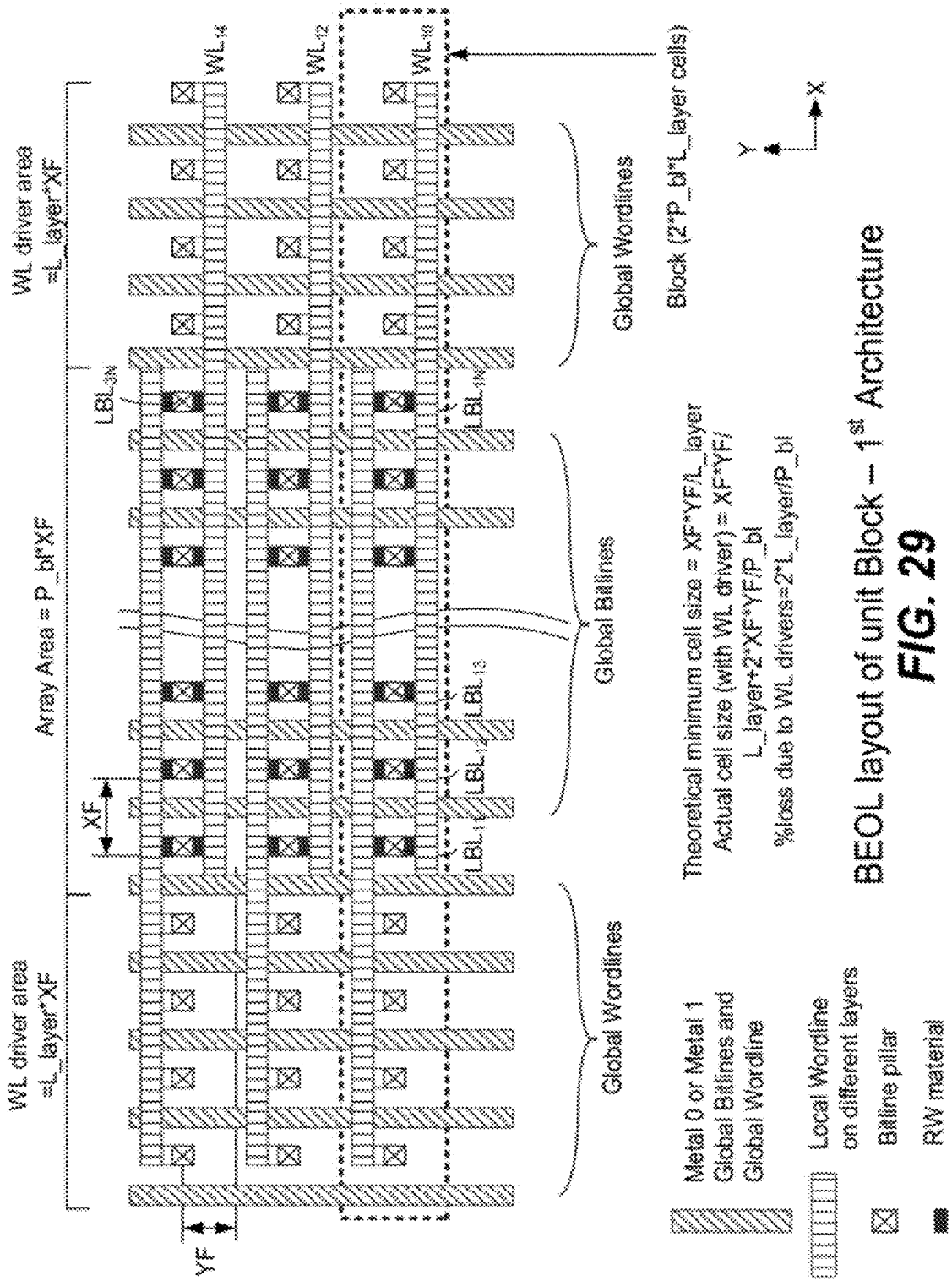

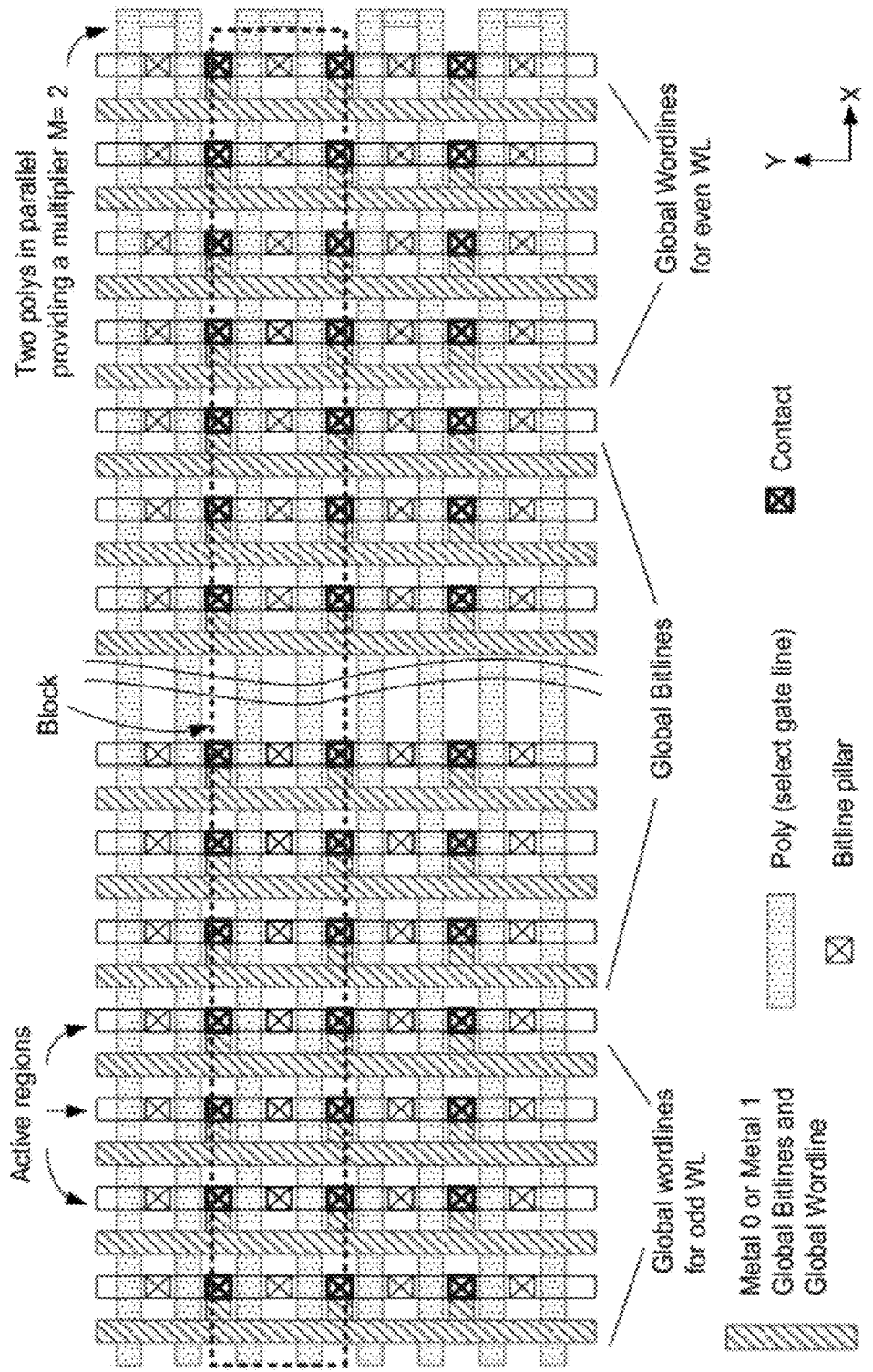
FIG. 30A  FEOL layout of unit Block with 1st BEOL Architecture - 1st Embodiment FEOL layout of unit Block with 1st BEOL Architecture – 2nd Embodiment FEOL layout of unit Block with 1st BEOL Architecture – 3rd Embodiment

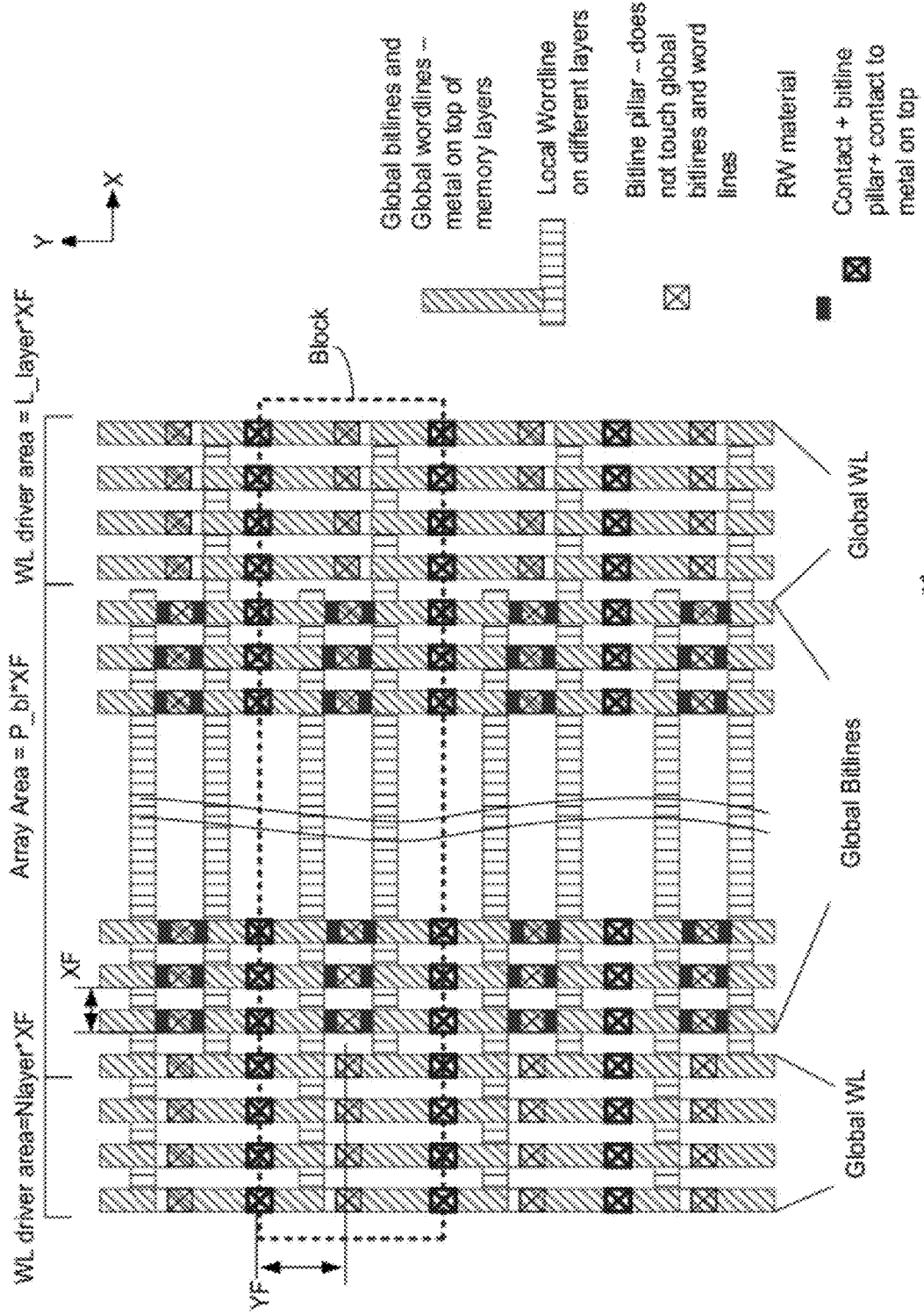

BEOL layout of unit Block – 2nd Architecture - Cross Section

Trench process

Trench process

Trench process

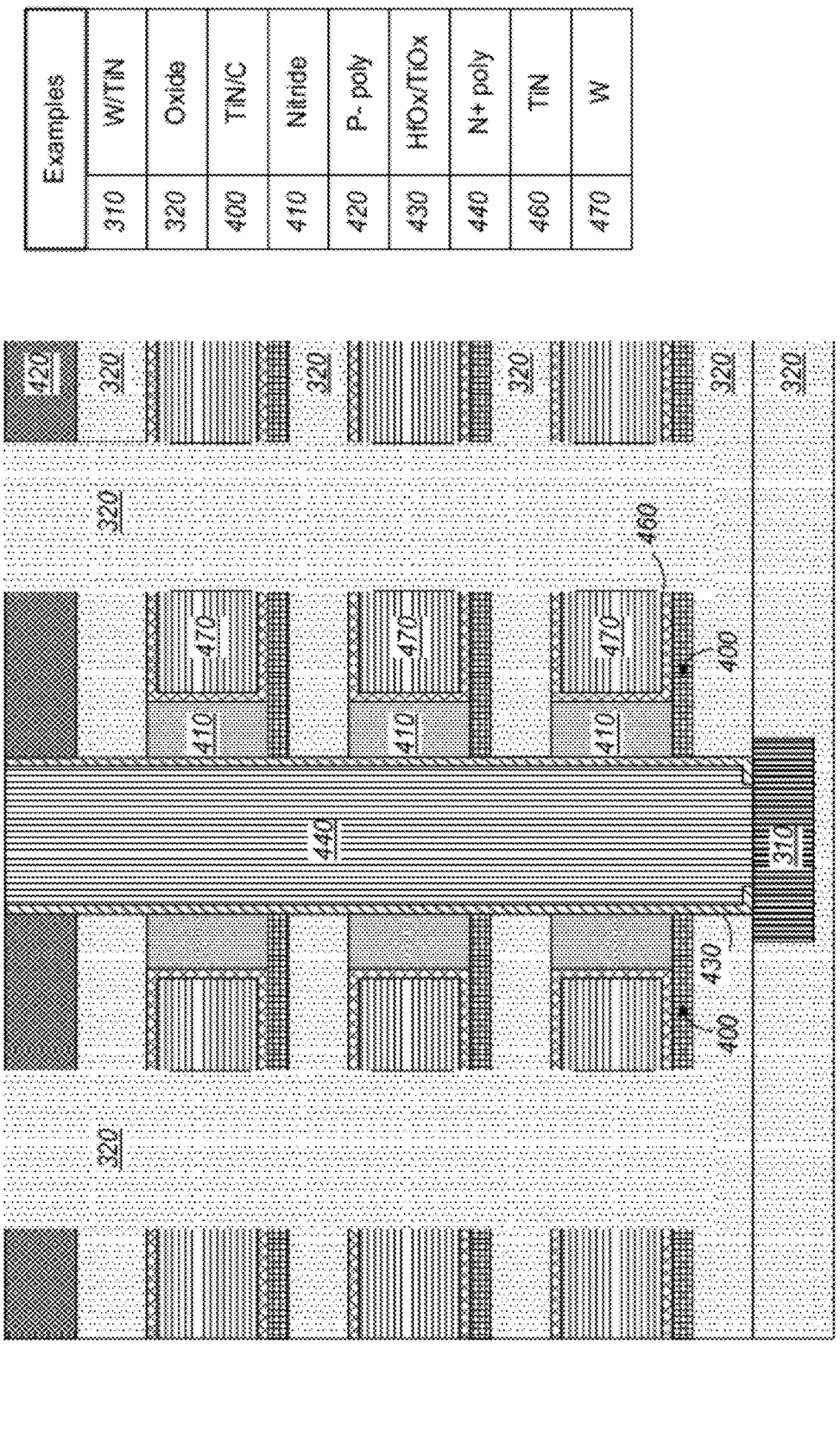
FIG. 37I  Trench process

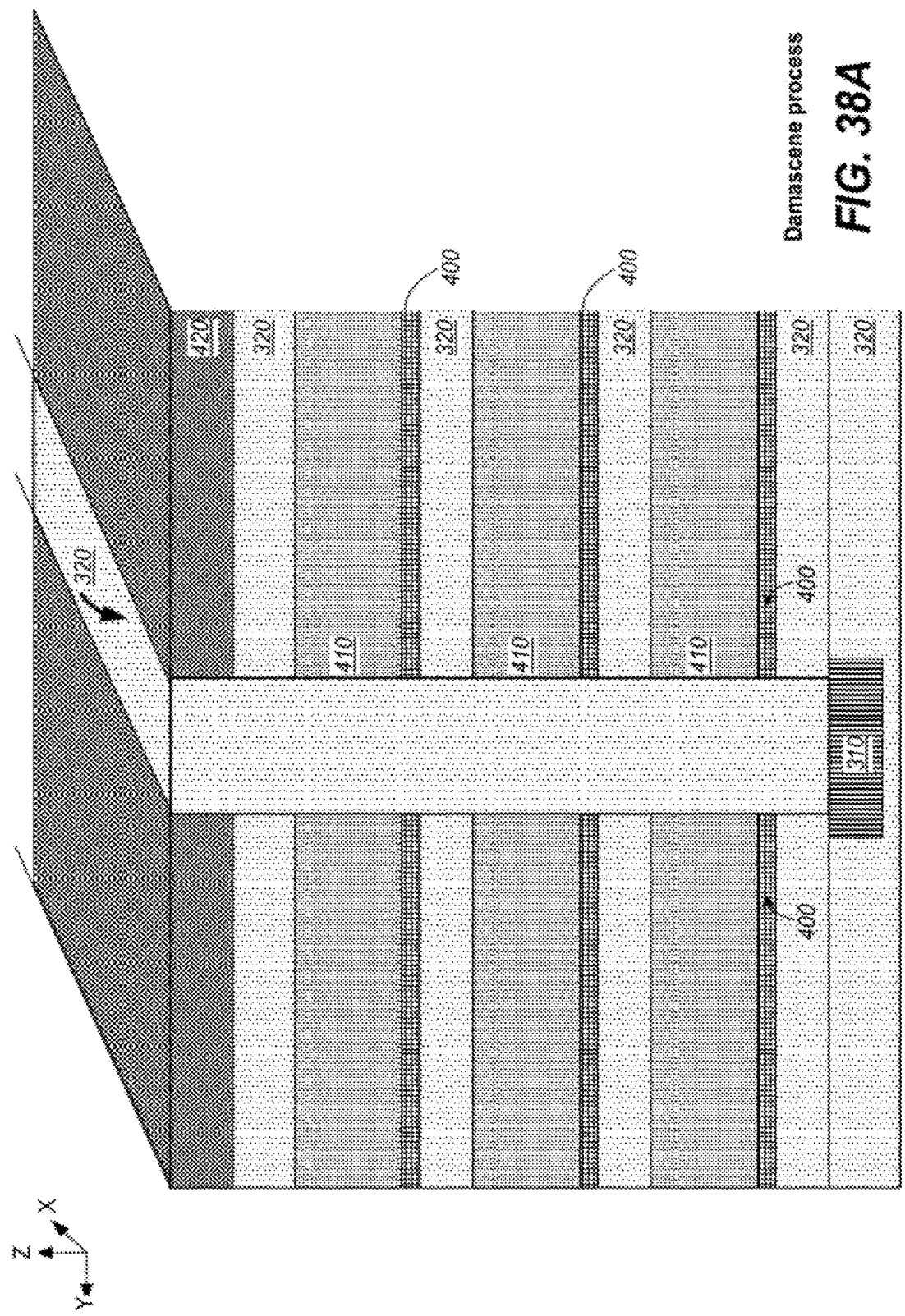
FIG. 38A Damascene process

Damascene process

Damascene process

Damascene process

NON-VOLATILE MEMORY HAVING 3D ARRAY OF READ/WRITE ELEMENTS WITH VERTICAL BIT LINES AND SELECT DEVICES AND METHODS THEREOF

CROSS-REFERENCE TO RELATED APPLICATIONS

The benefit is claimed of U.S. provisional patent application of George Samachisa, Johann Alsmeier, Roy Edwin Scheuerlein, Application No. 61/423,007 filed on Dec. 14, 2010.

BACKGROUND

The subject matter of this application is the structure, use and making of re-programmable non-volatile memory cell arrays, and, more specifically, to three-dimensional arrays of memory storage elements formed on semiconductor substrates.

Uses of re-programmable non-volatile mass data storage systems utilizing flash memory are widespread for storing data of computer files, camera pictures, and data generated by and/or used by other types of hosts. A popular form of flash memory is a card that is removably connected to the host through a connector. There are many different flash memory cards that are commercially available, examples being those sold under trademarks CompactFlash (CF), the MultiMediaCard (MMC), Secure Digital (SD), miniSD, microSD, Memory Stick, Memory Stick Micro, xD-Picture Card, SmartMedia and TransFlash. These cards have unique mechanical plugs and/or electrical interfaces according to their specifications, and plug into mating receptacles provided as part of or connected with the host.

Another form of flash memory systems in widespread use is the flash drive, which is a hand held memory system in a small elongated package that has a Universal Serial Bus (USB) plug for connecting with a host by plugging it into the host's USB receptacle. SanDisk Corporation, assignee hereof, sells flash drives under its Cruzer, Ultra and Extreme Contour trademarks. In yet another form of flash memory systems, a large amount of memory is permanently installed within host systems, such as within a notebook computer in place of the usual disk drive mass data storage system. Each of these three forms of mass data storage systems generally includes the same type of flash memory arrays. They each also usually contain its own memory controller and drivers but there are also some memory only systems that are instead controlled at least in part by software executed by the host to which the memory is connected. The flash memory is typically formed on one or more integrated circuit chips and the controller on another circuit chip. But in some memory systems that include the controller, especially those embedded within a host, the memory, controller and drivers are often formed on a single integrated circuit chip.

There are two primary techniques by which data are communicated between the host and flash memory systems. In one of them, addresses of data files generated or received by the system are mapped into distinct ranges of a continuous logical address space established for the system. The extent of the address space is typically sufficient to cover the full range of addresses that the system is capable of handling. As one example, magnetic disk storage drives communicate with computers or other host systems through such a logical address space. The host system keeps track of the logical addresses assigned to its files by a file allocation table (FAT) and the memory system maintains a map of those logical addresses into physical memory addresses where the data are stored. Most memory cards and flash drives that are commercially available utilize this type of interface since it emulates that of magnetic disk drives with which hosts have commonly interfaced.

In the second of the two techniques, data files generated by an electronic system are uniquely identified and their data logically addressed by offsets within the file. Theses file identifiers are then directly mapped within the memory system into physical memory locations. Both types of host/memory system interfaces are described and contrasted elsewhere, such as in patent application publication no. US 2006/0184720 A1.

Flash memory systems typically utilize integrated circuits with arrays of memory cells that individually store an electrical charge that controls the threshold level of the memory cells according to the data being stored in them. Electrically conductive floating gates are most commonly provided as part of the memory cells to store the charge but dielectric charge trapping material is alternatively used. A NAND architecture is generally preferred for the memory cell arrays used for large capacity mass storage systems. Other architectures, such as NOR, are typically used instead for small capacity memories. Examples of NAND flash arrays and their operation as part of flash memory systems may be had by reference to U.S. Pat. Nos. 5,570,315, 5,774,397, 6,046,935, 6,373,746, 6,456,528, 6,522,580, 6,643,188, 6,771,536, 6,781,877 and 7,342,279.

The amount of integrated circuit area necessary for each bit of data stored in the memory cell array has been reduced significantly over the years, and the goal remains to reduce this further. The cost and size of the flash memory systems are therefore being reduced as a result. The use of the NAND array architecture contributes to this but other approaches have also been employed to reducing the size of memory cell arrays. One of these other approaches is to form, on a semiconductor substrate, multiple two-dimensional memory cell arrays, one on top of another in different planes, instead of the more typical single array. Examples of integrated circuits having multiple stacked NAND flash memory cell array planes are given in U.S. Pat. Nos. 7,023,739 and 7,177,191.

Another type of re-programmable non-volatile memory cell uses variable resistance memory elements that may be set to either conductive or non-conductive states (or, alternately, low or high resistance states, respectively), and some additionally to partially conductive states and remain in that state until subsequently re-set to the initial condition. The variable resistance elements are individually connected between two orthogonally extending conductors (typically bit and word lines) where they cross each other in a two-dimensional array. The state of such an element is typically changed by proper voltages being placed on the intersecting conductors. Since these voltages are necessarily also applied to a large number of other unselected resistive elements because they are connected along the same conductors as the states of selected elements being programmed or read, diodes are commonly connected in series with the variable resistive elements in order to reduce leakage currents that can flow through them. The desire to perform data reading and programming operations with a large number of memory cells in parallel results in reading or programming voltages being applied to a very large number of other memory cells. An example of an array of variable resistive memory elements and associated diodes is given in patent application publication no. US 2009/0001344 A1.

SUMMARY OF THE INVENTION

According to a general framework of the invention, a 3D memory includes memory elements arranged in a three-dimensional pattern defined by rectangular coordinates having x, y and z-directions and with a plurality of parallel planes stacked in the z-direction. The memory elements in each plane are accessed by a plurality of word lines and relatively short local bit lines in tandem with a plurality of global bit lines. The plurality of local bit lines are in the z-direction through the plurality of planes and arranged in a two dimensional rectangular array of rows in the x-direction and columns in the y-directions. The plurality of word lines in each plane are elongated in the x-direction and spaced apart in the y-direction between and separated from the plurality of local bit lines in the individual planes. A non-volatile, reprogramming memory element is located near a crossing between a word line and local bit line and accessible by the word line and local bit line and wherein a group of memory elements are accessible in parallel by a common word line and a row of local bit lines.

The memory has the structure of a 3D resistive mesh. The memory elements used in the three-dimensional array are preferably variable resistive memory elements. That is, the resistance (and thus inversely the conductance) of the individual memory elements is typically changed as a result of a voltage placed across the orthogonally intersecting conductors to which the element is connected. Depending on the type of variable resistive element, the state may change in response to a voltage across it, a level of current though it, an amount of electric field across it, a level of heat applied to it, and the like. With some variable resistive element material, it is the amount of time that the voltage, current, electric field, heat and the like is applied to the element that determines when its conductive state changes and the direction in which the change takes place. In between such state changing operations, the resistance of the memory element remains unchanged, so is non-volatile. The three-dimensional array architecture summarized above may be implemented with a memory element material selected from a wide variety of such materials having different properties and operating characteristics.

3D Array of Read/Write Elements with Vertical Bit Lines and Select Devices

A three-dimensional memory is formed as an array of memory elements that are formed across multiple layers of planes positioned at different distances above a semiconductor substrate. The memory elements reversibly change a level of electrical conductance in response to a voltage difference being applied across them. The three-dimensional array includes a two-dimensional array of pillar lines acting as local vertical bit lines through the multiple layers of planes which together with arrays of word lines on each plane are used to access the memory elements. The three-dimensional memory is formed over a CMOS substrate with an intermediate pillar select layer. The pillar select layer is formed with a plurality of pillar select devices which are switching transistors formed outside the CMOS and serve to switch selected rows of pillar lines to corresponding metal lines on the substrate.

According to another aspect of the invention, a nonvolatile memory is provided with a 3D array of read/write (R/W) memory elements accessible by an x-y-z framework of an array of local bit lines or bit line pillars in the z-direction and word lines in multiple layers in the x-y plane perpendicular to the z-direction. An x-array of global bit lines in the y-direction is switchably coupled to individual ones of the local bit line pillars along the y-direction. This is accomplished by a select transistor between each of the individual local bit line pillars and a global bit line. Each select transistor is a pillar select device that is formed as a vertical structure, switching between a local bit line pillar and a global bit line. The pillar select devices, unlike previous embodiments where they are formed within a CMOS layer, are in the present invention formed in a separate layer (pillar select layer) above the CMOS layer, along the z-direction between the array of global bit lines and the array of local bit lines.

The switching transistors are conventionally CMOS circuit elements that are formed in a semiconductor CMOS substrate. In the 3D array with its 2D array of pillar lines acting as local vertical bit lines, a select transistor is needed to switch each pillar line to a metal line on the substrate for access. Thus a 2D array of select transistors is needed and if implemented in the CMOS will take up all the room in the CMOS and leaving no room from other active elements. Forming the switching transistors in a separate layer above the CMOS substrate is therefore advantageous.

Various aspects, advantages, features and details of the innovative three-dimensional variable resistive element memory system are included in a description of exemplary examples thereof that follows, which description should be taken in conjunction with the accompanying drawings.

All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 29 illustrates a BEOL (top portion of the 3D memory) layout for the word lines and the R/W elements according to a first architecture for the 3D array shown in FIG. 28.

FIG. 30A illustrates a first embodiment of the FEOL layout of a unit block when the BEOL has the first architecture of FIG. 29.

FIG. 31 illustrates a BEOL (top portion of the 3D memory) layout for the word lines and the R/W elements according to a second architecture for the 3D array shown in FIG. 28.

FIG. 37I illustrates a cross-sectional view along the x-direction of the 3D memory with sheet electrodes that has been fabricated by the trench process.

FIG. 38A illustrates the damascene process where the trench shown in FIG. 36C is first filled with oxide 320.

DESCRIPTION OF EXEMPLARY EMBODIMENTS

FIG. 1 to FIG. 38 and FIG. 44 describe various preferred embodiments of a 3D Nonvolatile memory integrated circuit as a general framework of the invention.

FIG. 39 to FIG. 43 describe specific exemplary embodiments of 3D array of read/write elements with vertical bit lines and select devices.

Figure 1:
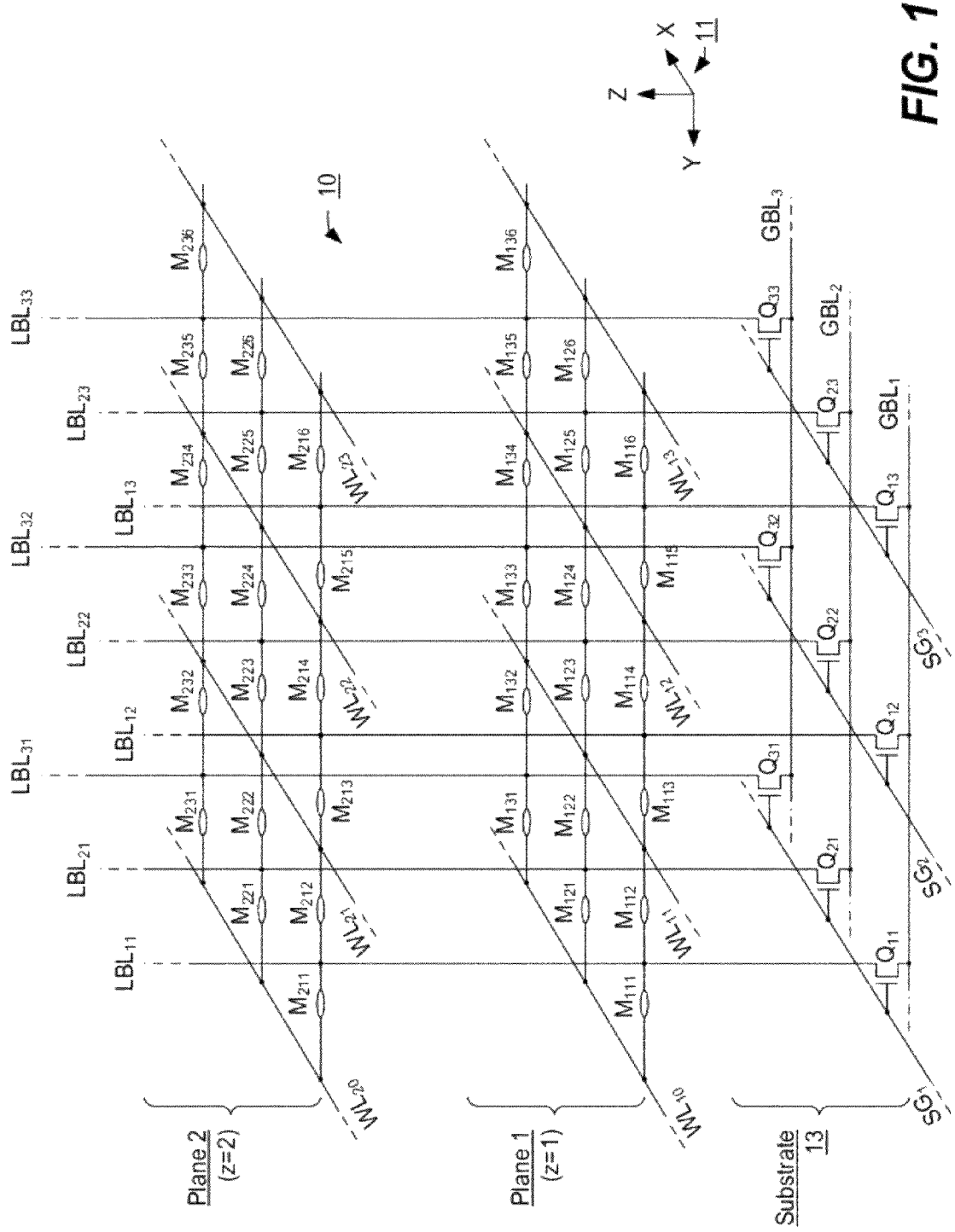
FIG. 1 is an equivalent circuit of a portion of a three-dimensional array of variable resistance memory elements, wherein the array has vertical bit lines.

Referring initially to FIG. 1, an architecture of a three-dimensional memory 10 is schematically and generally illustrated in the form of an equivalent circuit of a portion of such a memory. This is a specific example of the three-dimensional array summarized above. A standard three-dimensional rectangular coordinate system 11 is used for reference, the directions of each of vectors x, y and z being orthogonal with the other two.

A circuit for selectively connecting internal memory elements with external data circuits is preferably formed in a semiconductor substrate 13. In this specific example, a two-dimensional array of select or switching devices $Q_{xy}$ are utilized, where x gives a relative position of the device in the x-direction and y its relative position in the y-direction. The individual devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices Q having the same position in the x-direction, although during reading and also typically programming only one select device connected with a specific global bit line is turned on at time. The other of the source or drain of the individual select devices Q is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, control gate lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the control gate lines $SG_y$ receives a voltage that turns on the select devices to which it is connected. The remaining control gate lines receive voltages that keep their connected select devices off. It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory storage elements $M_{zxy}$ are formed in a plurality of planes positioned at different distances in the z-direction above the substrate 13. Two planes 1 and 2 are illustrated in FIG. 1 but there will typically be more, such as 4, 6 or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory cell structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other on a semiconductor substrate with the local bit lines $LBL_{xy}$ being connected with storage elements $M_{zxy}$ of each plane through which the local bit lines extend.

Figure 2:
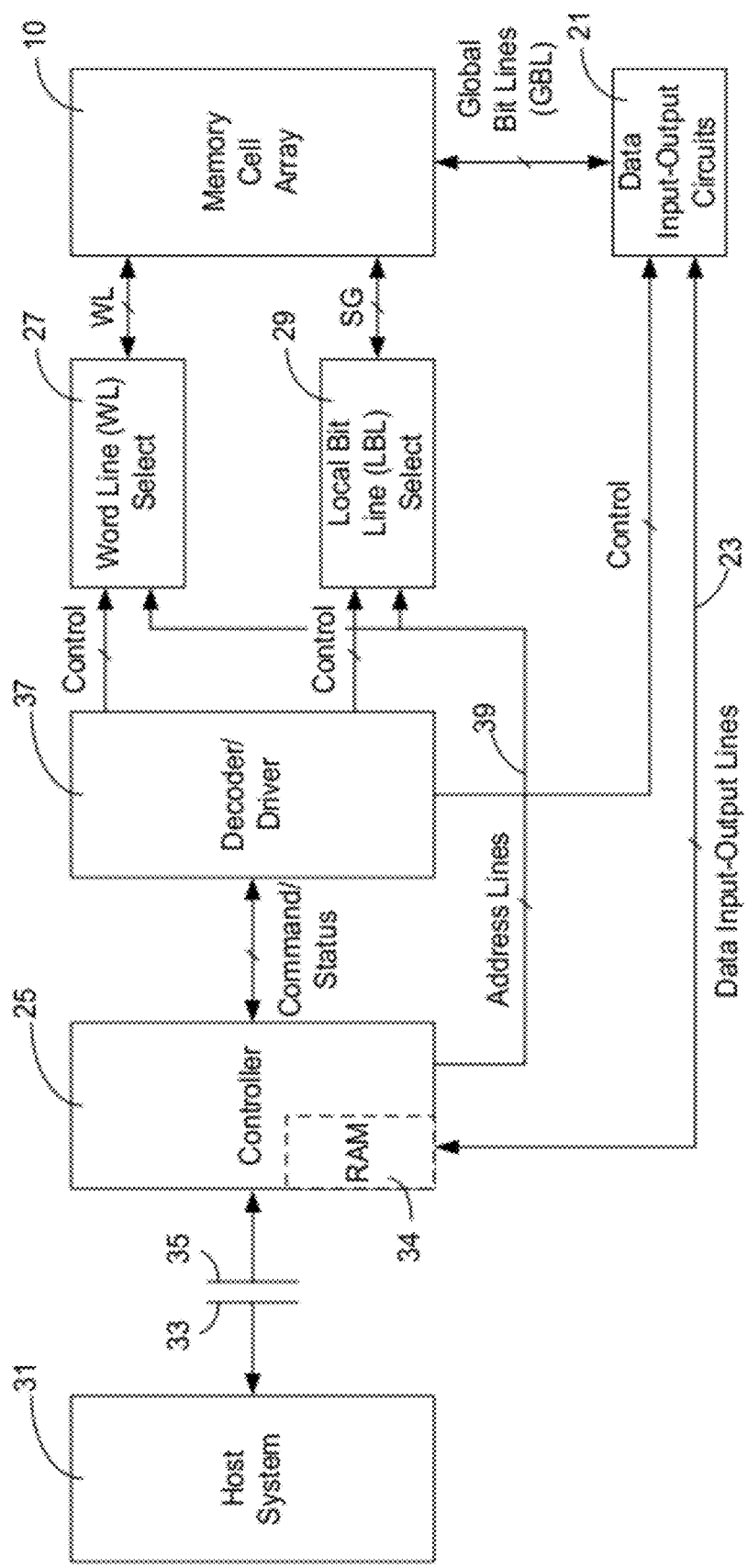
FIG. 2 is a schematic block diagram of a re-programmable non-volatile memory system which utilizes the memory cell array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed storage elements $M_{zxy}$. The circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and select gate control lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

The memory system controller 25 typically receives data from and sends data to a host system 31. The controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

The memory system controller 25 conveys to decoder/driver circuits 37 commands received from the host. Similarly, status signals generated by the memory system are communicated to the controller 25 from the circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although the memory system of FIG. 2 utilizes the three-dimensional memory element array 10 of FIG. 1, the system is not limited to use of only that array architecture. A given memory system may alternatively combine this type of memory with other another type including flash memory, such as flash having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to current flash memory cell arrays. Resetting a block of memory elements to a common state corresponds to erasing a block of flash memory cells to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
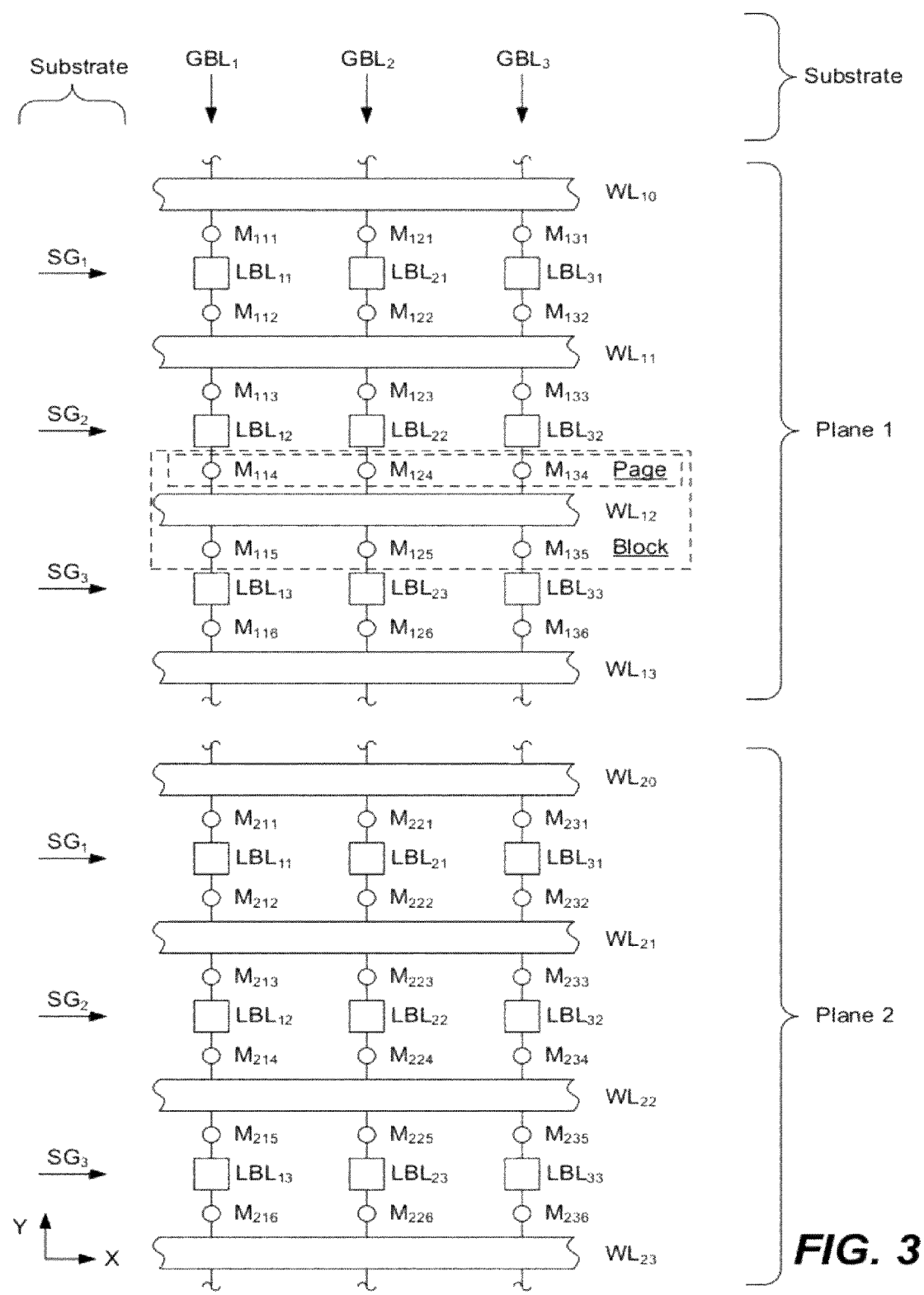
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

Example resetting, programming and reading operations of the memory array of FIGS. 1 and 3, when operated as array 10 in the memory system of FIG. 2, will now be described. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1", depending upon the memory element state.

To reset (erase) a block of memory elements, the memory elements in that block are placed into their high resistance state. This state will be designated as the logical data state "1", following the convention used in current flash memory arrays but it could alternatively be designated to be a "0". As shown by the example in FIG. 3, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 3 as an example:

1. Set all of the global bit lines ($GBL_1$, $GBL_2$ and $GBL_3$ in the array of FIGS. 1 and 3) to zero volts, by the circuits 21 of FIG. 2.
2. Set at least the two select gate lines on either side of the one word line of the block to H' volts, so that the local bit lines on each side of the word line in the y-direction are connected to their respective global bit lines through their select devices and therefore brought to zero volts. The voltage H' is made high enough to turn on the select devices $Q_{xy}$, like something in a range of 1-3 volts, typically 2 volts. The block shown in FIG. 3 includes the word line $WL_{12}$, so the select gate lines $SG_2$ and $SG_3$ (FIG. 1) on either side of that word line are set to H' volts, by the circuits 29 of FIG. 2, in order to turn on the select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.
3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1 and 3, word line $WL_{12}$ is placed at H volts, while all other word lines in the array are placed at zero volts, all by the circuits 27 of FIG. 2.

The result is that H volts are placed across each of the memory elements of the block. In the example block of FIG. 3, this includes the memory elements $M_{114}$, $M_{124}$, $M_{134}$, $M_{115}$, $M_{125}$ and $M_{135}$. For the type of memory material being used as an example, the resulting currents through these memory elements places any of them not already in a high resistance state, into that re-set state.

It may be noted that no stray currents will flow because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required.

The memory elements of a page are preferably programmed concurrently, in order to increase the parallelism of the memory system operation. An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1". For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 4:
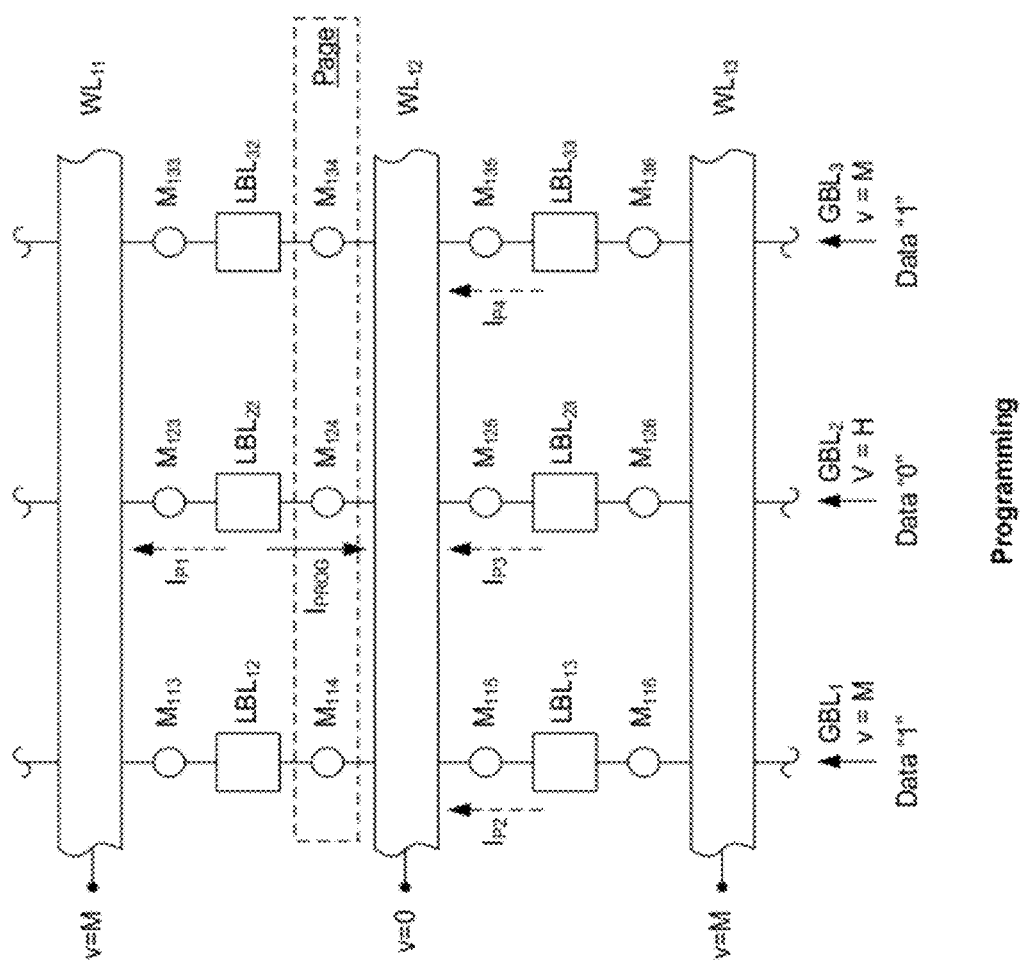
FIG. 4 is an expanded view of a portion of one of the planes of FIG. 3, annotated to show effects of programming data therein.

Referring to FIGS. 3 and 4, an example programming operation within the indicated one page of memory elements $M_{114}$, $M_{124}$ and $M_{134}$ is described, as follows:

1. The voltages placed on the global bit lines are in accordance with the pattern of data received by the memory system for programming. In the example of FIG. 4, $GBL_1$ carries logical data bit "1", $GBL_2$ the logical bit "0" and $GBL_3$ the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.

2. Set the word line of the page being programmed to 0 volts, in this case selected word line $WL_{12}$. This is the only word line to which the memory elements of the page are connected. Each of the other word lines on all planes is set to the M level. These word line voltages are applied by the circuits 27 of FIG. 2.

3. Set one of the select gate lines below and on either side of the selected word line to the H' voltage level, in order to select a page for programming. For the page indicated in FIGS. 3 and 4, the H' voltage is placed on select gate line $SG_2$ in order to turn on select devices $Q_{12}$, $Q_{22}$ and $Q_{32}$ (FIG. 1). All other select gate lines, namely lines $SG_1$ and $SG_3$ in this example, are set to 0 volts in order to keep their select devices off. The select gate line voltages are applied by the circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current $I_{PROG}$ is sent through the memory element $M_{124}$, thereby causing that memory element to change from a reset to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected select gate line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

There are typically parasitic currents present during the programming operation that can increase the currents that must be supplied through the selected word line and global bit lines. During programming there are two sources of parasitic currents, one to the adjacent page in a different block and another to the adjacent page in the same block. An example of the first is the parasitic current $I_{P1}$ shown on FIG. 4 from the local bit line $LBL_{22}$ that has been raised to the voltage level H during programming. The memory element $M_{123}$ is connected between that voltage and the voltage level M on its word line $WL_{11}$. This voltage difference can cause the parasitic current $-I_{P1}$ to flow. Since there is no such voltage difference between the local bit lines $LBL_{12}$ or $LBL_{32}$ and the word line $WL_{11}$, no such parasitic current flows through either of the memory elements $M_{113}$ or $M_{133}$, a result of these memory elements remaining in the reset state according to the data being programmed.

Other parasitic currents can similarly flow from the same local bit line $LBL_{22}$ to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-8 planes may generally be used in most cases.

The other source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents $I_{P2}$, $I_{P3}$ and $I_{P4}$ shown in FIG. 4. In general, these currents will be much less than the other parasitic current $I_{P1}$ discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed. An example of this technique is described in U.S. Pat. No. 5,172,338.

Figure 5:
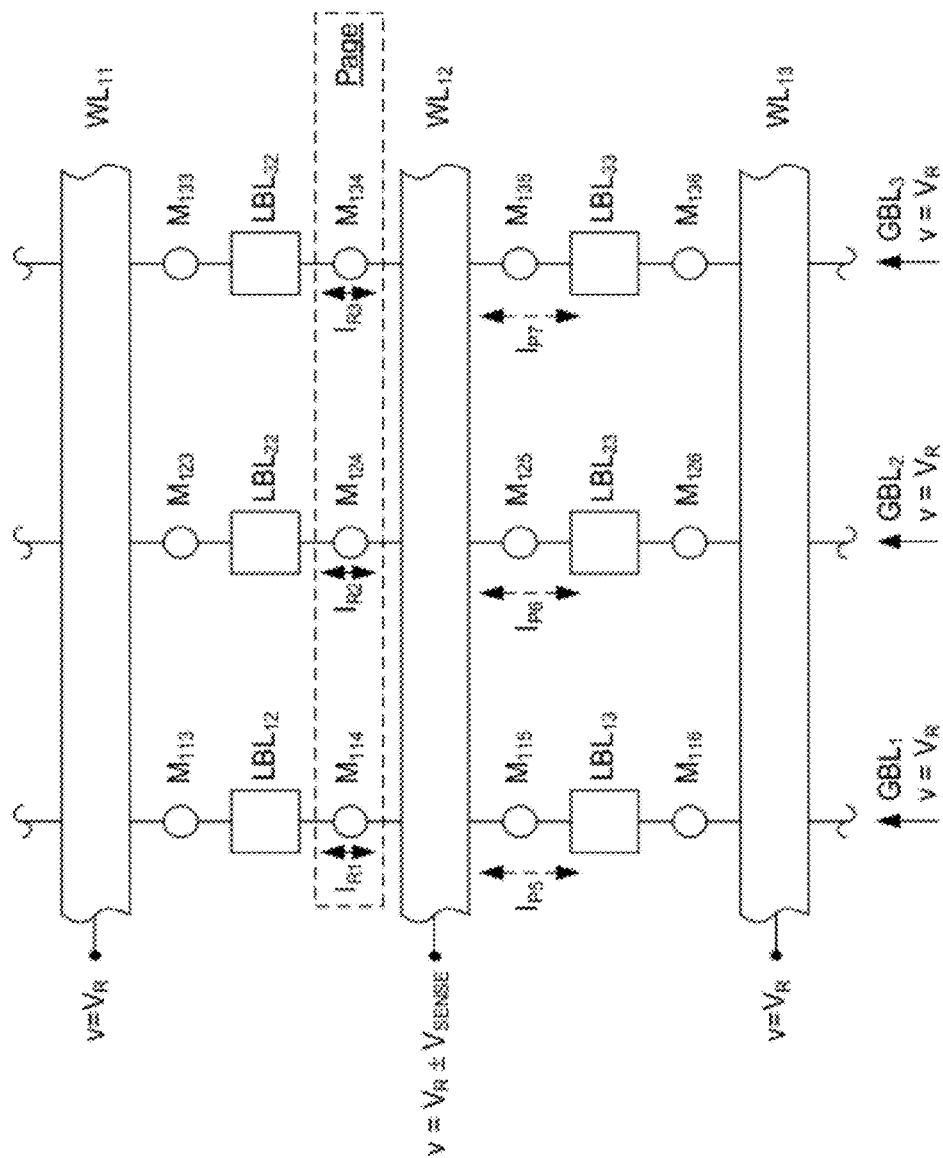
FIG. 5 is an expanded view of a portion of one of the planes of FIG. 3, annotated to show effects of reading data therefrom.

With reference primarily to FIG. 5, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.
2. Turn on one row of select devices by placing a voltage on the control line adjacent to the selected word line in order to define the page to be read. In the example of FIGS. 1 and 5, a voltage is applied to the control line $SG_2$ in order to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the circuits 21 of FIG. 2, and assume the potential $V_R$ of the global bit lines to which they are connected. All other local bit lines LBLs are allowed to float.
3. Set the selected word line ($WL_{12}$) to a voltage of $V_R \pm V$sense. The sign of Vsense is chosen based on the sense amplifier and has a magnitude of about 0.5 volt. The voltages on all other word lines remain the same.
4. Sense current flowing into ($V_R+V$sense) or out of ($V_R-V$sense) each sense amplifier for time T. These are the currents $I_{R1}$, $I_{R2}$ and $I_{R3}$ shown to be flowing through the addressed memory elements of the example of FIG. 5, which are proportional to the programmed states of the respective memory elements $M_{114}$, $M_{124}$ and $M_{134}$. The states of the memory elements $M_{114}$, $M_{124}$ and $M_{134}$ are then given by binary outputs of the sense amplifiers within the circuits 21 that are connected to the respective global bit lines $GBL_1$, $GBL_2$ and $GBL_3$. These sense amplifier outputs are then sent over the lines 23 (FIG. 2) to the controller 25, which then provides the read data to the host 31.
5. Turn off the select devices ($Q_{12}$, $Q_{22}$ and $Q_{32}$) by removing the voltage from the select gate line ($SG_2$), in order to disconnect the local bit lines from the global bit lines, and return the selected word line ($WL_{12}$) to the voltage $V_R$.

Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

As in the programming case, all of the local bit lines except the selected row ($LBL_{12}$, $LBL_{22}$ and $LBL_{32}$ in the example of FIG. 5) are floating. But the potential of the floating local bit lines may be driven to $V_R$ by any memory element that is in its programmed (low resistance) state and connected between a floating local bit line and a word line at $V_R$, in any plane. A parasitic current comparable to $I_{P1}$ in the programming case (FIG. 4) is not present during data read because both the selected local bit lines and the adjacent non-selected word lines are both at $V_R$. Parasitic currents may flow, however, through low resistance memory elements connected between floating local bit lines and the selected word line. These are comparable to the currents $I_{P2}$, $I_{P3}$, and $I_{P4}$ during programming (FIG. 4), indicated as $I_{P5}$, $I_{P6}$ and $I_{P7}$ in FIG. 5. Each of these currents can be equal in magnitude to the maximum read current through an addressed memory element. However, these parasitic currents are flowing from the word lines at the voltage $V_R$ to the selected word line at a voltage $V_R \pm V$sense without flowing through the sense amplifiers. These parasitic currents will not flow through the selected local bit lines ($LBL_{12}$, $LBL_{22}$ and $LBL_{32}$ in FIG. 5) to which the sense amplifiers are connected. Although they contribute to power dissipation, these parasitic currents do not therefore introduce a sensing error.

Although the neighboring word lines should be at $V_R$ to minimize parasitic currents, as in the programming case it may be desirable to weakly drive these word lines or even allow them to float. In one variation, the selected word line and the neighboring word lines can be pre-charged to $V_R$ and then allowed to float. When the sense amplifier is energized, it may charge them to $V_R$ so that the potential on these lines is accurately set by the reference voltage from the sense amplifier (as opposed to the reference voltage from the word line driver). This can occur before the selected word line is changed to $V_R \pm V$sense but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin. Further information regarding the use of reference cells within a page can be found in U.S. Pat. Nos. 6,222,762, 6,538,922, 6,678,192 and 7,237,074.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers. An example of this is shown in U.S. Pat. No. 7,324,393.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Diodes may also be connected in series with the individual memory elements of the three-dimensional array, as currently done in other arrays of variable resistive memory elements, in order to reduce further the number of parasitic currents but there are disadvantages in doing so. Primarily, the manufacturing process becomes more complicated. Added masks and added manufacturing steps are then necessary. Also, since formation of the silicon p-n diodes often requires at least one high temperature step, the word lines and local bit lines cannot then be made of metal having a low melting point, such as aluminum that is commonly used in integrated circuit manufacturing, because it may melt during the subsequent high temperature step. Use of a metal, or composite material including a metal, is preferred because of its higher conductivity than the conductively doped polysilicon material that is typically used for bit and word lines because of being exposed to such high temperatures. An example of an array of resistive switching memory elements having a diode formed as part of the individual memory elements is given in patent application publication no. US 2009/0001344 A1.

Because of the reduced number of parasitic currents in the three-dimensional array herein, the total magnitude of parasitic currents can be managed without the use of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. The advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials.

The level of parasitic currents increases with the number of planes and with the number of memory elements connected along the individual word lines within each plane. But since the number of word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory array being described herein has many advantages. The quantity of digital data that may be stored per unit of semiconductor substrate area is high. It may be manufactured with a lower cost per stored bit of data. Only a few masks are necessary for the entire stack of planes, rather than requiring a separate set of masks for each plane. The number of local bit line connections with the substrate is significantly reduced over other multi-plane structures that do not use the vertical local bit lines. The architecture eliminates the need for each memory cell to have a diode in series with the resistive memory element, thereby further simplifying the manufacturing process and enabling the use of metal conductive lines. Also, the voltages necessary to operate the array are much lower than those used in current commercial flash memories.

Since at least one-half of each current path is vertical, the voltage drops present in large cross-point arrays are significantly reduced. The reduced length of the current path due to the shorter vertical component means that there are approximately one-half the number memory cells on each current path and thus the leakage currents are reduced as is the number of unselected cells disturbed during a data programming or read operation. For example, if there are N cells associated with a word line and N cells associated with a bit line of equal length in a conventional array, there are 2N cells associated or "touched" with every data operation. In the vertical local bit line architecture described herein, there are n cells associated with the bit line (n is the number of planes and is typically a small number such as 4 to 8), or N+n cells are associated with a data operation. For a large N this means that the number of cells affected by a data operation is approximately one-half as many as in a conventional three-dimensional array.

Materials Useful for the Memory Storage Elements

The material used for the non-volatile memory storage elements $M_{zxy}$ in the array of FIG. 1 can be a chalcogenide, a metal oxide, or any one of a number of materials that exhibit a stable, reversible shift in resistance in response to an external voltage applied to or current passed through the material.

Figure 6:
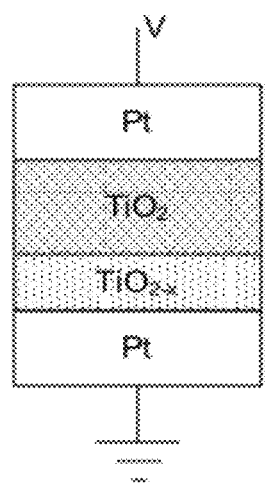
FIG. 6 illustrates an example memory storage element.

Metal oxides are characterized by being insulating when initially deposited. One suitable metal oxide is a titanium oxide ($TiO_x$). A previously reported memory element using this material is illustrated in FIG. 6. In this case, near-stoichiometric $TiO_2$ bulk material is altered in an annealing process to create an oxygen deficient layer (or a layer with oxygen vacancies) in proximity of the bottom electrode. The top platinum electrode, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^+_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure of FIG. 6. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials include HfOx, ZrOx, WOx, NiOx, CoOx, CoalOx, MnOx, $ZnMn_2O_4$, ZnOx, TaOx, NbOx, HfSiOx, HfAlOx. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich TiOx, TiAlN, TaAlN, TiSiN, TaSiN, $IrO_2$. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 5 nm to 50 nm.

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates, are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into an $sp^3$ form ("reset" state). It has been theorized that the high local temperatures generated by this pulse causes disorder in the material and if the pulse is very short, the carbon "quenches" in an amorphous state ($sp^a$ hybridization). On the other hand, when in the reset state, applying a lower voltage for a longer time (~300 nsec) causes part of the material to change into the $sp^2$ form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. The switching mechanism from low-to-high resistance and the opposite is not well understood. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a p-n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to low resistance, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

For simplicity the above description has consider the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC). The principles of such operation are described in U.S. Pat. No. 5,172,338 referenced earlier. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, Jun. 12-17, 2005, pp. 48-53 and "Time Discrete Voltage Sensing and Iterative Programming Control for a 4F2 Multilevel CBRAM" by Schrogmeier et al. (2007 Symposium on VLSI Circuits).

Specific Structural Examples of the Three-Dimensional Array

Three alternative semiconductor structures for implementing the three-dimensional memory element array of FIG. 1 are now described.

Figure 7:
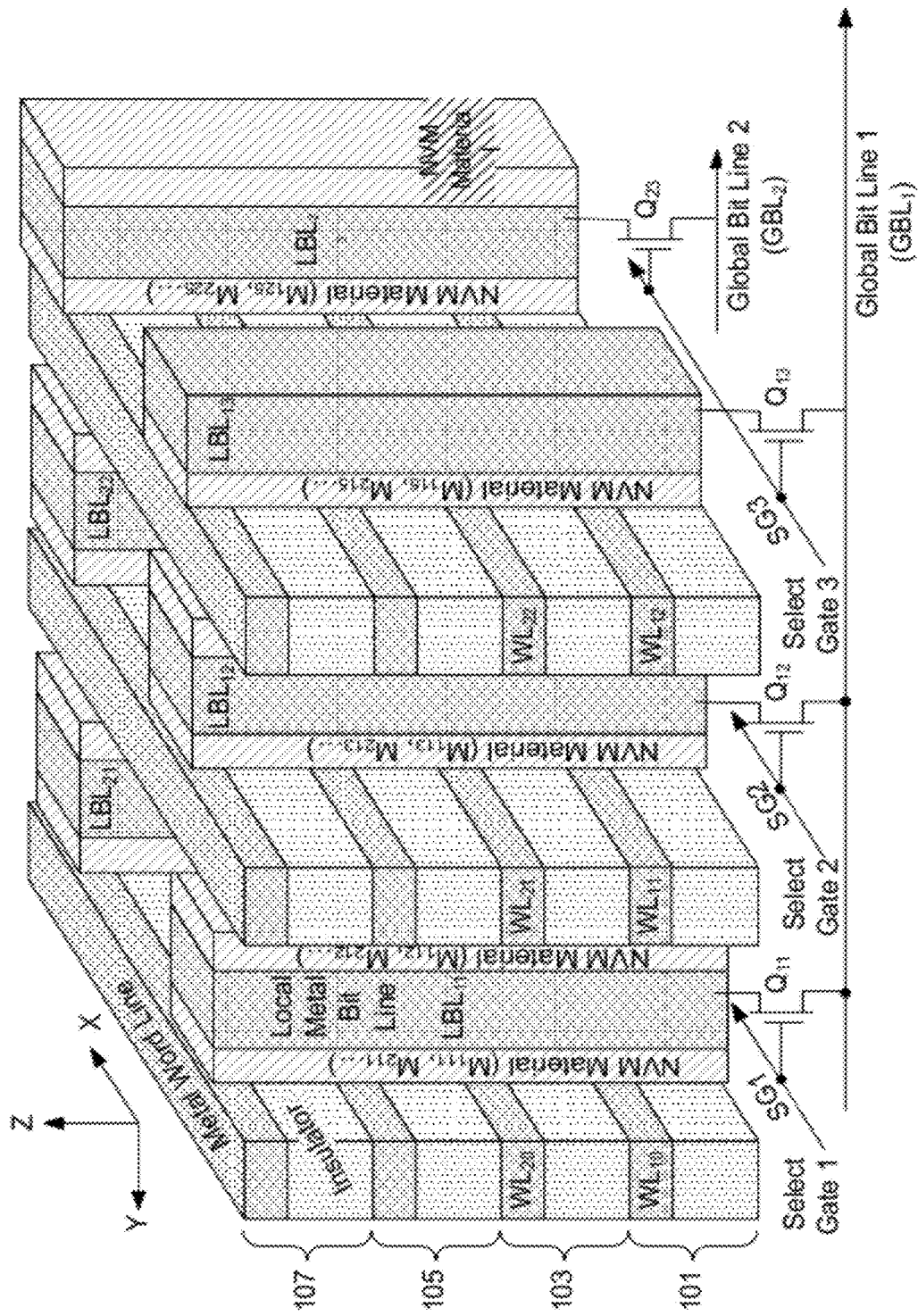
FIG. 7 is an isometric view of a portion of the three-dimensional array shown in FIG. 1 according to a first specific example of an implementation thereof.

A first example, illustrated in FIG. 7, is configured for use of memory element (NVM) material that is non-conductive when first deposited. A metal oxide of the type discussed above has this characteristic. As explained with respect to FIG. 6, conductive filaments are formed between electrodes on opposite sides of the material in response to appropriate voltages placed on those electrodes. These electrodes are a bit line and a word line in the array. Since the material is otherwise non-conductive, there is no necessity to isolate the memory elements at the cross-points of the word and bit lines from each other. Several memory elements may be implemented by a single continuous layer of material, which in the case of FIG. 7 are strips of NVM material oriented vertically along opposite sides of the vertical bit lines in the y-direction and extending upwards through all the planes. A significant advantage of the structure of FIG. 7 is that all word lines and strips of insulation under them in a group of planes may be defined simultaneously by use of a single mask, thus greatly simplifying the manufacturing process.

Referring to FIG. 7, a small part of four planes 101, 103, 105 and 107 of the three-dimensional array are shown. Elements of the FIG. 7 array that correspond to those of the equivalent circuit of FIG. 1 are identified by the same reference numbers. It will be noted that FIG. 7 shows the two planes 1 and 2 of FIG. 1 plus two additional planes on top of them. All of the planes have the same horizontal pattern of gate, dielectric and memory storage element (NVM) material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the select gate lines (SG) elongated in the x-direction, which are also formed in the substrate. The switching devices $Q_{xy}$ may be conventional CMOS transistors (or vertical npn transistors) and fabricated using the same process as used to form the other conventional circuitry. In the case of using npn transistors instead of MOS transistors, the select gate (SG) lines are replaced with the base contact electrode lines elongated in the x-direction. Also fabricated in the substrate but not shown in FIG. 7 are sense amplifiers, input-output (I/O) circuitry, control circuitry, and any other necessary peripheral circuitry. There is one select gate line (SG) for each row of local bit line pillars in the x-direction and one select device (Q) for each individual local bit line (LBL).

Each vertical strip of non-volatile memory element (NVM) material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 7 is as follows:

1. The support circuitry, including the select devices Q, global bit lines GBL, select gate lines SG and other circuits peripheral to the array, is formed in the silicon substrate in a conventional fashion and the top surface of this circuitry is planarized, such as by etching with use of a layer of etch stop material placed over the circuitry.
2. Alternating layers of dielectric (insulator) and metal are formed as sheets on top of each other and over at least the area of the substrate in which the select devices Q are formed. In the example of FIG. 7, four such sheets are formed.
3. These sheets are then etched (isolated) by using a mask formed over the top of them that has slits elongated in the x-direction and spaced apart in the y-direction. All of the material is removed down to the etch stop in order to form the trenches shown in FIG. 7 in which the local bit line (LBL) pillars and NVM material is later formed. Contact holes are also etched through the etch stop material layer at the bottom of the trenches to allow access to the drains of the select devices Q at the positions of the subsequently formed pillars. The formation of the trenches also defines the width in the y-direction of the word lines (WL).
4. Non-volatile memory (NVM) material is deposited in thin layers along the sidewalls of these trenches and across the structure above the trenches. This leaves the NVM material along the opposing sidewalls of each of the trenches and in contact with the word line (WL) surfaces that are exposed into the trenches.
5. Metal is then deposited in these trenches in order to make contact with the non-volatile memory (NVM) material. The metal is patterned using a mask with slits in the y-direction. Removal of the metal material by etching through this mask leaves the local bit line (LBL) pillars. The non-volatile memory (NVM) material in the x-direction may also be removed between pillars. The space between pillars in the x-direction is then filled with a dielectric material and planarized back to the top of the structure.

A significant advantage of the configuration of FIG. 7 is that only one etching operation through a single mask is required to form the trenches through all the layers of material of the planes at one time. However, process limitations may limit the number of planes that can be etched together in this manner. If the total thickness of all the layers is too great, the trench may need to be formed in sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

Figure 8:
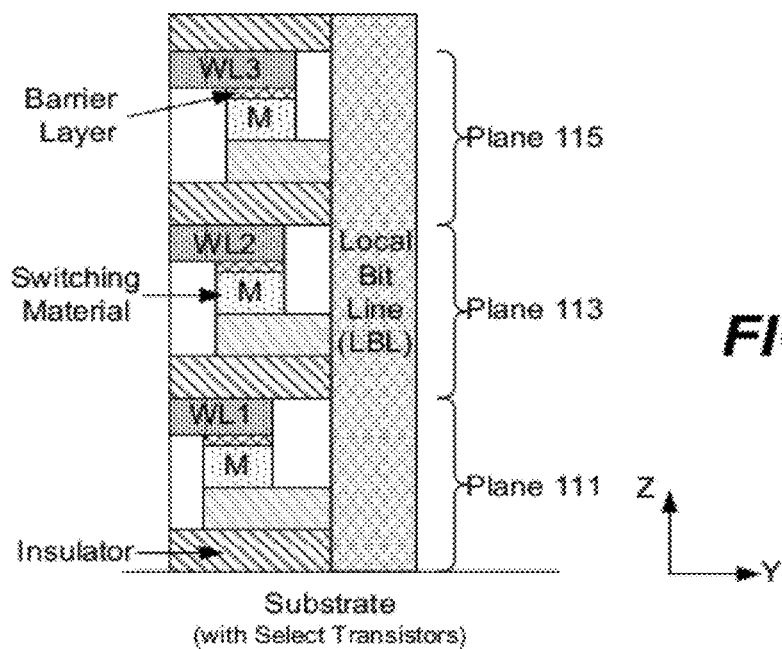
FIG. 8 is cross-section of a portion of the three-dimensional array shown in FIG. 1 according to a second specific example of an implementation thereof.

A second example of implementing the three-dimensional memory cell array of FIG. 1 is illustrated by FIG. 8, and a process of forming this structure is outlined with respect to FIGS. 9-14. This structure is configured to use any type of material for the non-volatile memory storage elements, electrically conductive or non-conductive when deposited on the structure, such as those described above. The NVM element is isolated from the LBL and is sandwiched between the bottom metal electrode and the word line. The bottom electrode makes electrical contact with the LBL while the word line is electrically isolated from the LBL through an insulator. The NVM elements at the intersections of the local bit lines (LBL) and word lines (WL) are electrically isolated from one another in the x and z-directions.

FIG. 8 shows a portion of each of three planes 111, 113 and 115 of this second structural example on only one side of a local bit line (LBL). The word lines (WL) and memory storage elements ($M_{xy}$) are defined in each plane as the plane is formed, using two masking steps. The local bit lines crossing each plane of the group in the z-direction are defined globally after the last plane in the group is defined. A significant feature of the structure of FIG. 8 is that the storage elements $M_{xy}$ are below their respective word lines, rather than serving as an insulator between the word lines (WL) and the vertical local bit lines (LBL) as done in the example of FIG. 7. Further, a bottom electrode contacts the lower surface of each storage element $M_{xy}$ and extends laterally in the y-direction to the local bit line (LBL). Conduction through one of the memory cells is through the bit line, laterally along the bottom electrode, vertically in the z-direction through the switching material of the storage elements $M_{xy}$ (and optional layer of barrier metal, if present) and to the selected word line (WL). This allows the use of conductive switching material for the storage elements $M_{zxy}$ which in the example of FIG. 7 would electrically short word lines in different planes which are vertically above each other. As shown in FIG. 8, the word lines (WL) stop short in the y-direction of the local bit lines (LBL) and do not have the non-volatile memory (NVM) material sandwiched between the word and local bit lines at the same z-location as is the case in the example of FIG. 7. The storage elements $M_{xy}$ are similarly spaced from the local bit lines (LBL), being electrically connected thereto by the bottom electrode.

Figure 9:
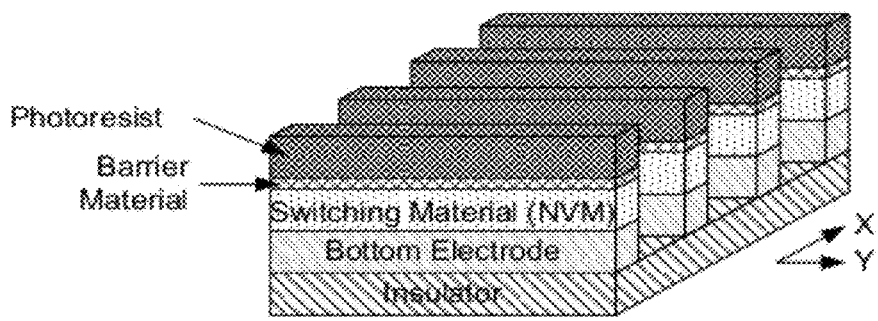
FIGS. 9-14 illustrate a process of forming the three-dimensional array example of FIG. 8.
Figure 10:
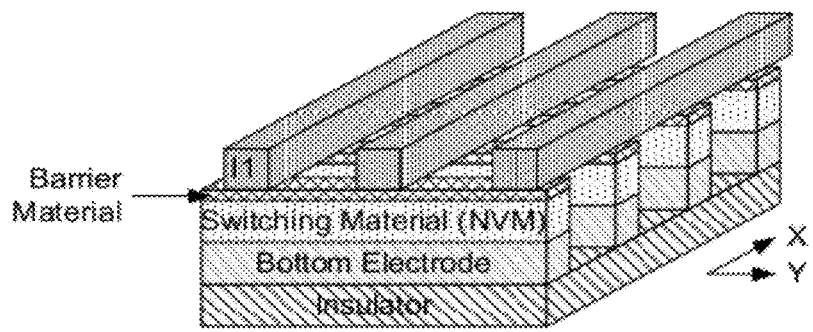
Figure 11:
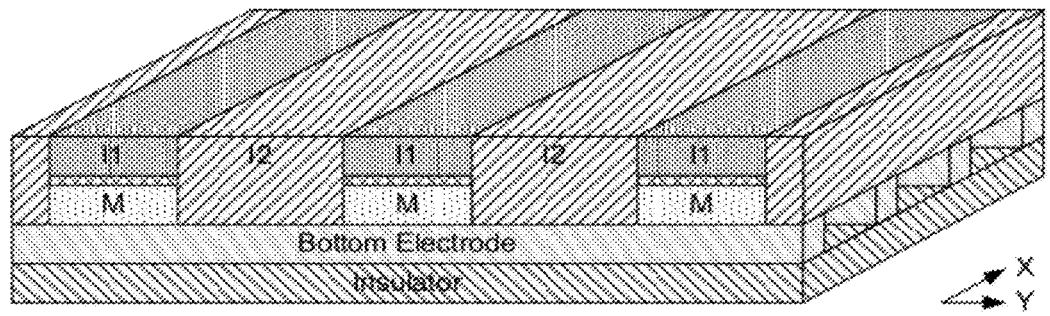
Figure 12:
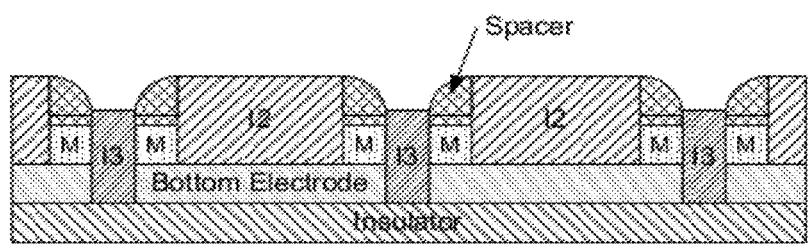
Figure 13:
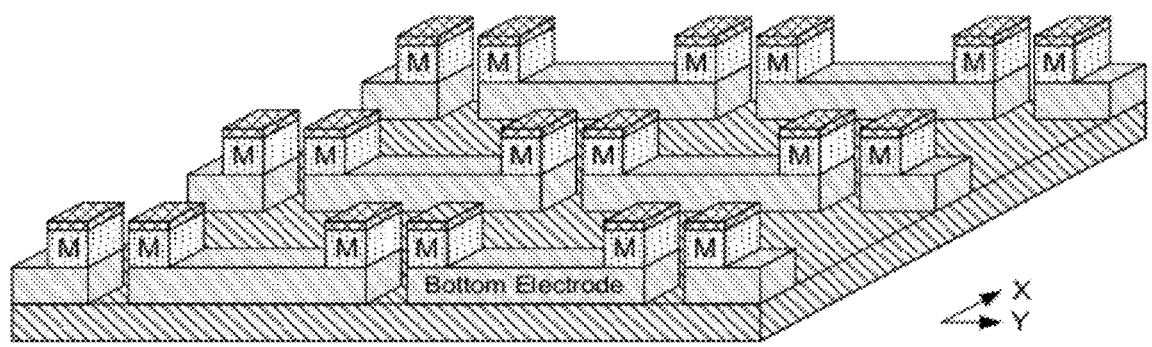
Figure 14:
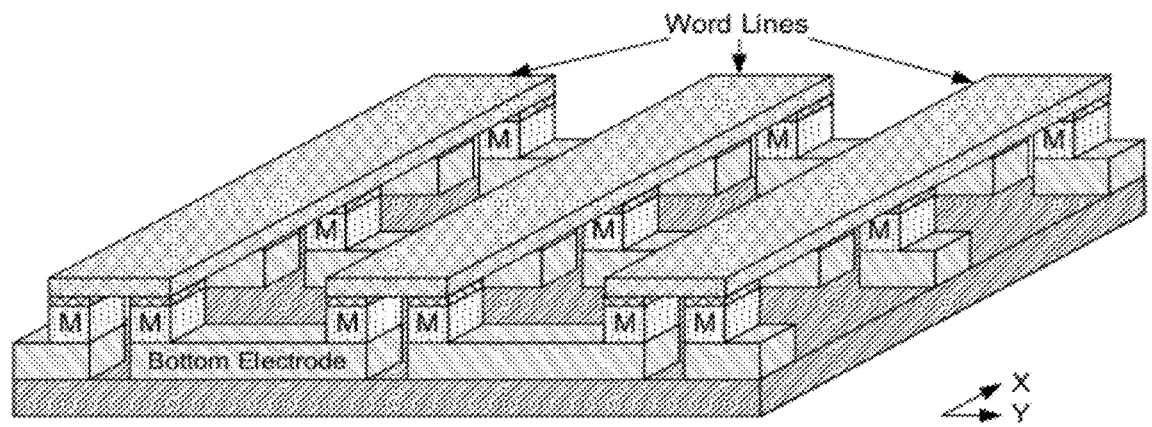

An outline of a process for forming one plane of the three-dimensional structure of FIG. 8 with storage elements $M_{zxy}$ in a regular array in the x-y direction is as follows:

a. Form, on a continuous dielectric (insulator) layer, parallel sets of stacks containing strips of a bottom electrode, switching material and (optionally) a barrier metal, wherein the stacks are elongated in the y-direction and spaced apart in the x-direction. This intermediate structure is shown in FIG. 9. The process of forming this structure includes sequentially depositing layers of the bottom insulator (to insulate the device from the substrate in layer 111 and from lower planes in layers 113 and 115), a bottom electrode of electrically conducting material (for example, titanium), the switching NVM material layer, a top electrode barrier metal (for example, platinum), followed by a first layer of photoresist material. Pattern the photoresist as a set of horizontal lines and spaces running in the y-direction. The width of the photoresist lines are reduced (the photoresist is "slimmed") to reduce the width of the lines of mask material so that the spaces between stacks are larger than the width of the lines. This is to compensate for a possible subsequent misalignment of the rows of switching elements between different planes and to allow a common vertical local bit line to make contact to the bottom electrode simultaneously in all planes. This also reduces the size (and thus current) of the switching elements. Using the photoresist as a mask, the stack is etched, stopping on the bottom insulator layer. The photoresist is then removed, and the gaps between rows are filled with another insulator (not shown in FIG. 9) and the resulting structure is planarized.

b. With reference to FIGS. 10-12, the stacks are separated to form an x-y array of individual memory elements, each containing a bottom electrode joining two adjacent memory elements in the y-direction.
  1. Deposit a layer of dielectric (insulator) over the structure.
  2. Pattern parallel lines of photoresist running in the x-direction and etch the top insulator layer to form from this layer the parallel strips of insulation I1 shown in FIG. 10. This etching is stopped on the barrier metal (or memory material if the barrier metal is not present) and the insulator filling the gaps between the stacks (not shown).
  3. Exposed areas of the array thus formed are filled with a second insulator (I2) with different etching properties than insulator I1, which is then planarized. The result is illustrated in FIG. 11.
  4. Thereafter, all remaining insulator I1 is removed by selective etching that uses the exposed I2 as a mask. Spacers are then formed along the edges of I2 as illustrated in FIG. 12.
  5. Using the spacers and the I2 strips as a mask, the parallel stacks are etched through, including the bottom electrode strips, thereby isolating the bottom electrode strips by trenches between them so that each strip contacts only two adjacent memory elements $M_{zxy}$. As an alternative to forming the spacers for use as part of the etch mask, a photoresist mask may be formed instead. However, there is a potential of misalignment of such a photoresist mask and its pitch may not be as small as can be obtained with the user of the spacers.
  6. A third insulator layer is then deposited over the structure and into the trenches just etched, and the third insulator layer is etched back to slightly above the height of the exposed switching material, thereby leaving the third insulators I3. The result is shown in FIG. 12, a cross-section drawn in the y-direction along one bottom electrode line.
c. The word lines are then formed in the exposed region, making ohmic contact to two adjacent memory elements (this is a Damascene process).
  1. The spacers are first removed. The result is shown as FIG. 13, a rectangular x-y array of memory stacks (like upward facing pillars), each two adjacent stacks in the y-direction being connected by a common bottom electrode. Not shown for clarity is the insulator I2 filling the area over the bottom electrode between pillars, and the insulator I3 filling the trench between the gaps separating the bottom electrodes and adjacent pillars.
  2. Conductive word line material is then deposited, and is removed by CMP so that it fills the exposed trench, stopping on insulator I3 and barrier metal (if present) or memory material. Note that the insulator I2 forms a trench where the conductive word line material is defined (as a damascene process). The word lines (WL) sit over insulator I3 and two adjacent memory stacks (shown here with barrier metal). The resulting structure is shown in FIG. 14.
d. The foregoing processing steps are repeated for each plane in the group of planes. Note that the memory elements in one plane will not be exactly aligned with memory elements in another plane because of photolithography misalignment.
e. After the circuit elements of all the planes have been formed, the vertical local bit lines are then formed:
  1. A top insulator is deposited above the word lines of the upper plane.
  2. Using a photoresist mask, an x-y "contact" pattern is opened for the individual local bit lines, and etching is performed through the group of planes all the way to the substrate. Rows of these openings are aligned parallel to the word lines along the x-direction but are spaced midway in the gaps between word lines in the y-direction. The size of these openings is smaller than the spacing between word lines and aligned in the x-direction to cut through the bottom electrodes in each plane. As the etch moves through each layer of bottom electrodes of the several planes, it separates the bottom electrodes into two segments so that each segment contacts only one memory element. The etching continues to the substrate where it exposes contacts to the select devices Q.
  3. These holes are then filled with metal to form the local bit lines, and the top surface is planarized so that each local bit line is independent of (electrically separated from) any other local bit line. A barrier metal may be optionally deposited as a part of this process. The resulting structure is shown in the vertical cross-section of FIG. 8.
  4. Alternatively, instead of etching an x-y "contact" pattern for the local bit lines, slits elongated in x-direction and spaced apart in the y-direction are etched in the 12 oxide regions. Etching is performed through the group of planes, all the way to the substrate forming trenches in which the local bit line pillars are later formed.
  5. Metal is then deposited to fill these trenches. The deposited metal makes contact with the bottom electrode of the memory element in all the planes. The metal is then patterned using a mask with slits in the x-direction. Removal of the metal material by etching through this mask leaves the local bit line pillars. The space between pillars in the x-direction is filled with a dielectric material and planarized back to the top of the structure.

Figure 15:
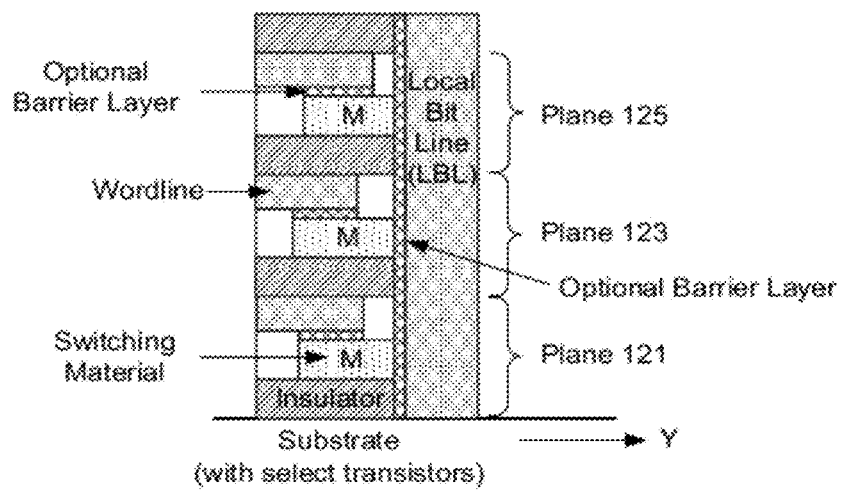
FIG. 15 is a cross-section of a portion of the three-dimensional array shown in FIG. 1 according to a third specific example of an implementation thereof.

A third specific structural example is shown by FIG. 15, which shows a small portion of three planes 121, 123 and 125.

The memory storage elements $M_{zxy}$ are also formed from a conductive switching material. This is a variation of the second example, wherein the memory elements of FIG. 15 individually takes the shape of the bottom electrode and contacts the vertical local bit line (LBL). The bottom electrodes of the example of FIG. 8 are missing from the layers shown in FIG. 15.

The structure shown in FIG. 15 is made by essentially the same process as that described above for the second example. The main difference is that in the second example, reference to the bottom electrode is replaced in this third example by the switching material, and reference to the switching material of the second embodiment is not used in this third embodiment.

The second example structure of FIG. 8 is particularly suited to any switching material that as deposited as an insulator or electrical conductor. The third example structure shown in FIG. 15 is suited primarily for switching materials that are deposited as an electrical conductor (phase change materials, carbon materials, carbon nanotubes and like materials). By isolating the switching material such that it does not span the region between two stacks, the possibility of a conductive short between switching elements is eliminated.

Embodiments with Reduced Leakage Currents

Conventionally, diodes are commonly connected in series with the variable resistive elements of a memory array in order to reduce leakage currents that can flow through them. The highly compact 3D reprogrammable memory described in the present invention has an architecture that does not require a diode in series with each memory element while able to keep the leakage currents reduced. This is possible with short local vertical bit lines which are selectively coupled to a set of global bit lines. In this manner, the structures of the 3D memory are necessarily segmented and couplings between the individual paths in the mesh are reduced.

Even if the 3D reprogrammable memory has an architecture that allows reduced current leakage, it is desirable to further reduce them. As described earlier and in connection with FIG. 5, parasitic currents may exist during a read operation and these currents have two undesirable effects. First, they result in higher power consumption. Secondly, and more seriously, they may occur in the sensing path of the memory element being sensed, cause erroneous reading of the sensed current.

Figure 16:
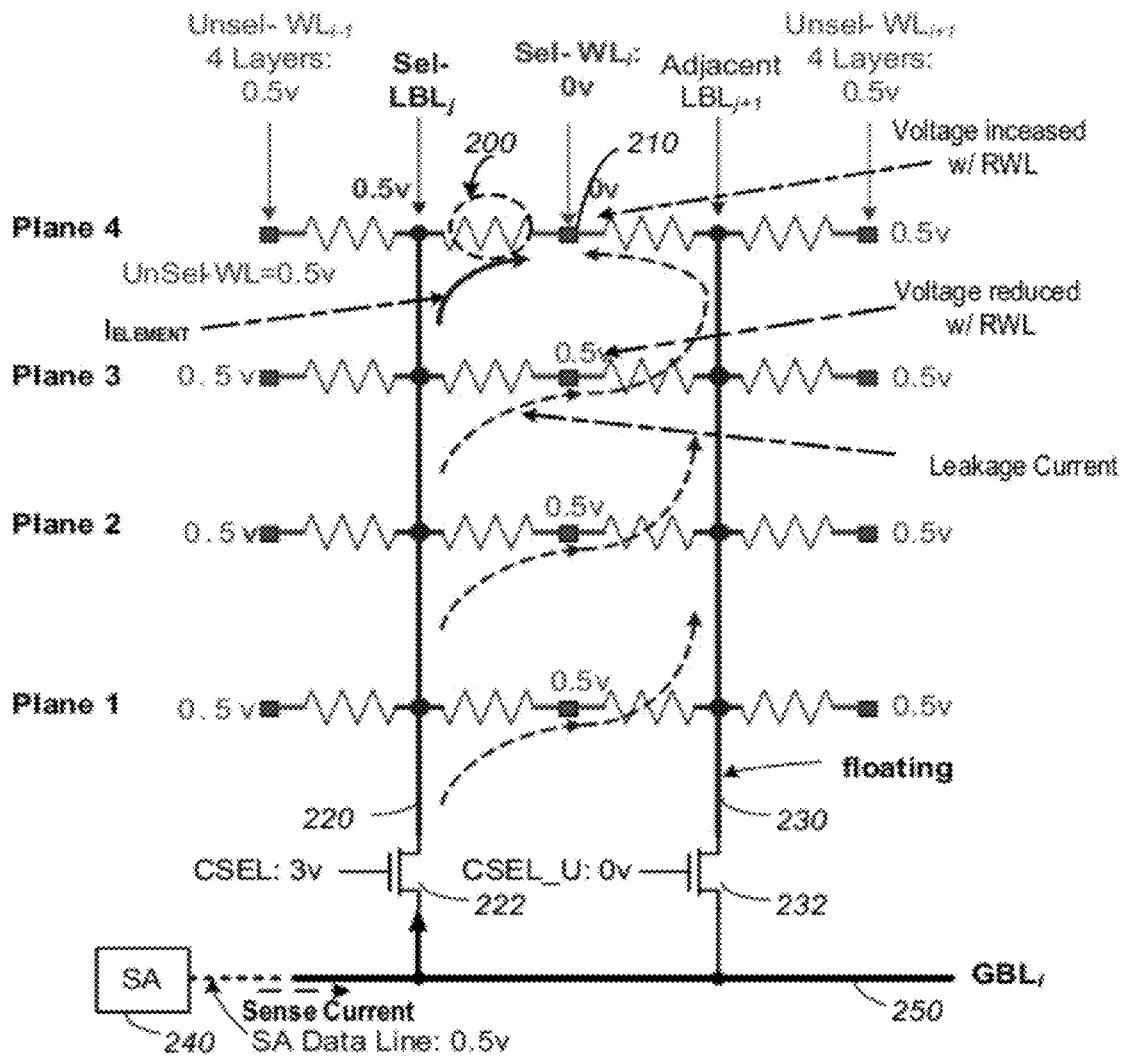
FIG. 16 illustrates the read bias voltages and current leakage across multiple planes of the 3D memory shown in FIG. 1 and FIG. 3.

FIG. 16 illustrates the read bias voltages and current leakage across multiple planes of the 3D memory shown in FIG. 1 and FIG. 3. FIG. 16 is a cross-sectional view across 4 planes along the x-direction of a portion of the perspective 3D view of the memory shown in FIG. 1. It should be clear that while FIG. 1 shows the substrate and 2 planes, FIG. 16 shows the substrate and 4 planes to better illustrate the effect of current leakage from one plane to another.

In accordance with the general principle described in connection with FIG. 5, when the resistive state of a memory element 200 in FIG. 16 is to be determined, a bias voltage is applied across the memory element and its element current $I_{ELEMENT}$ sensed. The memory element 200 resides on Plane 4 and is accessible by selecting the word line 210 (Sel-WLi) and the local bit line 220 (Sel-LBLj). For example, to apply the bias voltage, the selected word line 210 (Sel-WLi) is set to 0v and the corresponding selected local bit line 220 (Sel-LBLj) is set to a reference such as 0.5V via a turned on select gate 222 by a sense amplifier 240. With all other unselected word line in all planes also set to the reference 0.5V and all unselected local bit lines also set to the reference 0.5V, then the current sensed by the sense amplifier 240 will just be the $I_{ELEMENT}$ of the memory element 200.

The architecture shown in FIG. 1 and FIG. 16 has the unselected local bit lines (LBLj+1, LBLj+2, . . . ) and the selected local bit line (Sel-LBLj) all sharing the same global bit line 250 (GBLi) to the sense amplifier 240. During sensing of the memory element 200, the unselected local bit lines can only be isolated from the sense amplifier 240 by having their respective select gate such as gate 232 turned off. In this way, the unselected local bit lines are left floating and will couple to the reference 0.5V by virtue of adjacent nodes which are at 0.5V. However, the adjacent nodes are not exactly at the reference 0.5V. This is due to a finite resistance in each word line (perpendicular to the plane in FIG. 16) which results in a progressive voltage drop away from one end of the word line at which 0.5V is applied. This ultimately results in the floating, adjacent unselected local bit lines coupling to a voltage slightly different from the reference 0.5V. In this instance, there will be leakage currents between the selected and unselected local bit lines as illustrated by broken flow lines in FIG. 16. Then sensed current is then $I_{ELEMENT}$+leakage currents instead of just $I_{ELEMENT}$. This problem becomes worse will increasing word line's length and resistivity.

Double-Global-Bit-Line Architecture

According to one aspect of the invention, a 3D memory includes memory elements arranged in a three-dimensional pattern defined by rectangular coordinates having x, y and z-directions and with a plurality of parallel planes stacked in the z-direction. The memory elements in each plane are accessed by a plurality of word lines and local bit lines in tandem with a plurality of global bit lines. The plurality of local bit lines are in the z-direction through the plurality of planes and arranged in a two dimensional rectangular array of rows in the x-direction and columns in the y-directions. The plurality of word lines in each plane are elongated in the x-direction and spaced apart in the y-direction between and separated from the plurality of local bit lines in the individual planes. A non-volatile, reprogramming memory element is located near a crossing between a word line and local bit line and accessible by the word line and bit line and wherein a group of memory elements are accessible in parallel by a common word line and a row of local bit lines. The 3D memory further includes a double-global-bit line architecture with two global bit lines respectively serving even and odd local bit lines in a column thereof in the y-direction. This architecture allows one global bit line to be used by a sense amplifier to access a selected local bit line and the other global bit line to be used to access an unselected local bit lines adjacent the selected local bit line in the y-direction. In this way the adjacent, unselected local lines can be set to exactly a reference voltage same as that of the selected local bit line in order to eliminate leakage currents between adjacent bit lines.

Figure 17:
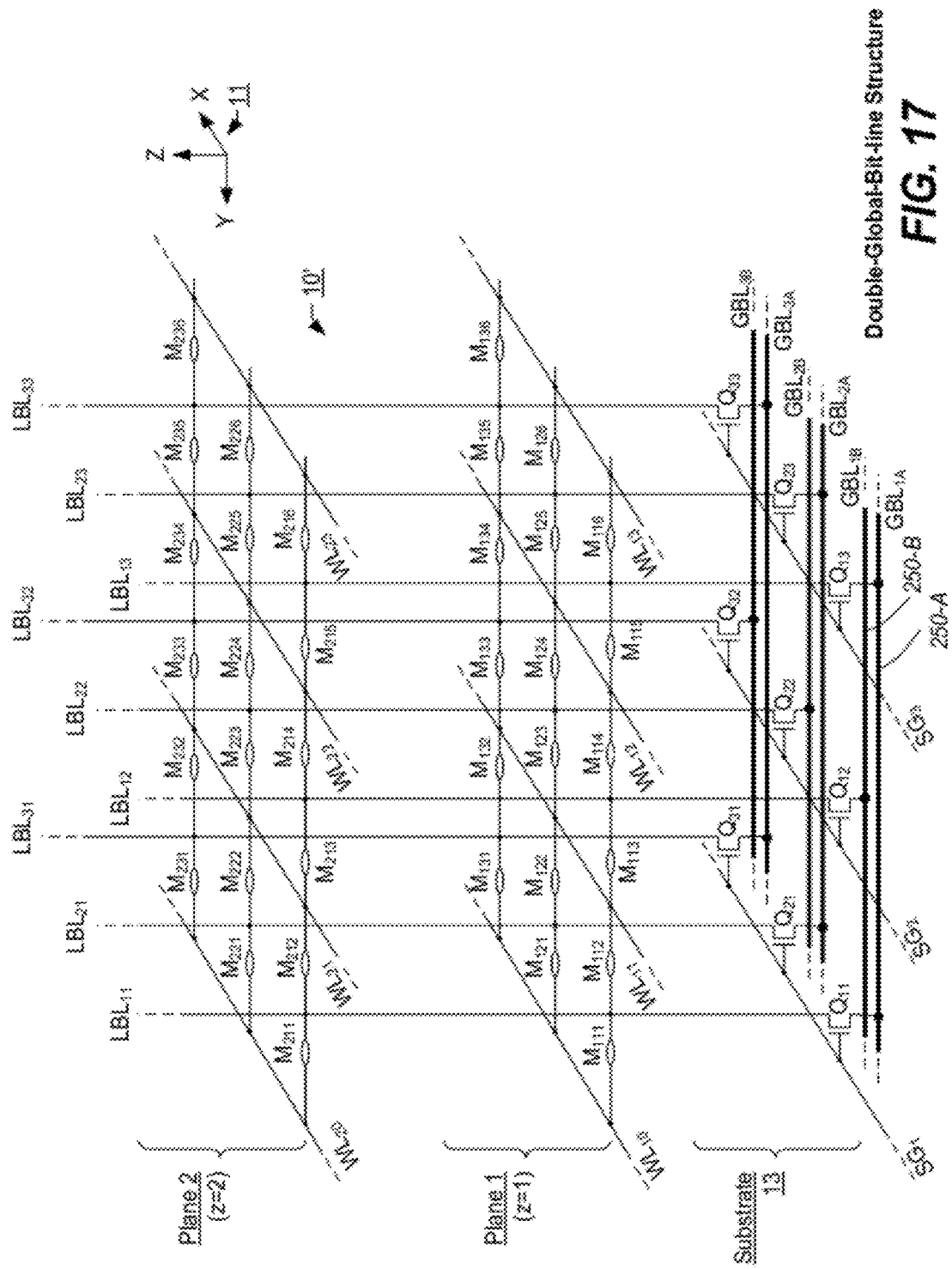
FIG. 17 illustrates a three-dimensional memory with a double-global-bit-line architecture for improved access to a set of local bit lines.

FIG. 17 illustrates a three-dimensional memory with a double-global-bit-line architecture for improved access to a set of local bit lines. An architecture of a three-dimensional memory 10' is schematically and generally illustrated in the form of an equivalent circuit of a portion of such a memory. This is a specific example of the three-dimensional array summarized above. A standard three-dimensional rectangular coordinate system 11 is used for reference, the directions of each of vectors x, y and z being preferably orthogonal with the other two and having a plurality of parallel planes stacked in the z-direction. The local bit lines are elongated vertically, in the z-direction, and form a regular two-dimensional array in the x (row) and y (column) directions.

Memory storage elements $M_{zxy}$ are formed in a plurality of planes positioned at different distances in the z-direction above the substrate 13. Two planes 1 and 2 are illustrated in FIG. 17 but there will typically be more, such as 4, 6 or even more. In each plane at distance z, word lines $WL_{zy}$ are elongated in the x-direction and spaced apart in the y-direction between the local bit-lines ($LBL_{xy}$). Each row of local bit lines $LBL_{xy}$ of each plane is sandwiched by a pair of word lines $WL_{zy}$ and $WL_{zy+1}$. Individually crossing between a local bit line a word line occurs at each plane where the local bit line intersects the plane. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory cell structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other on a semiconductor substrate with the local bit lines $LBL_{Xy}$ being connected with storage elements $M_{zxy}$ of each plane through which the local bit lines extend.

Essentially the three-dimensional memory 10' shown in FIG. 17 is similar to the 3D memory 10 shown in FIG. 1 except for the structure of the global bit lines which has a doubling of the global bit lines.

A circuit for selectively connecting internal memory elements with external data circuits is preferably formed in a semiconductor substrate 13. In this specific example, a two-dimensional array of select or switching devices $Q_{xy}$ are utilized, where x gives a relative position of the device in the x-direction and y its relative position in the y-direction. The individual devices $Q_{xy}$ may be a select gate or select transistor, as examples.

A pair of global bit lines ($GBL_{xA}$, $GBL_{xB}$) is elongated in the y-direction and have relative positions in the x-direction that are indicated by the subscript. The individual devices Qxy each couples a local bit line to one global bit line. Essentially, each local bit line in a row is coupleable to one of a corresponding pair of global bit lines. Along a column of local bit lines, even local bit lines are coupleable to a first one of a corresponding pair of global bit line while odd local bit lines are coupleable to a second one of the corresponding pair of global bit line.

Thus, a pair of global bit lines ($GBL_{x'A}$, $GBL_{x'B}$) at about the x'-position, are individually connectable with the source or drain of the select devices Q in such a manner that local bits ($LBLx'y$) at the x'-position and along the y-direction are coupleable alternately to the pair of global bit lines ($GBL_{x'A}$, $GBL_{x'B}$). For example, the odd local bit lines along the column in the y-direction at the x=1 position ($LBL_{11}$, $LBL_{13}$, . . . ) are coupleable respectively via select devices ($Q_{11}$, $Q_{13}$, . . . ) to a first one $GBL_{1A}$ of the pair of global bit line at x=1. Similarly, the even local bit lines along the same column at the x=1 position ($LBL_{12}$, $LBL_{14}$, . . . ) are coupleable respectively via select devices ($Q_{12}$, $Q_{14}$, . . . ) to a second one $GBL_{1B}$ of the pair of global bit line at x=1.

During reading and also typically programming, each global bit line is typically coupled to one local bit line by accessing through a corresponding select device that has been turned on. In this way a sense amplifier can access the local bit line via the coupled global bit line.

In order to connect one set (in this example, designated as one row) of local bit lines with a corresponding set of global bit lines, control gate lines $SG_y$ are elongated in the x-direction and connect with control terminals (gates) of a single row of select devices $Q_{xy}$ having a common position in the y-direction. In this way, a set or page of memory elements can be accessed in parallel. The select devices $Q_{xy}$ therefore connect one row of local bit lines ($LBL_{xy}$) across the x-direction (having the same position in the y-direction) at a time to corresponding ones of the global bit-lines, depending upon which of the control gate lines $SG_y$ receives a voltage that turns on the select devices to which it is connected. In the double-global-bit line architecture, there is a pair of global bit lines at about each x-position. If a row of local bit lines along the x-directions are coupleable to the first one of each pair of corresponding global bit lines, then along the y-direction, an adjacent row of local bit lines will be coupleable to the second one of each pair of corresponding global bit lines. For example, the row of local bit lines ($LBL_{11}$, $LBL_{21}$, $LBL_{31}$, . . . ) along the x-direction are coupled to the first of each pair of corresponding global bit lines ($GBL_{1A}$, $GBL_{2A}$, $GBL_{3A}$, . . . ) by turning on select devices ($Q_{11}$, $Q_{21}$, $Q_{31}$, . . . ) via the control gate line $SG_1$. Along the y-direction, an adjacent row of local bit lines ($LBL_{12}$, $LBL_{22}$, $LBL_{32}$, . . . ) along the x-direction are coupled to the second of each pair of corresponding global bit lines ($GBL_{1B}$, $GBL_{2B}$, $GBL_{3B}$, . . . ) by turning on select devices ($Q_{12}$, $Q_{22}$, $Q_{32}$, . . . ) via the control gate line $SG_2$. Similarly, a next adjacent row of local bit lines ($LBL_{13}$, $LBL_{23}$, $LBL_{33}$, . . . ) are coupled to the first of each pair of corresponding global bit lines ($GBL_{1A}$, $GBL_{2A}$, $GBL_{3A}$, . . . ) in an alternating manner between the first and second one of each pair.

By accessing a row of local bit lines and an adjacent row using different ones of each pair of corresponding global bit lines, the row and adjacent row of local bit lines can be accessed independently at the same time. This is in contrast to the case of the single-global-bit-line architecture shown in FIG. 1, where both a row and its adjacent row of local bit lines share the same corresponding global bit lines.

As discussed in connection with FIG. 16, the leakage currents due to adjacent rows are not well controlled when the adjacent bit lines can not be set independently to the reference voltage in order to eliminate current leakage.

Figure 18:
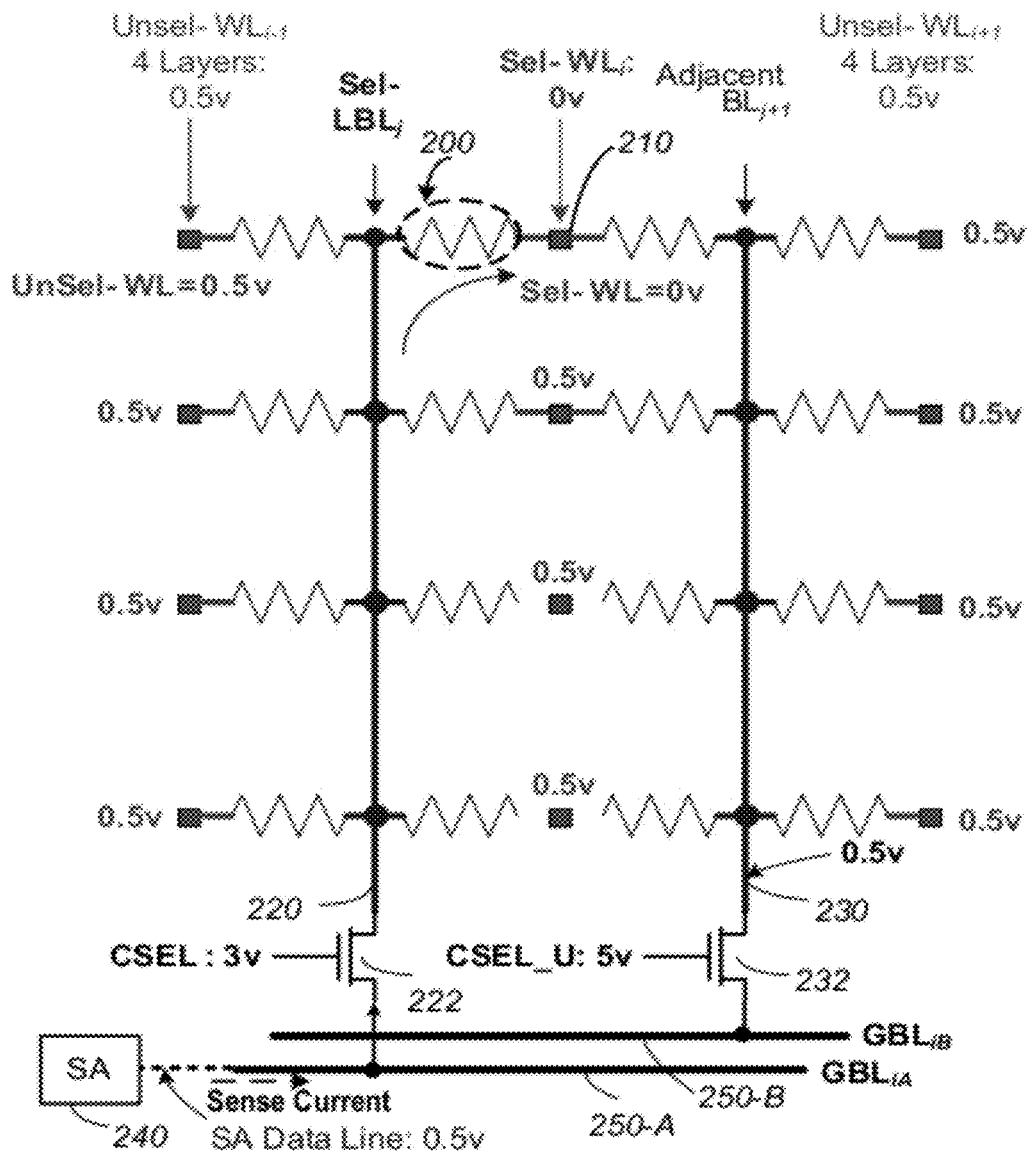
FIG. 18 illustrates the elimination of leakage currents in the double-global-line architecture 3D array of FIG. 17.

FIG. 18 illustrates the elimination of leakage currents in the double-global-line architecture 3D array of FIG. 17. The analysis of leakage current is similar to that described with respect to FIG. 16. However, with the double-global-bit-line architecture, the selected local bit line 220 (Sel-LBLj) allows the memory element 200 to be sensed by the sense amplifier 240 via the first one of the pair of global bit line $GBL_{iA}$, which is maintained at a reference voltage (e.g., 0.5V). At the same time, the adjacent local bit line 230 can be accessed independently by the second one of the pair of global bit line $GBL_{iB}$. This allows the adjacent local bit line 230 to be set to the same reference voltage. Since both the selected local bit line 220 and its adjacent local bit line (along the y-direction) are at the same reference voltage, there will be no leakage currents between the two local bit lines adjacent to each other.

The double-global-bit-line architecture doubles the number of global bit lines in the memory array compared to the architecture shown in FIG. 1. However, this disadvantage is offset by providing a memory array with less leakage currents among the memory elements.

Single-Sided Word Line Architecture

According to another embodiment of the invention, a 3D memory includes memory elements arranged in a three-dimensional pattern defined by rectangular coordinates having x, y and z-directions and with a plurality of parallel planes stacked in the z-direction. The memory elements in each plane are accessed by a plurality of word lines and local bit lines in tandem with a plurality of global bit lines. The plurality of local bit lines are in the z-direction through the plurality of planes and arranged in a two dimensional rectangular array of rows in the x-direction and columns in the y-directions. The plurality of word lines in each plane are elongated in the x-direction and spaced apart in the y-direction between and separated from the plurality of local bit lines in the individual planes. A non-volatile, reprogramming memory element is located near a crossing between a word line and local bit line and accessible by the word line and bit line and wherein a group of memory elements are accessible in parallel by a common word line and a row of local bit lines. The 3D memory has a single-sided word line architecture with each word line exclusively connected to one row of memory elements. This is accomplished by providing one word line for each row of memory elements instead of sharing one word line between two rows of memory elements and linking the memory element across the array across the word lines. While the row of memory elements is also being accessed by a corresponding row of local bit lines, there is no extension of coupling for the row of local bit lines beyond the word line.

A double-sided word line architecture has been described earlier in that each word line is connected to two adjacent rows of memory elements associated with two corresponding rows of local bit lines, one adjacent row along one side of the word line and another adjacent row along the other side. For example, as shown in FIG. 1 and FIG. 3, the word line $WL_{12}$ is connected on one side to a first row (or page) of memory elements ($M_{114}$, $M_{124}$, $M_{134}$, . . . ) associated respectively with local bit lines ($LBL_{12}$, $LBL_{22}$, $LBL_{32}$, . . . ) and also connected on another side to a second row (or page) of memory elements ($M_{115}$, $M_{125}$, $M_{135}$, . . . ) associated respectively with local bit lines ($LBL_{13}$, $LBL_{23}$, $LBL_{33}$, . . . )

Figure 19:
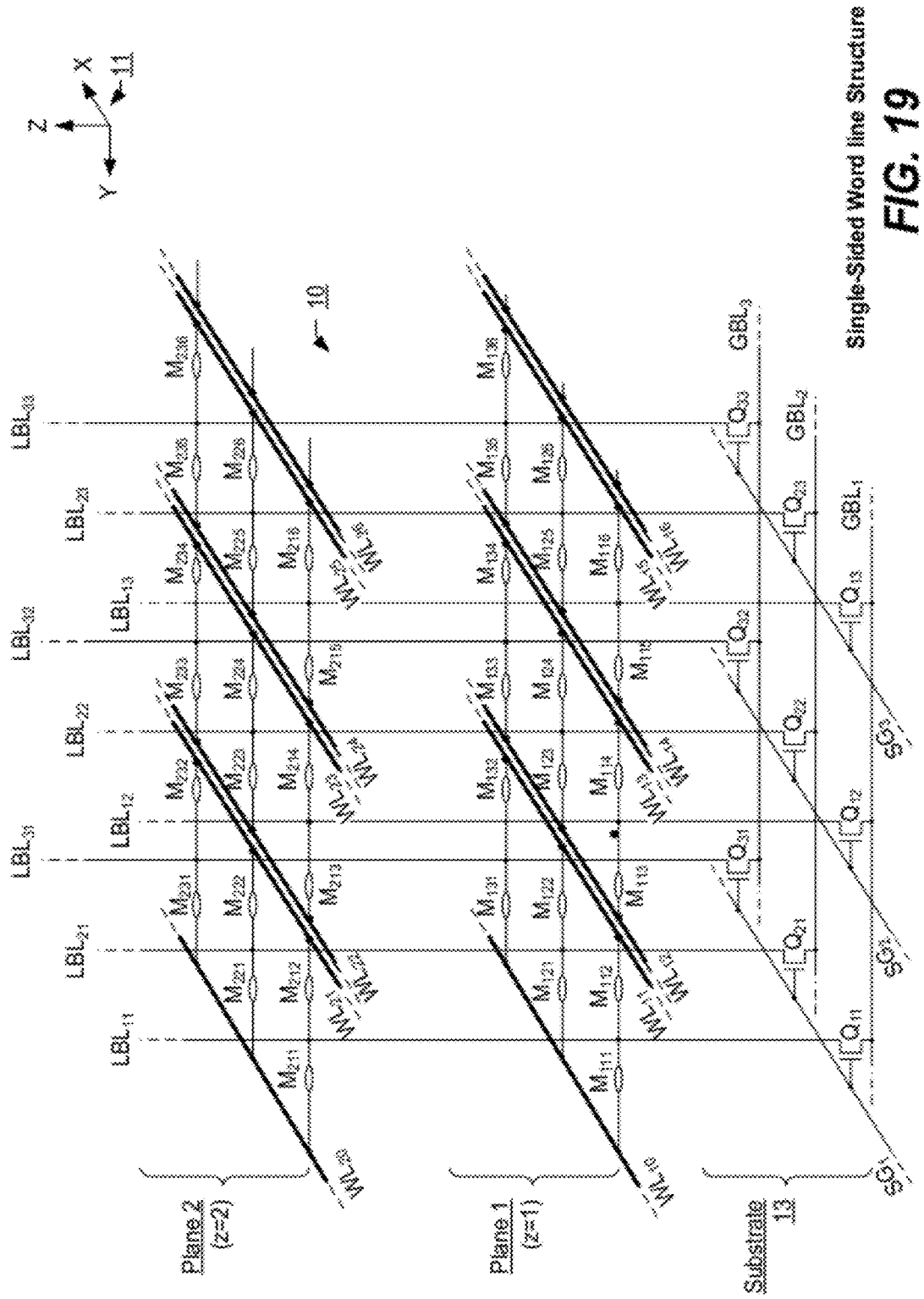
FIG. 19 illustrates schematically a single-sided word line architecture.

FIG. 19 illustrates schematically a single-sided word line architecture. Each word line is connected to an adjacent row of memory elements associate with one row of local bit lines on only one side.

The 3D memory array with the double-sided word line architecture illustrated in FIG. 1 can be modified to the single-sided word line architecture where each word line except ones at an edge of the array will be replaced by a pair of word lines. In this way, each word line is connecting exclusively to one row of memory elements. Thus, the word line $WL_{12}$ shown in FIG. 1 is now replaced in FIG. 19 by the pair of word lines $WL_{13}$ and $WL_{14}$. It will be seen that WL13 is connected to one row of memory elements ($M_{114}$, $M_{124}$, $M_{134}$, . . . ) and WL14 is connected to one row of memory elements ($M_{115}$, $M_{125}$, $M_{135}$, . . . ) As described before, a row of memory elements constitutes a page which is read or written to in parallel.

Figure 20:
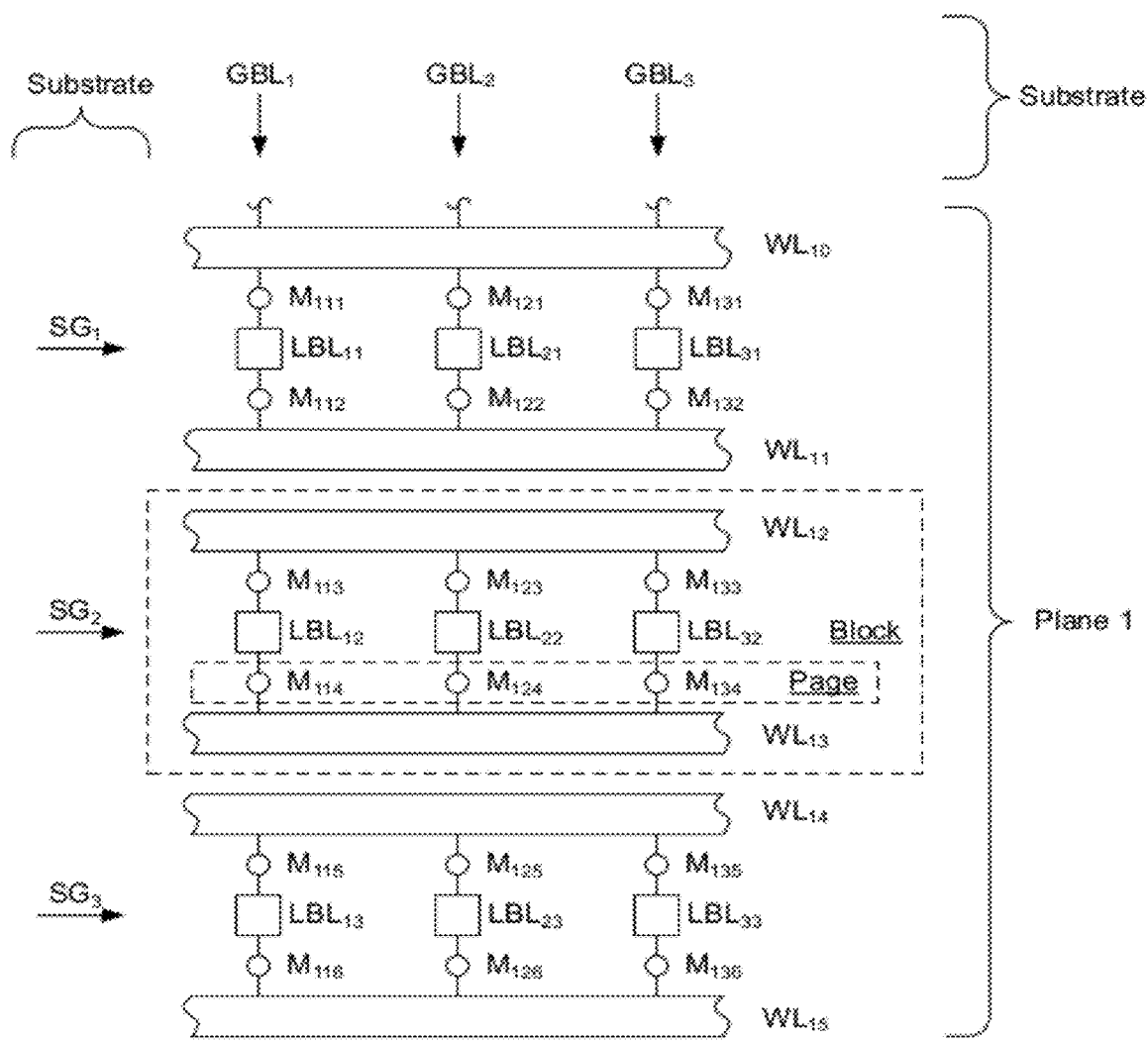
FIG. 20 illustrates one plane and substrate of the 3D array with the single-sided word line architecture.

FIG. 20 illustrates one plane and substrate of the 3D array with the single-sided word line architecture. Going from the double-sided word line architecture of FIG. 3, similarly, $WL_{12}$ in FIG. 3 would be replaced by the pair $WL_{13}$, $WL_{14}$ in FIG. 20, etc. In FIG. 3, a typical double-sided word line (e.g., $WL_{12}$) is connected to two rows of memory elements (on both side of the word line). In FIG. 20, each single-sided word line (e.g., $WL_{13}$) is connected to only one row of memory elements.

FIG. 20 also illustrates a minimum block of memory elements that is erasable as a unit to be defined by two row of memory elements ($M_{113}$, $M_{123}$, $M_{133}$, . . . ) and ($M_{114}$, $M_{124}$, $M_{134}$, . . . ) sharing the same row of local bit lines (e.g., $LBL_{12}$, $LBL_{22}$, $LBL_{32}$, . . . )

Figure 21:
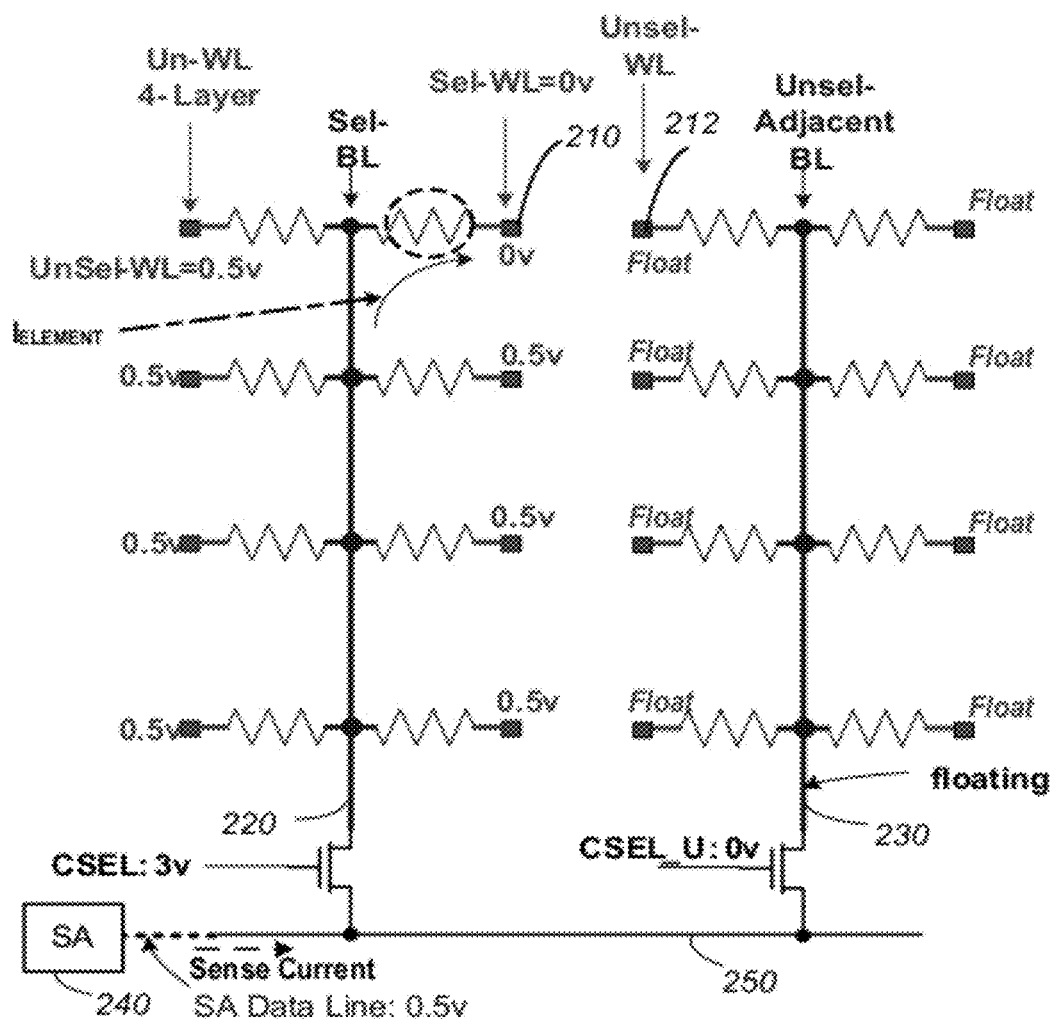
FIG. 21 illustrates the elimination of leakage currents in the single-sided word-line architecture 3-D array of FIGS. 19 and 20.

FIG. 21 illustrates the elimination of leakage currents in the single-sided word-line architecture 3-D array of FIGS. 19 and 20. The analysis of leakage current is similar to that described with respect to FIG. 16. However, with the single-sided word-line architecture, the selected local bit line 220 (Sel-LBLj) is not coupled to an adjacent bit line 230 across the separated word lines 210 and 212. Thus there is no leakage current between adjacent local bit lines and the sense current in the sense amplifier 240 via the global bit line 250 and the local bit line 220 will be just that from the current of the memory element $I_{ELEMENT}$.

The single-sided word-line architecture doubles the number of word lines in the memory array compared to the architecture shown in FIG. 1. However, this disadvantage is offset by providing a memory array with less leakage currents among the memory elements.

Figure 22:
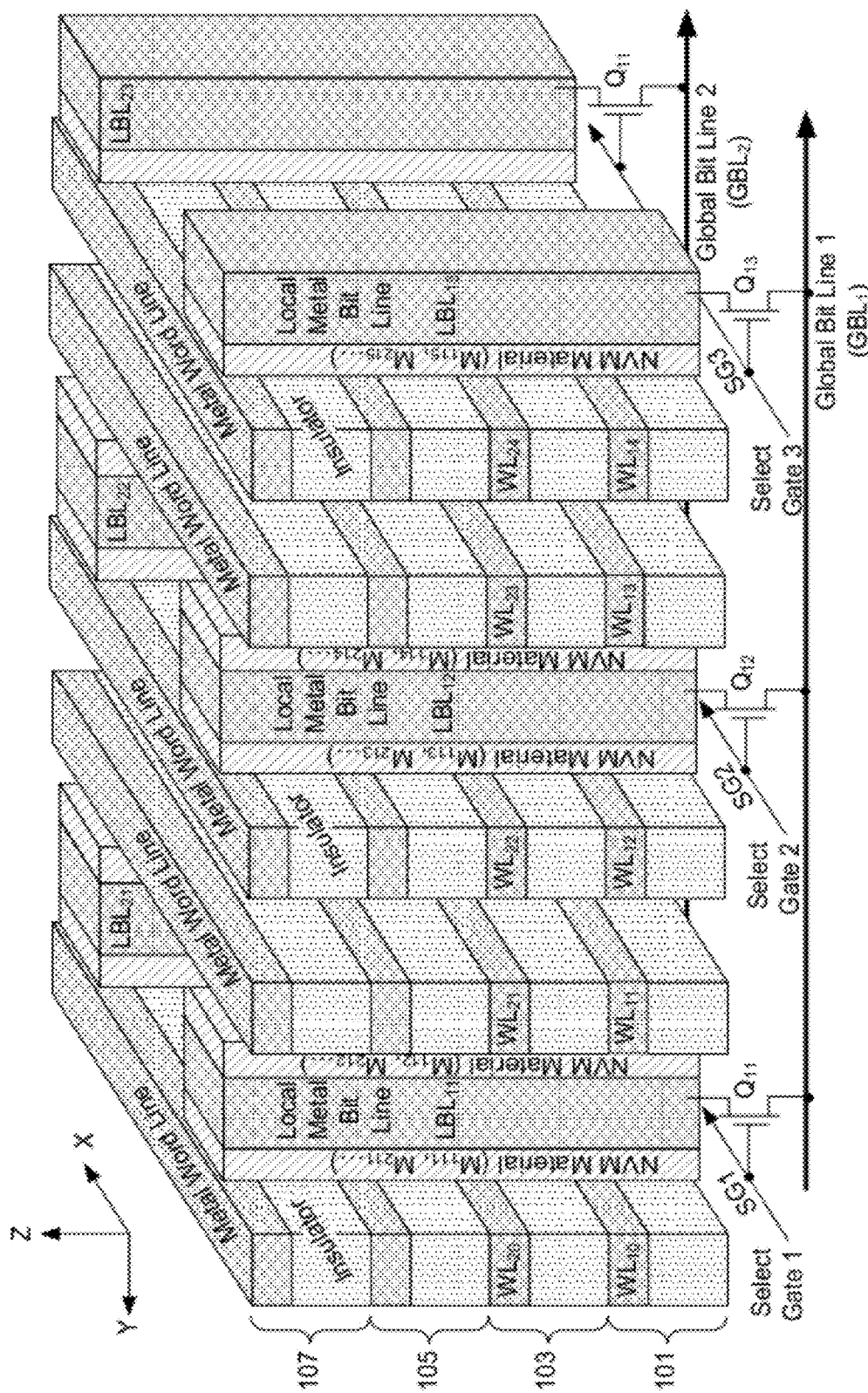
FIG. 22 is an isometric view of a portion of the 3D array with the single-sided word line architecture shown in FIG. 19.

FIG. 22 is an isometric view of a portion of the 3D array with the single-sided word line architecture shown in FIG. 19. Again, similar to the isometric view for the double-side word line architecture shown in FIG. 7, FIG. 22 is one specific example of implementation for the single-sided word-line architecture. The main difference compared to FIG. 7 is that each word line is connected to one side to a row of memory elements. As explained earlier, this architecture has the advantage of decoupling bit-line to bit line coupling across the plurality of word lines in the y-direction.

The 3D array is configured for use of memory element (NVM) material that is non-conductive when first deposited. A metal oxide of the type discussed earlier has this characteristic. As explained with respect to FIG. 6, conductive filaments are formed between electrodes on opposite sides of the material in response to appropriate voltages placed on those electrodes. These electrodes are a bit line and a word line in the array. Since the material is otherwise non-conductive, there is no necessity to isolate the memory elements at the cross-points of the word and bit lines from each other. Several memory elements may be implemented by a single continuous layer of material, which in the case of FIG. 22 are strips of NVM material oriented vertically along opposite sides of the vertical bit lines in the y-direction and extending upwards through all the planes. A significant advantage of the structure of FIG. 22 is that all word lines and strips of insulation under them in a group of planes may be defined simultaneously by use of a single mask, thus greatly simplifying the manufacturing process.

Referring to FIG. 22, a small part of four planes 101, 103, 105 and 107 of the three-dimensional array are shown. Elements of the FIG. 22 array that correspond to those of the equivalent circuit of FIG. 19 are identified by the same reference numbers. It will be noted that FIG. 22 shows the two planes 1 and 2 of FIG. 19 plus two additional planes on top of them. All of the planes have the same horizontal pattern of word lines, dielectric and memory storage element (NVM) material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the select gate lines (SG) elongated in the x-direction, which are also formed in the substrate. The switching devices $Q_{xy}$ may be conventional CMOS transistors (or vertical npn transistors) and fabricated using the same process as used to form the other conventional circuitry. In the case of using npn transistors instead of MOS transistors, the select gate (SG) lines are replaced with the base contact electrode lines elongated in the x-direction. Also fabricated in the substrate but not shown in FIG. 22 are sense amplifiers, input-output (I/O) circuitry, control circuitry, and any other necessary peripheral circuitry. There is one select gate line (SG) for each row of local bit line pillars in the x-direction and one select device (Q) for each individual local bit line (LBL).

Each vertical strip of non-volatile memory element (NVM) material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

The single-sided word line architecture almost double the number of word line in the memory array compared to the double-sided one. This disadvantage is offset by providing a more partitioned memory array with less leakage currents among the memory elements.

While the exemplary embodiments have been described using a 3D co-ordinate system preferably with orthogonal axes, other embodiment in which the local bit lines LBL, word lines WL and global bit lines GBL cross at angles different than 90 degrees are also possible and contemplated.

3D Array of Read/Write Elements with Vertical Bit Lines and Laterally Aligned Active Elements Unlike memory devices with charge storage elements that must be programmed starting from the erased state, the variable resistive memory element described earlier can be written to any one of its states without starting from a given state. As such it is referred to as read/write (R/W) memory as compared to read/erase/program memory of the charge storage type. Thus, the resistive memory elements referred to earlier is also known as R/W memory elements or R/W elements. The 3D array of such R/W elements can be considered as a 3D interconnected resistive mesh.

As described earlier, conventionally, diodes are commonly connected in series with the R/W elements of a 3D memory array in order to reduce leakage currents in the resistive mesh. Across each crossing between a word line and a bit line is disposed a R/W element (also referred to earlier as NVM) with a diode slacked in series. The diode is typically much larger in size compared to the NVM. Thus the diodes form a layer above the NVM and substantially increase the thickness of the memory.

The 3D array with relative short vertical bit lines described earlier in connection with FIG. 1 and FIG. 7, helps to limit the interconnectivity of the resistive mesh and therefore the leakage.

Furthermore the single-side word line architecture for the 3D array described earlier in connection with FIG. 19 also helps to segment the resistive mesh and further reduce the interconnectivity and leakage.

Depending on the material and property of the R/W element, the reduction in leakage enables a viable 3D array that can do away with a diode in series with every R/W element. At least, the reduction in leakage brought by the short bit lines and single-side word lines enables a viable 3D array to employ a less than ideal diode (or what might be considered as a "lousy diode") in series with each R/W element.

According to one aspect of the invention, with the bit lines oriented in the vertical direction serving multiple layers of 2D array of R/W elements and the word lines in the horizontal or lateral direction in each layer, each R/W element with a diode in series are form in a lateral direction between a word line and a bit line at a crossing. By aligning the diode and R/W memory element in the horizontal or lateral direction, the thickness of each layer of word lines is not increased. Furthermore, the diode is formed or incorporated as part of the bit line structure, thereby affording the diode without expensing additional space for it.

According to another aspect of the invention, the 3D array is formed by a process in which the R/W elements and diodes are formed, not layer by layer vertically as in prior art, but laterally on all layers in parallel. This is accomplished by creating a simple multi-layer structure, exposing a cross section of the stratified layers by opening a portal and forming fine structures in each of the exposed layers in a lateral direction. This process is advantageous whether diodes are included or not.

Forming the active devices such as diodes is a high-temperature process. If metallization takes place before, the metal will have to be able to withstand the high-temperature processes that follow. This may exclude the use of aluminum or copper for their better conductivity and economy. The increased resistance in the word lines can exacerbate leakage problems.

The present process allows the high-temperature process for all the layers to be clustered together, and the metallization for the word lines to be performed after the high-temperature process.

Figure 23:
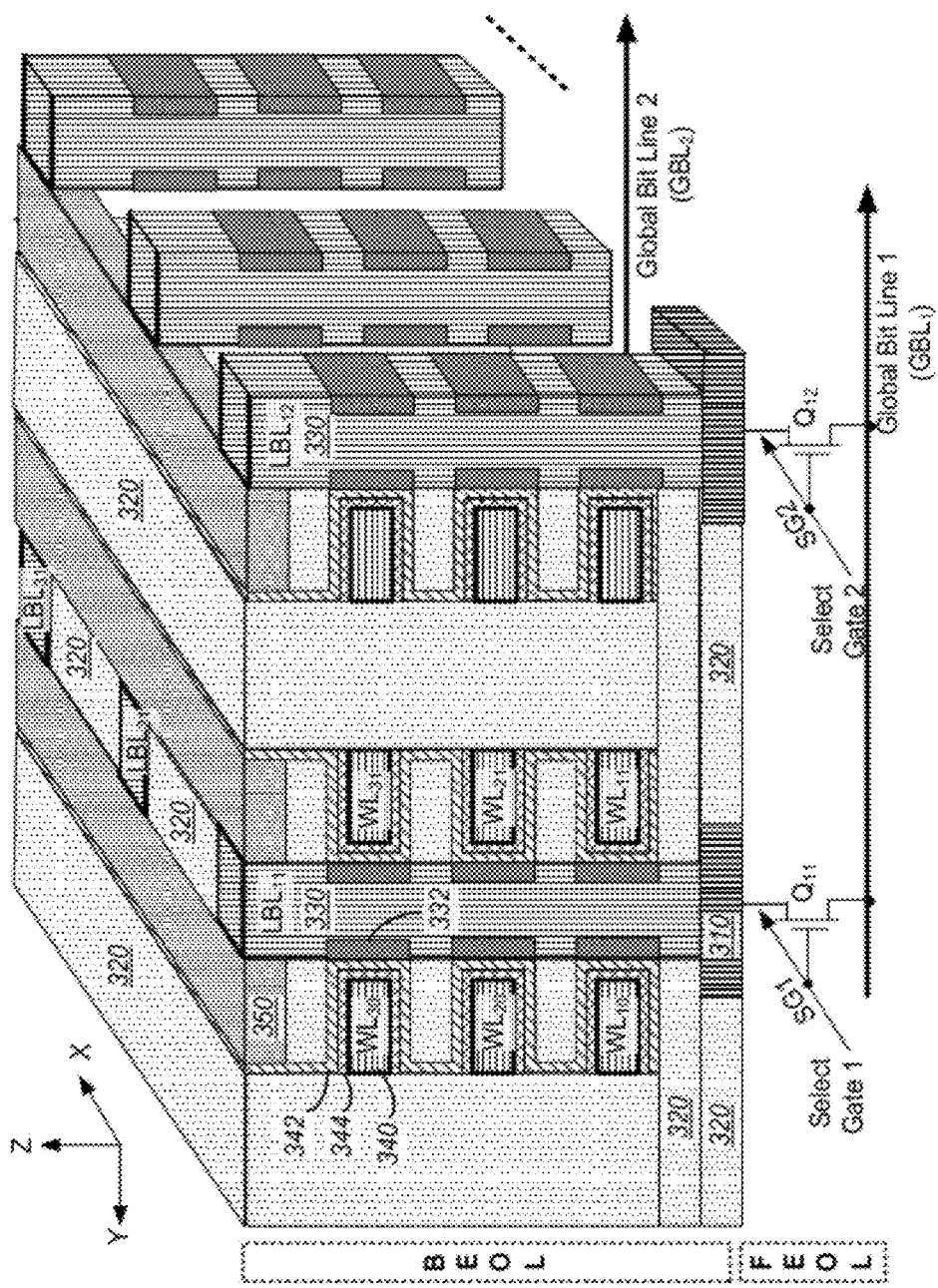
FIG. 23 illustrates a preferred 3D memory structure with vertical local bit lines and horizontally formed active memory elements and diodes.

FIG. 23 illustrates a preferred 3D memory structure with vertical local bit lines and horizontally formed active memory elements and diodes. The 3D memory structure is defined with respect to an x-y-z coordinate system. The local bit lines are in the z-direction, the word lines are in the x-direction and the global lines are in the y-direction.

The 3D structure can be regarded as comprising two portions. A base portion, commonly referred to as FEOL ("Front End Of (Manufacturing) Lines"), is supported by a semiconductor substrate on which active elements such as the select or switching devices Qxy are formed (see also FIG. 1 and FIG. 7). A series of metal lines serving as global lines and various metal contact pads are formed on top of the active elements. Each select device Qxy has a source connected to a metal line and drain connected to a drain terminal. In this way, the select device functions as a switch between the metal line and the drain terminal. As described before, the Qxy for a given y along the x-direction have a common gate in the form of a poly line running along the x-direction. For example, when a select signal SG1 is asserted on the common gate for y=1 of $Q_{11}, Q_{21}, Q_{31}, \ldots$, the drain terminals along x=1, 2, 3, ... are connected respectively to global lines $GBL_1$, $GBL_2$, $GBL_3$, . . . . As will be seen later, the drain terminals are connected to respective local bit lines or word lines via contact pads 310.

A second portion above the base portion is referred to as BEOL ("Back End Of (Manufacturing) Lines"). BEOL is where the multiple layers of R/W material, word lines and vertical local bit lines are formed. The local bit lines and connected to respective contact pads in the FEOL portion. Schematically, a plurality of local bit lines 330 in the z-direction are connected to a set of the contact points 310. Along the z-direction, a stack of memory element layers is formed. At each layer a pair of word lines 340 surrounds from opposite sides a set of local bit line 330. For example, the set of local bit lines ($LBL_{11}$, $LBL_{21}$, $LBL_{,31}$, . . . ) is surrounded by word lines ($WL_{10}$, $WL_{11}$) in layer 1 and ($WL_{20}$, $WL_{21}$) in layer 2, . . . .

The bit line 330 is preferably formed from P+ polysilicon. In a region of a bit line where it is adjacent a word line, the region 332 is doped with N+ doping. In this way a diode 336 is formed in each region of the bit line 330 when it is adjacent a word line 340. In between each word line 340 and the diode 336 is formed a R/W memory element 346. In a preferred embodiment, the resistive memory element 346 is formed by a Ti layer 344 next to the word line 340 followed by a HfOx layer 342. The top layer of the 3D structure is capped by a nitride layer 350. Thus, various layers of R/W elements 342 and 344 and diodes 332 and 330 are formed about each vertical local bit line 330 along the x-direction (e.g., $LBL_{11}$, $LBL_{21}$, $LBL_{31}$, . . . ) so that they are coupled on one side to respective bit lines 330 and on the other side to respective word lines WL 340 (e.g., $WL_{10}$, $WL_{20}$, $WL_{30}$, . . . ) formed subsequently. Similar R/W elements and diodes are formed on another side of the same set of bit lines 330 ($LBL_{11}$, $LBL_{21}$, $LBL_{31}$, . . . ) along the x-direction and also connected to respective word lines ($WL_{11}$, $WL_{21}$, $WL_{31}$, . . . ).

Other volumes of the BEOL portion are filled by a dielectric such as an oxide 320. In this way a 3D R/W array is formed similar to that illustrated schematically in FIG. 19 except for the diode in series between each R/W element and its respective bit line.

Figure 24A:
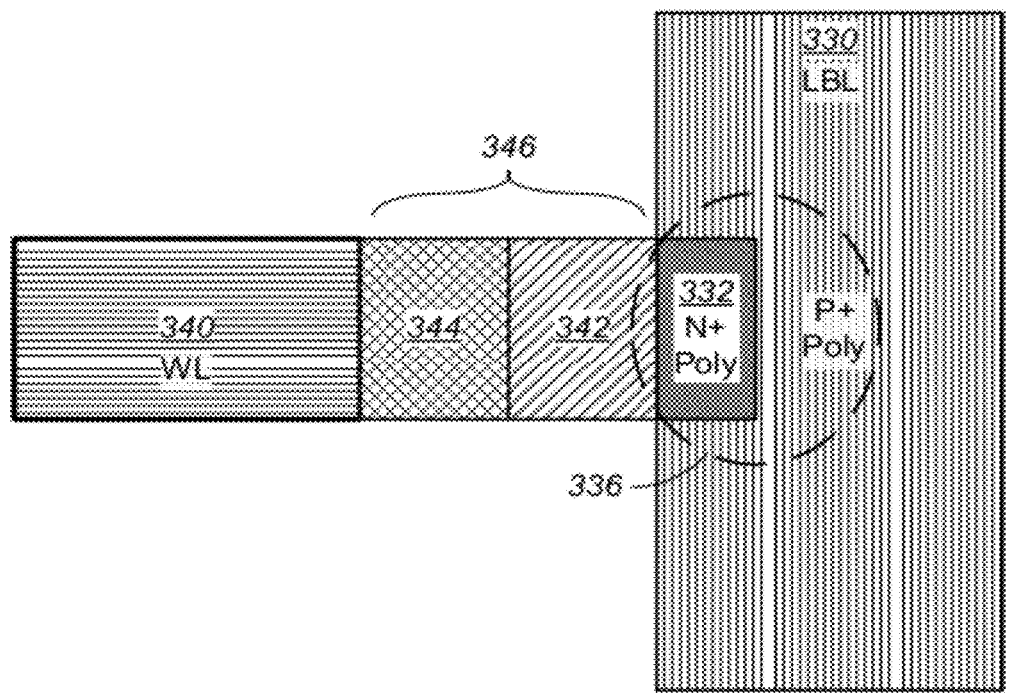
FIG. 24A illustrates in more detail the R/W element and diode formed between a pair of word line and bit line at a crossing.

FIG. 24A illustrates in more detail the R/W element and diode formed between a pair of word line and bit line at a crossing. In one embodiment, the R/W memory element 346 is formed with the Ti layer 344 and the HfOx layer 342. The Ti layer is in electrical contact with the word line 340 while the HfOx layer 342 is in electrical contact with the diode 336. The bit line 330 is generally doped as a P+ polysilicon. However, it is countered doped as N+ in the region 332 where there is a crossing with a word line such as the word line 340. The resulting PN junction effectively forms the diode 336 which is disposed in series with the R/W element 346 between the word line 340 and the local bit line 330.

Figure 24B:
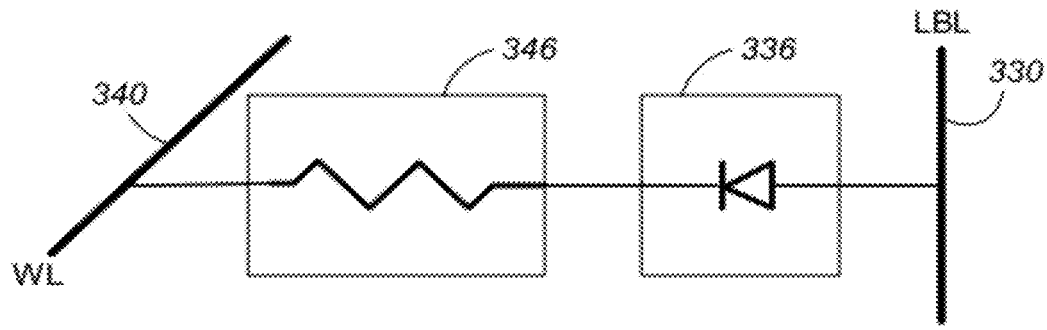
FIG. 24B illustrates schematically the equivalent circuit of the R/W memory element 346 and diode 336 in series between each crossing of a word line 340 and a local bit line 330.

FIG. 24B illustrates schematically the equivalent circuit of the R/W memory element 346 and diode 336 in series between each crossing of a word line 340 and a local bit line 330.

The 3D memory structure shown in FIG. 23 and also in FIG. 24A and FIG. 24B has the advantage of realizing a 3D memory where each memory element has a diode isolation to reduce current linkage to adjacent local bit lines. Unlike prior art structure where the diode is formed on top of each memory element in the z-direction, the horizontal (x-direction) orientation of the memory element 346 allows each diode to be formed as a region of a local bit line, thereby not taking up additional space.

FIGS. 25A-25F illustrate the formation of the BEOL (top) portion of 3D memory shown in FIG. 23 at various processing stages.

Figure 25A:
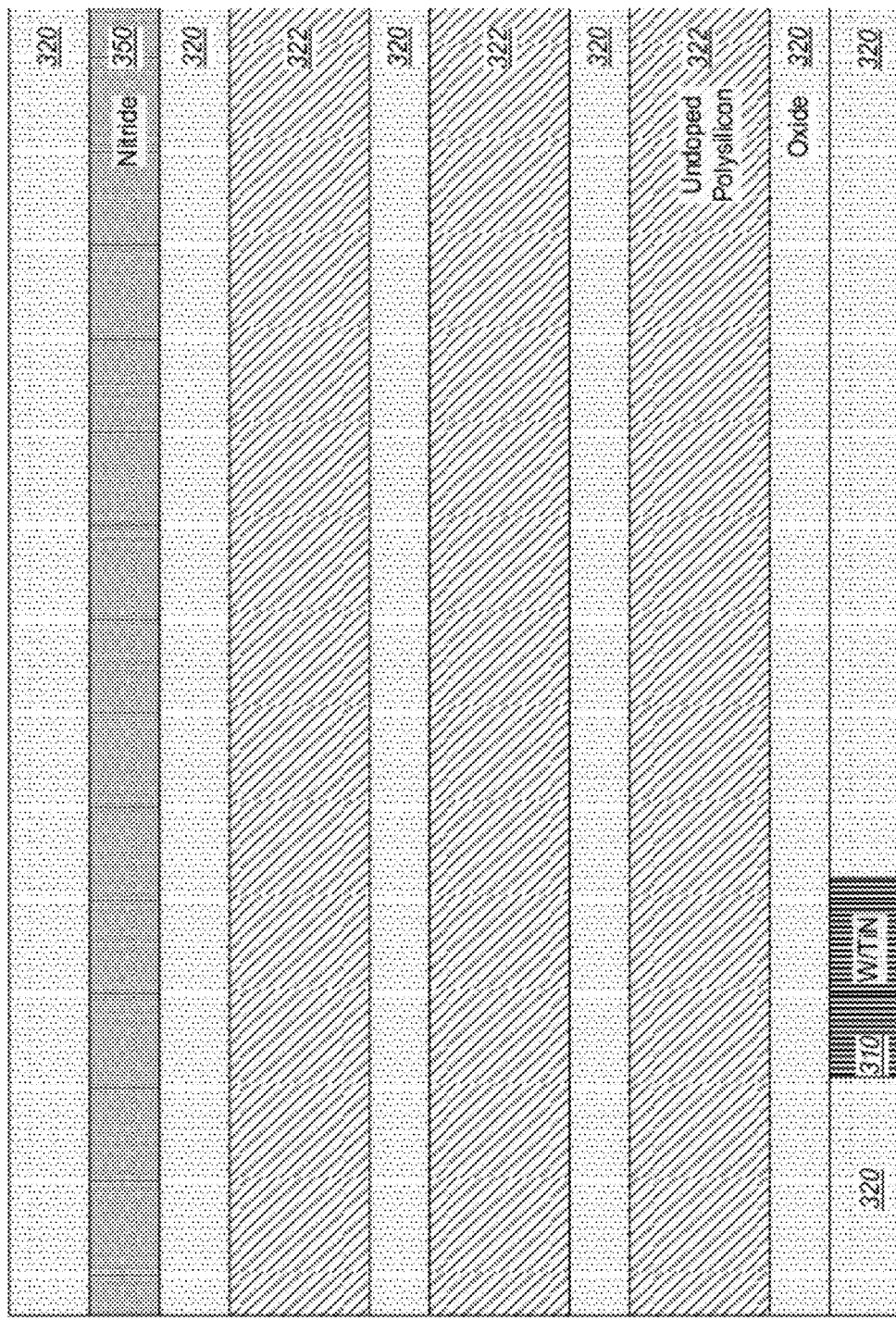
FIG. 25A illustrates the formation of the BEOL portion as a multi-layer structure being formed on top of the FEOL base layer.

FIG. 25A illustrates the formation of the BEOL portion as a multi-layer structure being formed on top of the FEOL base layer. A gross structure is formed as a sandwich of multiple alternate layers of oxide 320 and layer of sacrificial material 322. Undoped polysilicon is preferably used to form the sacrificial layer 322 as it can easily be etched away and replaced by other structures. The FEOL base layer is formed with the switching devices Qxy which switch between respective global line and drain terminals as described earlier. A metal pad of preferably W or TiN is formed on each drain terminal to make the connection. This is followed by a layer of oxide 320. The layer of oxide is then planarized to be flushed with that of the metal pads. Subsequently, a sandwich of alternate layers of undoped polysilicon 322 and oxide 320 are laid down. The sandwich is capped by a protective nitride layer 350. In the preferred embodiment, another sacrificial layer of oxide is also deposited on top of the nitride layer.

Figure 25B:
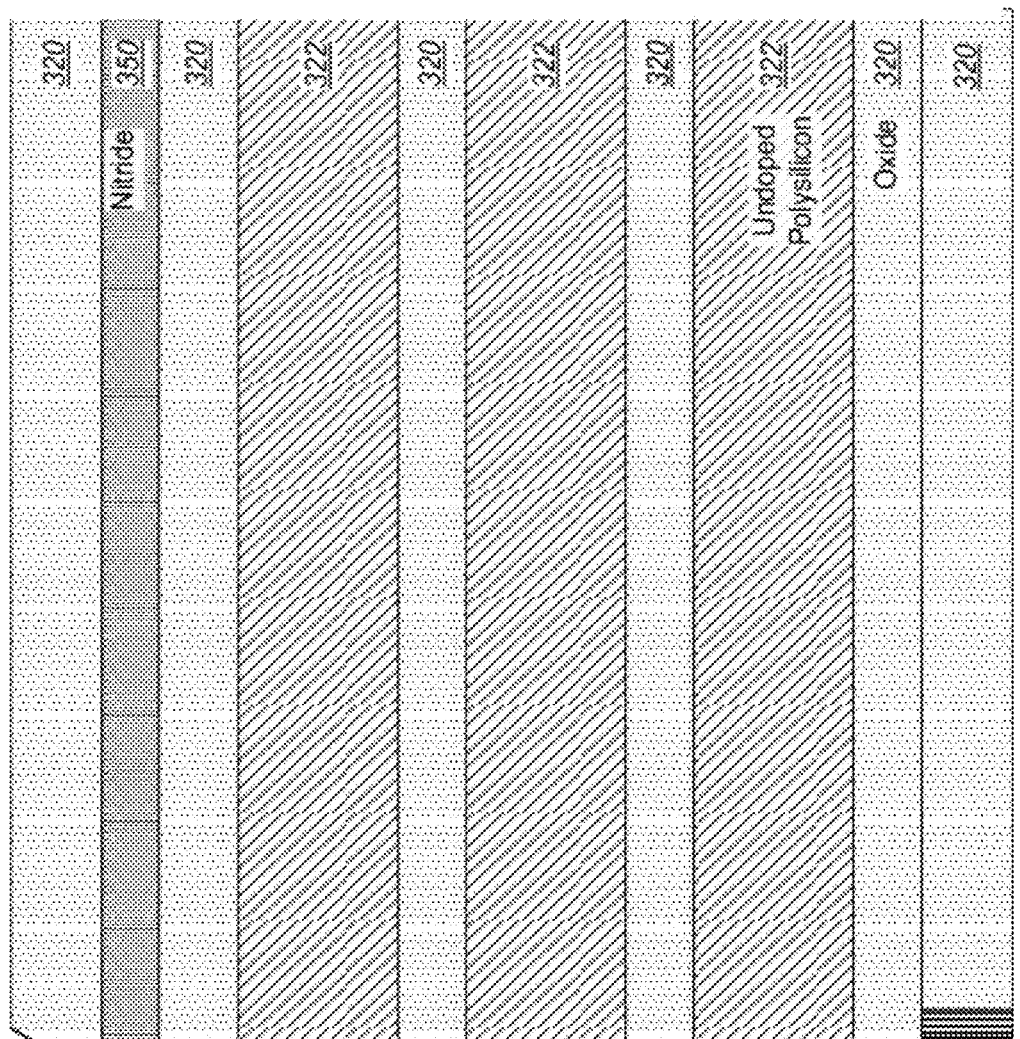
FIG. 25B illustrates the formation of trenches where the plurality of local bit lines 330 are to be formed in the 3D structure of FIG. 25A.

FIG. 25B illustrates the formation of trenches where the plurality of local bit lines 330 are to be formed in the 3D structure of FIG. 25A. Essentially a hard mask ("HM") deposition and lithography is set up so that vertical trenches running along the x-direction in the 3D structure can then be etched away to form the trenches where the local bit lines are to be formed. The trenches are lined up with contact pads in the x-direction so that local bit lines will be formed to make contacts with the contact pads.

Figure 25C:
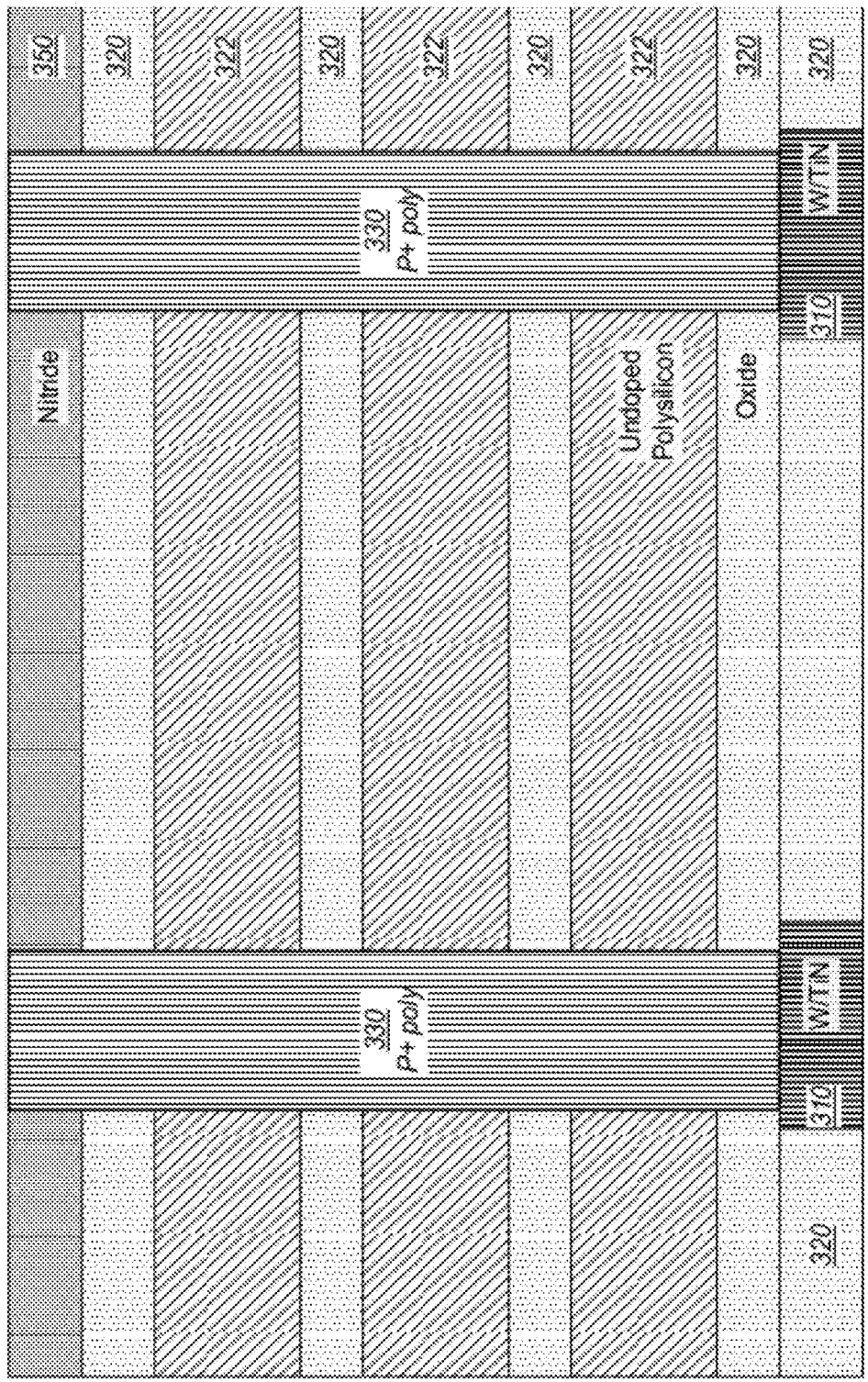
FIG. 25C illustrates the formation of the local bit lines in the trenches of FIG. 25B.

FIG. 25C illustrates the formation of the local bit lines in the trenches of FIG. 25B. After HM removal, a BOE ("buffered oxide etch") help to clean the structure exposing the nitride layer as a top layer. The local bit lines 330 are then formed (in the form of a slab along the x-direction) by filling the trenches with P+ poly. The P+ poly is then planarized.

Figure 25D:
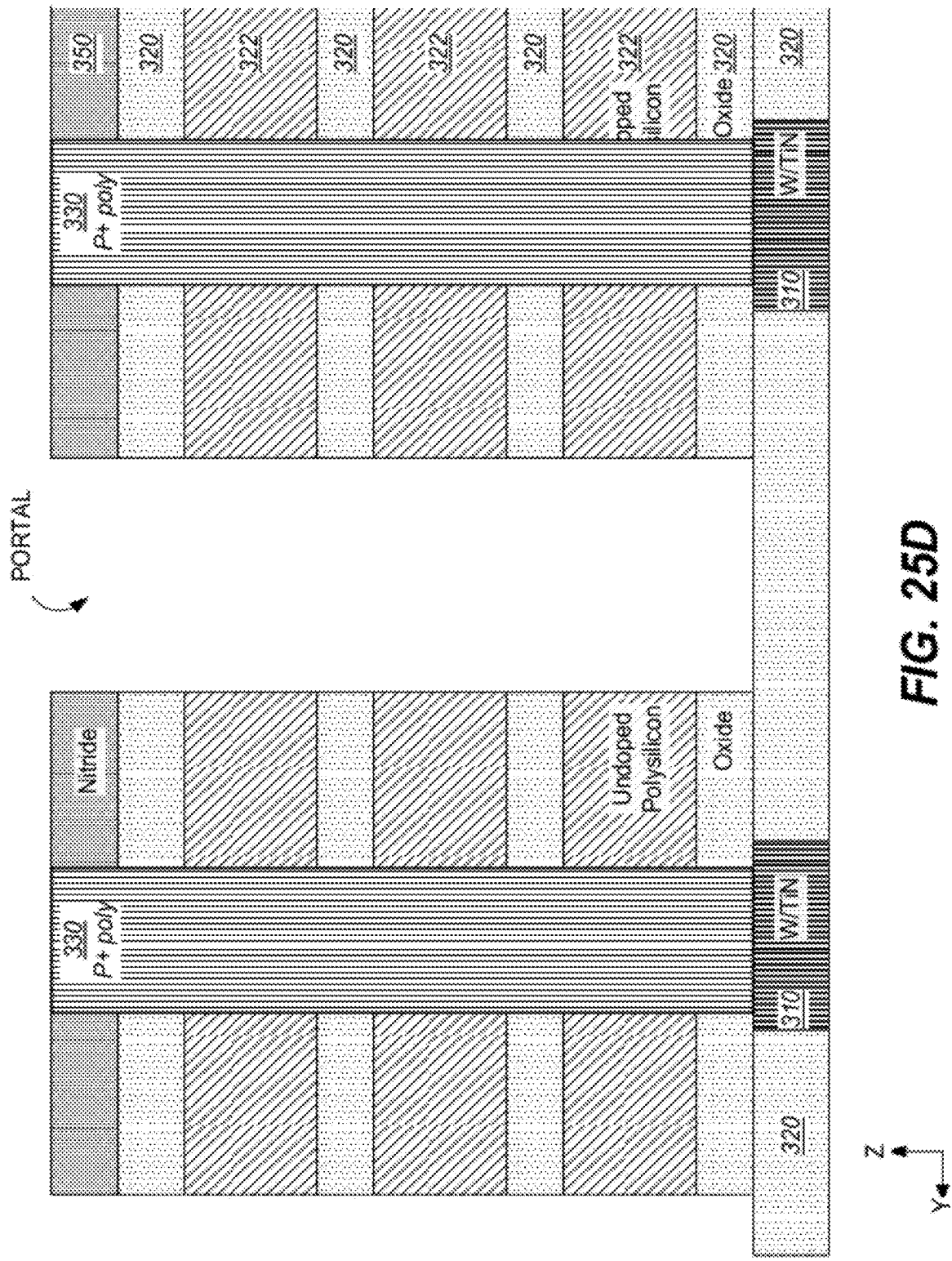
FIG. 25D illustrates the formation of a portal to access the stratified 3D structure laterally.

FIG. 25D illustrates the formation of a portal to access the stratified 3D structure laterally. This allows the structures in each layer, such as R/W elements, diodes and word lines, to be formed for all layers in parallel. This is accomplished by HM deposition followed by litho and etch.

Figure 25E:
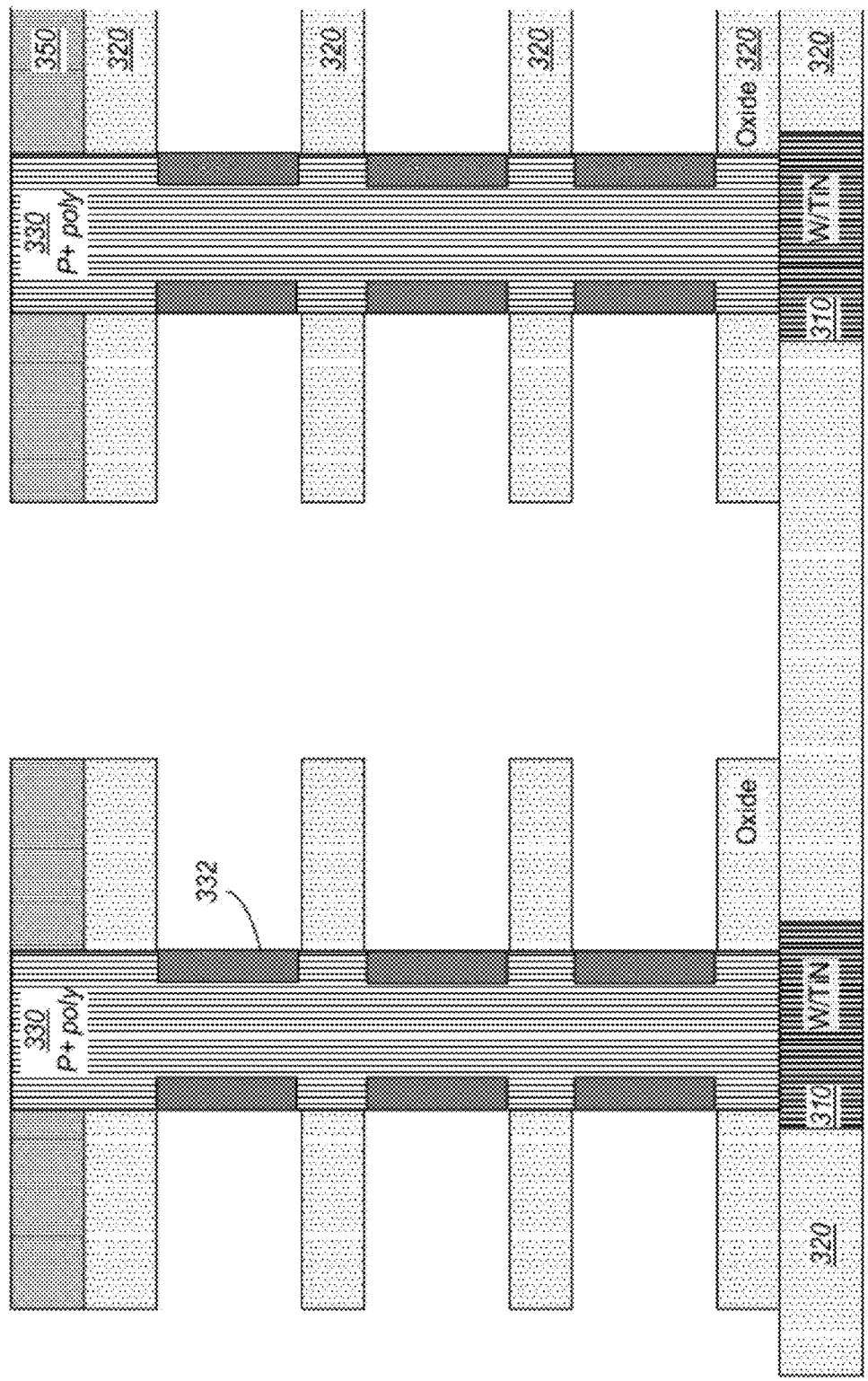
FIG. 25E illustrates the formation of recessed spaces for forming the structures in each layer.

FIG. 25E illustrates the formation of recessed spaces for forming the structures in each layer. The recessed spaces for all layers are created in parallel. This is accomplished by a KOH wet etch followed by a second, isotropic recess etch which selectively removes the undoped poly right up to the columns of the local bit lines.

The exposed bands of the slabs of local bit lines are then counter-doped with N+ by a gas-phase doping process. This will create a PN junction just below the exposed surface of the local bit lines.

In another embodiment, the local bit lines are formed with N+ polysilicon. The diode will then be made by P+ diffusion.

In another embodiment where diodes are not implemented, the N+ doping will be skipped. In that case, the local bit lines can be formed with metal.

Figure 25F:
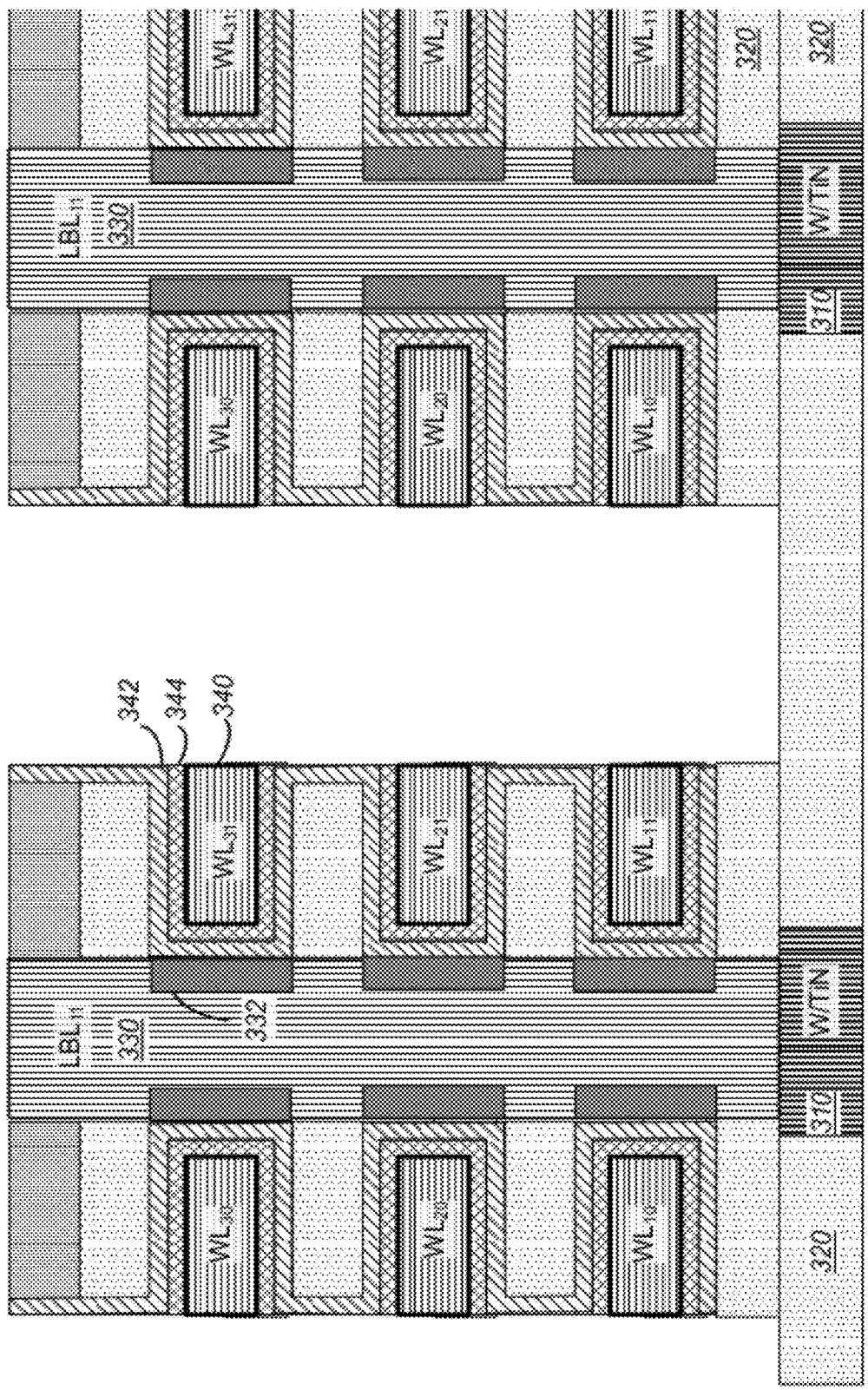
FIG. 25F illustrates the formation of the R/W layer followed by the word line for each of all the recessed spaces.

FIG. 25F illustrates the formation of the R/W layer followed by the word line for each of all the recessed spaces. The recessed space is first BOE (Buffered Oxide Etched) etched. Then the R/W material is formed by Atomic Layer Deposition of a first layer 342 (e.g., HFOx.) This is followed by depositing a second layer 344 (e.g., Ti (titanium)) by Chemical Vapor Deposition.

Next, the word lines 340 can be formed. With the high-temperature process of forming the active elements of the diodes 332, 330 all completed as described in FIG. 25E, the metallization can be optimized for its conductivity without regard to subsequent high-temperature degradation. For example, aluminum or copper could be deposited. In other embodiments, high-temperature metals can also be contemplated such as a thin layer of TiN followed by a bulk layer of W (titanium) by Chemical Vapor Deposition. The excess from various depositions can be etched back.

Figure 25G:
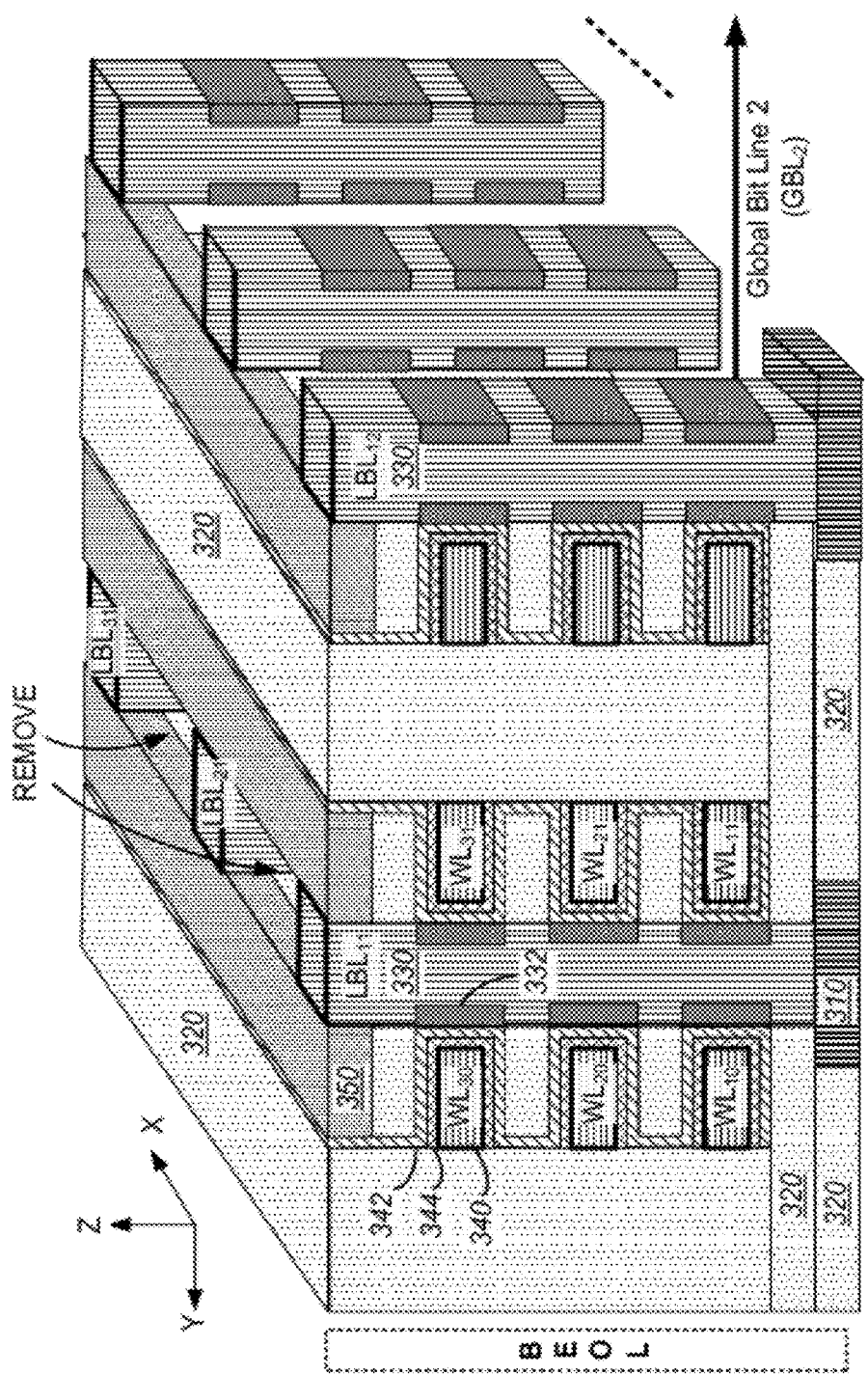
FIG. 25G illustrates the formation of the individual local bit line columns by first removing portions of the local bit line slab along the x-direction.

FIG. 25G illustrates the formation of the individual local bit line columns by first removing portions of the local bit line slab along the x-direction. The resulting voids are then filled with oxide 320 as shown in FIG. 23. The top surface is planarized by chemical and mechanical polishing.

Figure 26A:
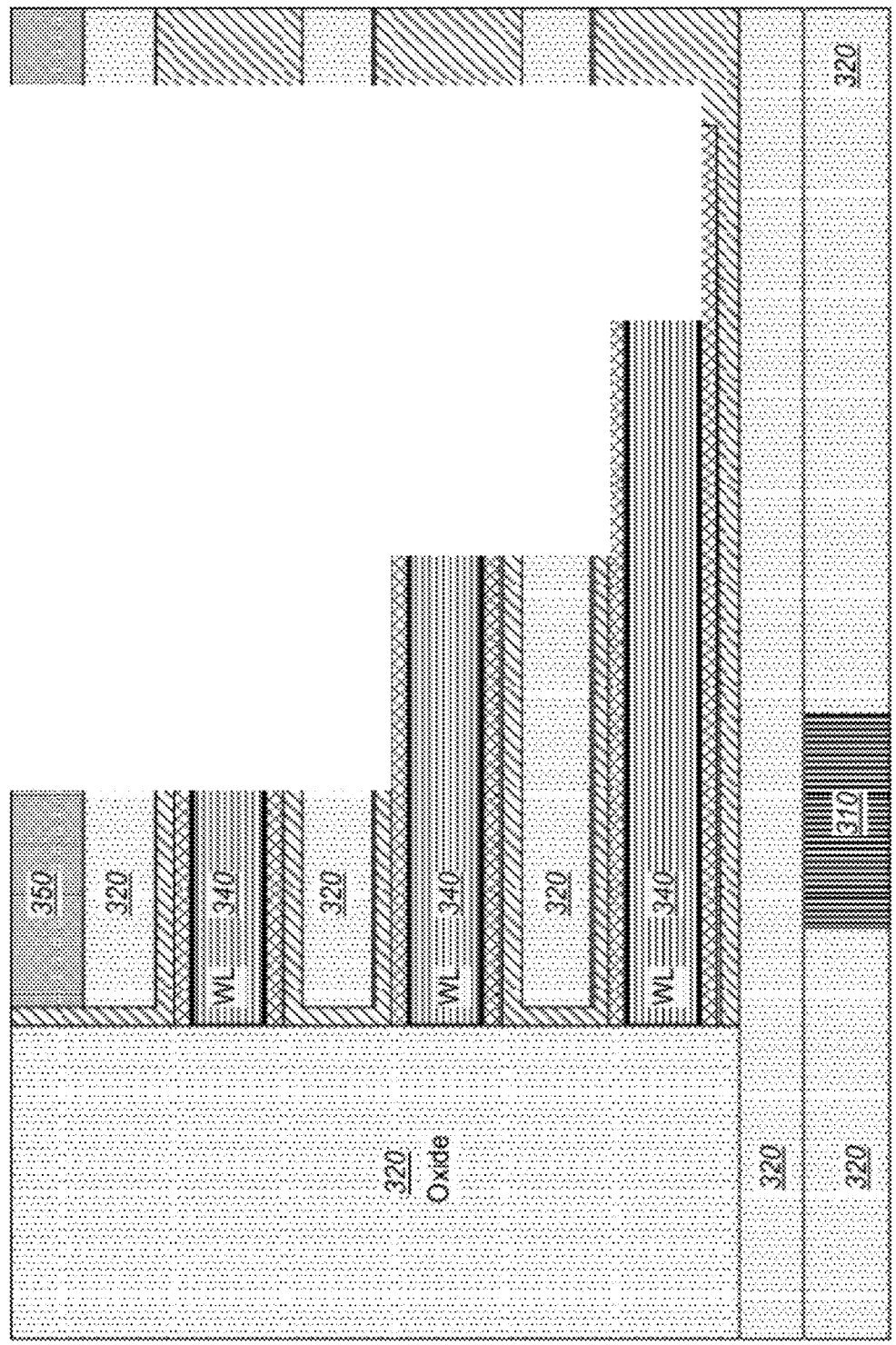
FIG. 26A illustrates the 3D structure is terraced to provide an offset at different layers.
Figure 26B:
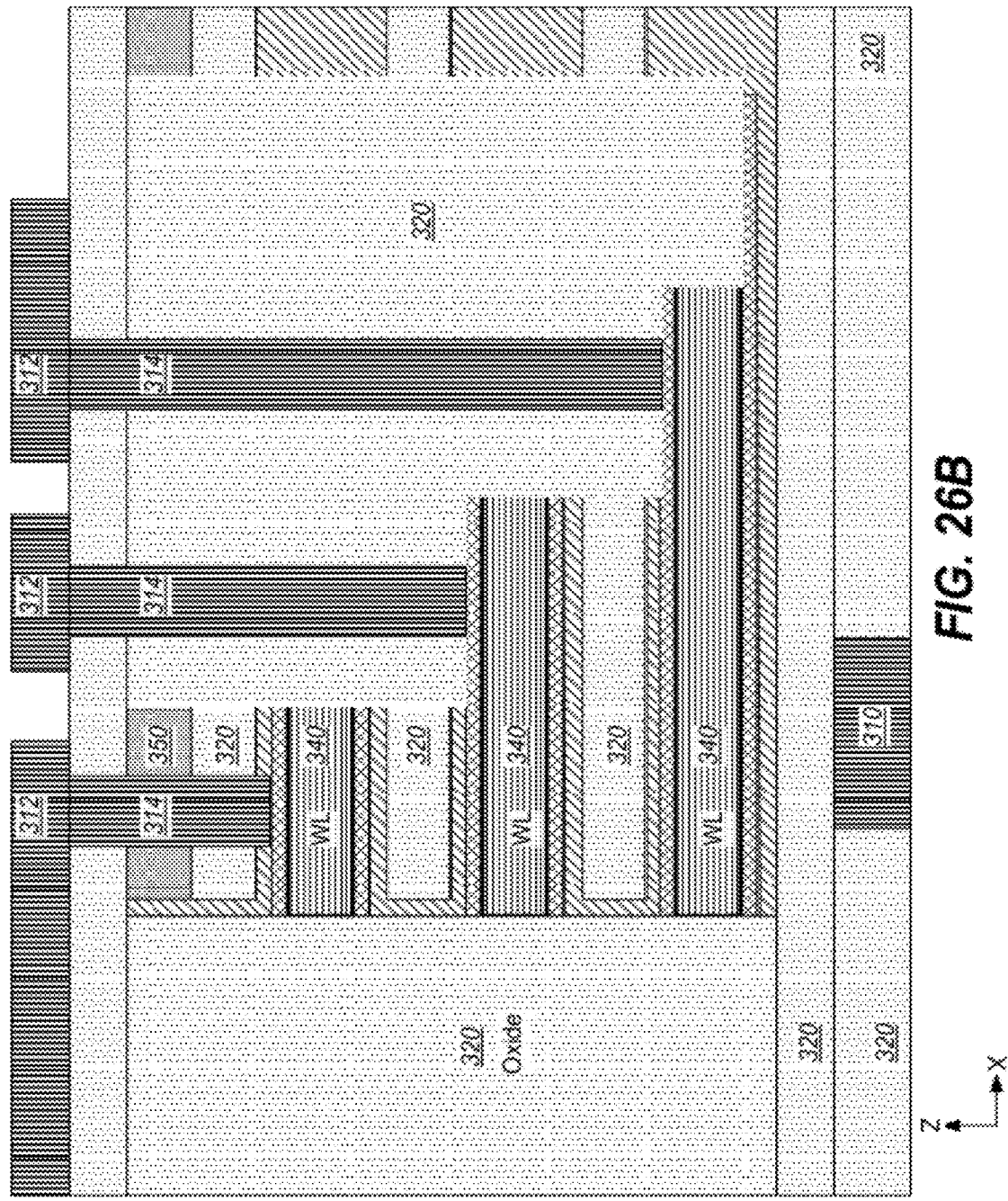
FIG. 26B illustrates the formation of the surface metal lines connecting to the respective word lines by riser columns.

FIGS. 26A-26B illustrate the formation of metal lines and contacts for accessing the word lines 340 of the 3D memory shown in FIG. 23. Essentially, the word lines are accessed by contacts from either top or bottom of the 3D memory structure. Each word line is connected to a metal line at a surface of the 3D memory structure by a vertical riser column.

FIG. 26A illustrates the 3D structure is terraced to provide an offset at different layers. By terracing the different layers, the word lines at each layer will have an unobstructed path for its riser column from the top. Preferably, the access is at the ends of the word lines. For example, terracing is formed at both ends of the 3D structure along the x-direction so that the metal lines at the surface is at half density compared to accessing all the word lines from one end. After terracing and creating an unobstructed view for each layer of word lines, the volume removed during terracing is refilled with oxide and planarized.

FIG. 26B illustrates the formation of the surface metal lines connecting to the respective word lines by riser columns. The spaces for the riser columns are etched away from the top of each of the terrace layers to make way for the riser column. The resulting void is then filled with a riser column 314 that connects a word line to the top surface of the 3D structure.

In one embodiment, the riser column 314 can then be connected by a metal line 312 formed at the top surface.

According to another aspect of the invention to be described in more detail in a next section, the word lines are accessed via some of the global bit lines, such as those shown in FIG. 22.

Figure 27:
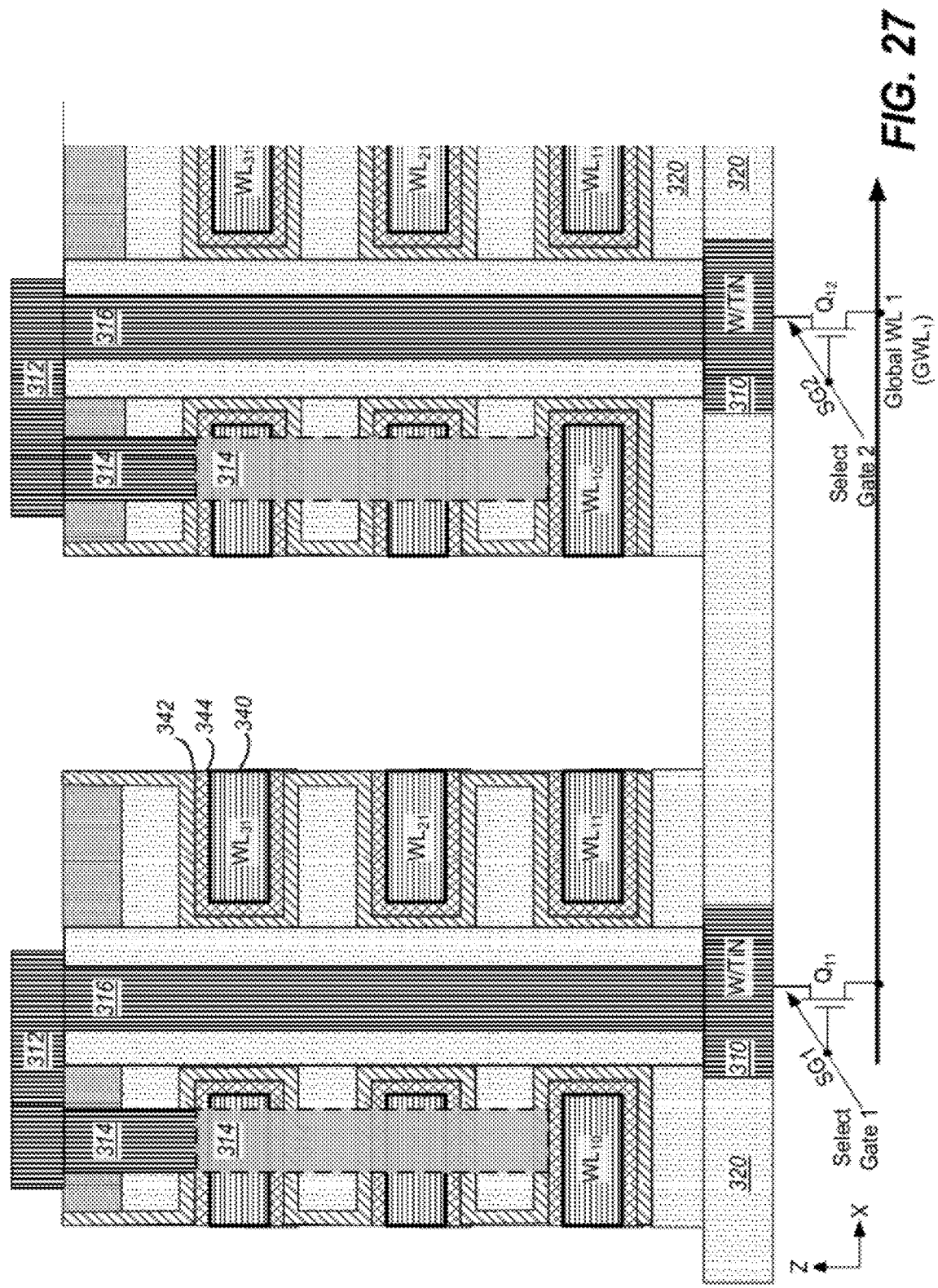
FIG. 27 illustrates another embodiment in where the word lines are accessed by metal wires at the base portion of the 3D structure, such as appropriating some of the global bit lines shown in FIG. 22 to act as global word lines.

FIG. 27 illustrates another embodiment in where the word lines are accessed by metal wires at the base portion of the 3D structure, such as appropriating some of the global bit lines shown in FIG. 22 to act as global word lines. In one embodiment, the connection to a word line is brought to a metal line at the top of the 3D structure as in FIG. 26A and FIG. 26B. With the metal line at the top serving as a connection bridge, a second column riser 316 drills down to make contact with an appropriate global word line via one of the contact pads 310. To form the second riser columns 316, columns are evacuated from the top of the 3D structure and then filled with conductive material such as metal. Then the metal lines 312 at the top serving as connection bridges are formed.

Efficient Decoding of Vertical Bit Lines and Horizontal Word Lines

According to another aspect of the invention, a 3D memory having multiple layers of 2D array of R/W elements in the x-y plane are accessible by word lines exclusive among each layer and an array of vertical local bit lines in the z-direction common to all layers. A plurality of metal lines along the y-direction is provided either at a base portion or a top surface of a 3D memory. A first set of the metal lines are switchably connected to allow access to a selected group vertical local bit lines and a second set of the metal lines are switchably connected to allow access to a selected word line in any one of the layers.

The set of metal lines serves as global access lines for selected sets of local bit lines and word lines. The switching of the set of metal lines to the selected sets of local bit lines and word lines is accomplished by a set of switching transistors at the base portion of the 3D memory. When the metal lines are located at the top surface of the 3D memory, a set of riser columns provides the connections from the switching transistors to the metal lines.

As described earlier, the 3D memory array has a base layer (FEOL) portion and another portion (BEOL) having multiple layers memory element planes. In the embodiments described earlier in connection with FIG. 1, FIG. 7 and FIG. 22, a set of metal lines acting as global bit lines are formed at the base portion (FEOL) of the 3D structure.

In the present invention not all the metal lines in the set are used for decoding the local bit lines. Instead some of them are reserved for decoding a set of selected word lines, two from each layer. This scheme provides a highly scalable decoding architecture. It allows decoding of any combination of word lines and local bit lines. It allows further segmentation of the word lines into local word lines, thereby helping to reduce the word line resistance and the interactivity of the 3D resistive mesh.

Figure 28:
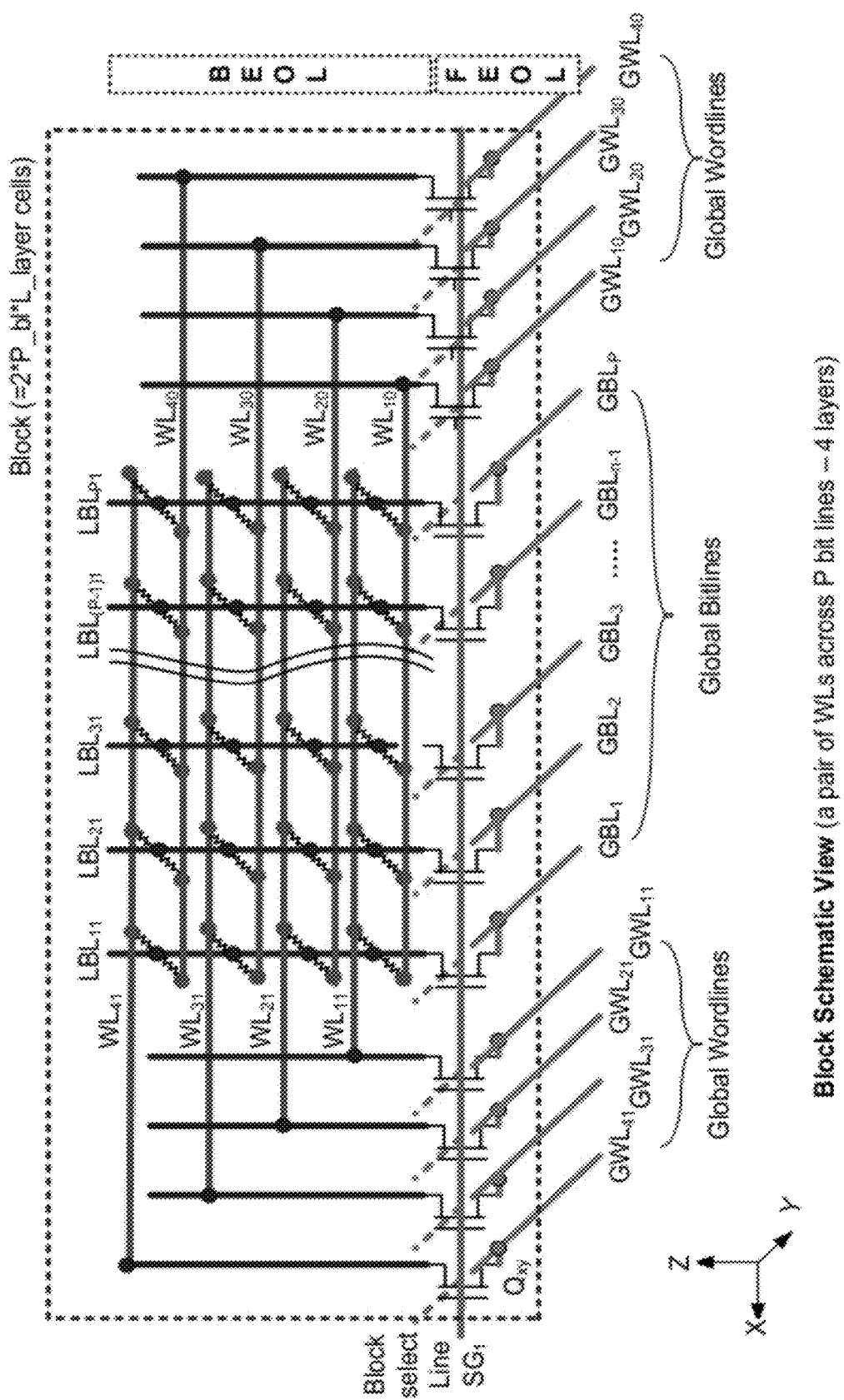
FIG. 28 illustrates an efficient decoding of vertical bit lines and horizontal word lines in a 3D memory array via a set of global lines and select devices.

FIG. 28 illustrates an efficient decoding of vertical bit lines and horizontal word lines in a 3D memory array via a set of global lines and select devices. An example 3D array with 4 layers stacked along the z-direction is shown. Similar to the 3D array shown in FIG. 17 and FIG. 23, the 4 layers are accessible by a 2D array of local bit lines in the vertical or z-direction. At each layer there will be a set of word lines spaced apart along the y-direction and with each word line running along the x-direction.

FIG. 28 only shows one block of memory elements constituted from a selected pair of word lines on each layer, wrapping on both sides of a selected page of local bit lines ($LBL_{11}, LBL_{21}, LBL_{31}, \ldots, LBL_{(P-1)1}, LBL_{P1}$). Thus, WL10 and WL11 are the selected pair of word lines at layer 1; WL20 and WL21 are the selected pair of word lines at layer 2; WL30 and WL31 are the selected pair of word lines at layer 3; and WL40 and WL41 are the selected pair of word lines at layer 4. The block is constituted from $2*P\_b1*L\_layer$ of memory elements. In the current example $P\_b1=P$ and $L\_layer=L$, amounting to 2PL memory elements.

The decoding of a selected page of local bit lines is similar to before where there is a first set P metal lines ($GBL_1, GBL_2, GBL_3, \ldots, GBL_P$) acting as global bit lines to access the selected page of local bit lines. Since the memory architecture has two word lines (even and odd) on each layer around the same page of local bit lines, there is a second set of 2×4 metal lines acting as global word lines. The metal lines are distributed on both side of the first set, with a left flank of 4 metal lines ($GWL_{11}, GWL_{21}, GWL_{31}$ and $GWL_{41}$) respectively for the odd word lines ($WL_{11}, WL_{21}, WL_{31}$ and $WL_{41}$) at each of the 4 layers. Similar, there is a right flank of 4 meal lines ($GWL_{10}, GWL_{20}, GWL_{30}$ and $GWL_{40}$) respectively for the even word lines ($WL_{10}, WL_{20}, WL_{30}$ and $WL_{40}$) at each of the 4 layers. The connections of the metal lines (global lines) to selected word lines and local bit lines are via the select devices Qxy controlled by the select line such as $SG_1$.

FIG. 29 illustrates a BEOL (top portion of the 3D memory) layout for the word lines and the R/W elements according to a first architecture for the 3D array shown in FIG. 28. In the first BEOL architecture, the global lines (include global word lines and global bit lines) are offset (~1F; F is the feature length) from each of the pillars of vertical local bit lines. A unit cell has dimension XF*YF. XF is limited by bitline pillar to bitline spacing (~4F). YF is limited by local WL to local WL to R/W material to BL pillar (~2.5F). These give a cell size of ~10F2 for each layer. When amortized over the multiple layers, the cell size is XF*XY/L_layer. However, when taking into account the space occupied by the WL drivers, the effective cell size=XF*XF/L_layer+2*XF*XF/P_b1, where L_layer=number of layers and P_b1 is the number bitline in a page of cells that are read or written in parallel. Therefore the percentage loss due to the WL drivers=2*L_layer/P_b1.

The block can be selected by enabling a bank of select devices via a common gate select line (e.g., SG1). Thus, the layout of the FEOL (base portion of the 3D memory) will have to accommodate P+2L metal lines plus a number of select devices equal to (P+2L)*(number of pair of word lines in each layer). Each select device is an active region on the base portion (or FEOL plane) of the 3D memory. Typically a select device is formed on the substrate with a poly gate over a pair of source and drain diffusion spots. For a bank of select devices, a common poly line enables control over the bank of select devices in parallel.

FIG. 30A illustrates a first embodiment of the FEOL layout of a unit block when the BEOL has the first architecture of FIG. 29. It will be understood that on either sides of a poly line, a plurality of select transistors exist (not shown explicitly), each with its source and drain coinciding with either a local bit line pillar or a contact. The select transistors are the select devices Qxy shown in FIG. 28. It can be seen that the select devices for the bit lines and word lines to the global lines is of size limited by the spacing between pillars along the y-direction. However, owing to two contacts adjacent a local bit line pillar being connected to the same global bit line, it does have the advantage of doubling the drive power by allowing two banks of select devices to be used in parallel. It therefore has a multiplier of M=2.

Figure 30B:
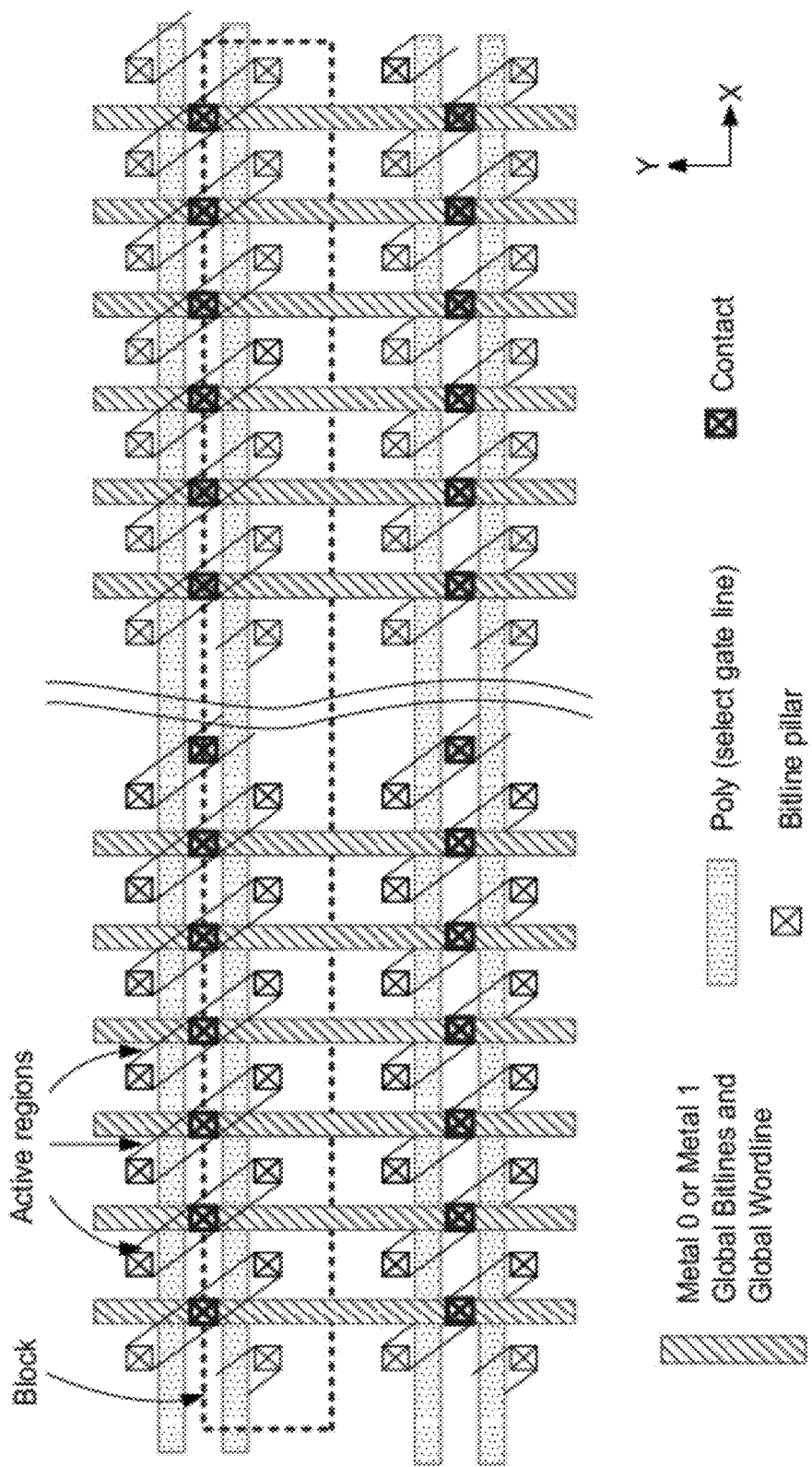
FIG. 30B illustrates a second embodiment of the FEOL layout of a unit block when the BEOL has the first architecture of FIG. 29.

FIG. 30B illustrates a second embodiment of the FEOL layout of a unit block when the BEOL has the first architecture of FIG. 29. By forming the active elements in a diagonal manner relative to the global lines, the length of the select devices can be increased by a factor of SQRT(2). However, the feature of doubling up two banks of select device is not available as the two contact points adjacent to a local bit line pillar are not connected to the same global line. It therefore only has a multiplier of M=1.

Figure 30C:
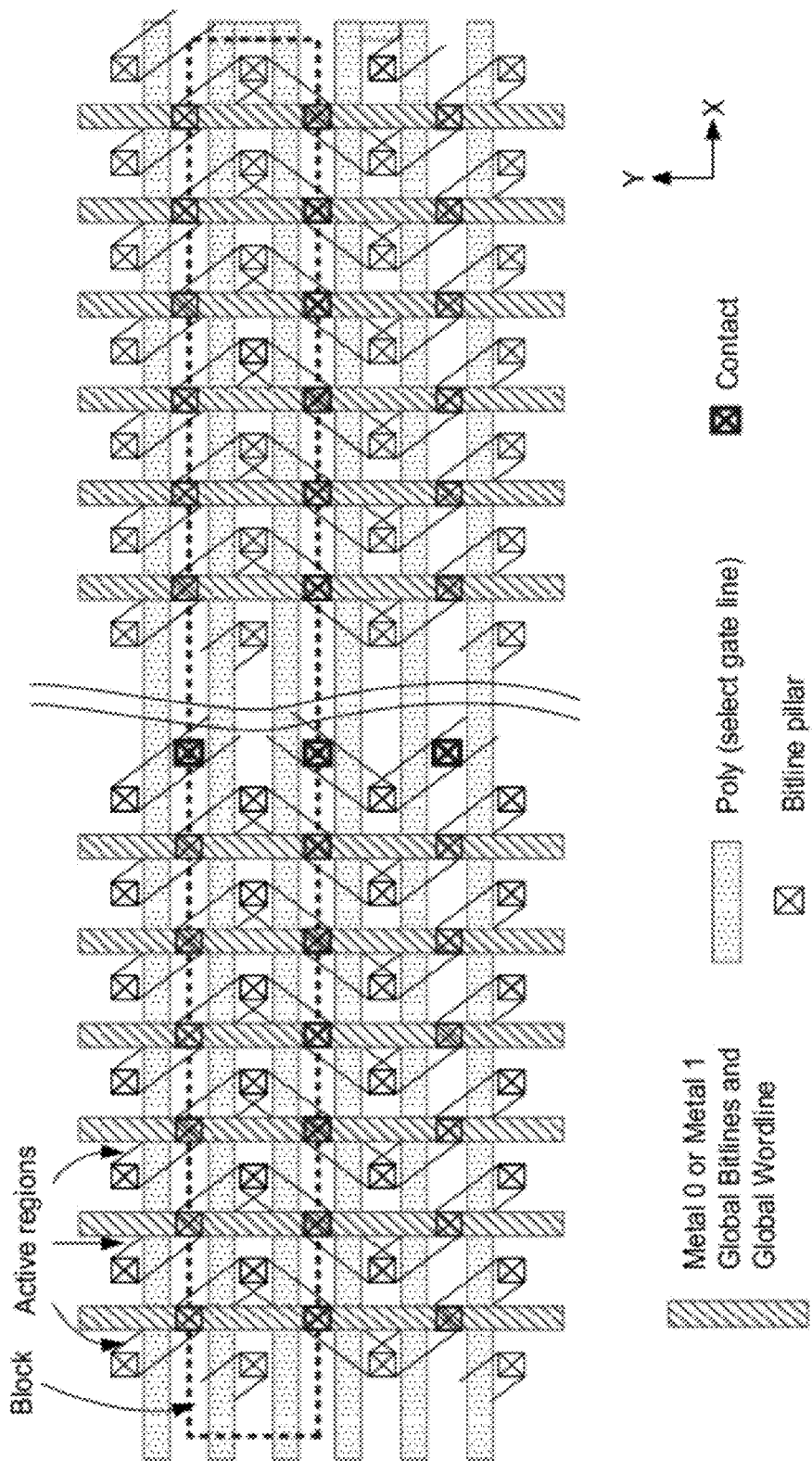
FIG. 30C illustrates a third embodiment of the FEOL layout of a unit block when the BEOL has the first architecture of FIG. 29.

FIG. 30C illustrates a third embodiment of the FEOL layout of a unit block when the BEOL has the first architecture of FIG. 29. The third embodiment serves to overcome the deficiency of reduced drive power with M=1 of the second embodiment. With the layout in FIG. 30C, the two contacts on either sides of a local bit line pillar are connected to the same global line. Thus, M again equals 2.

Figure 32:
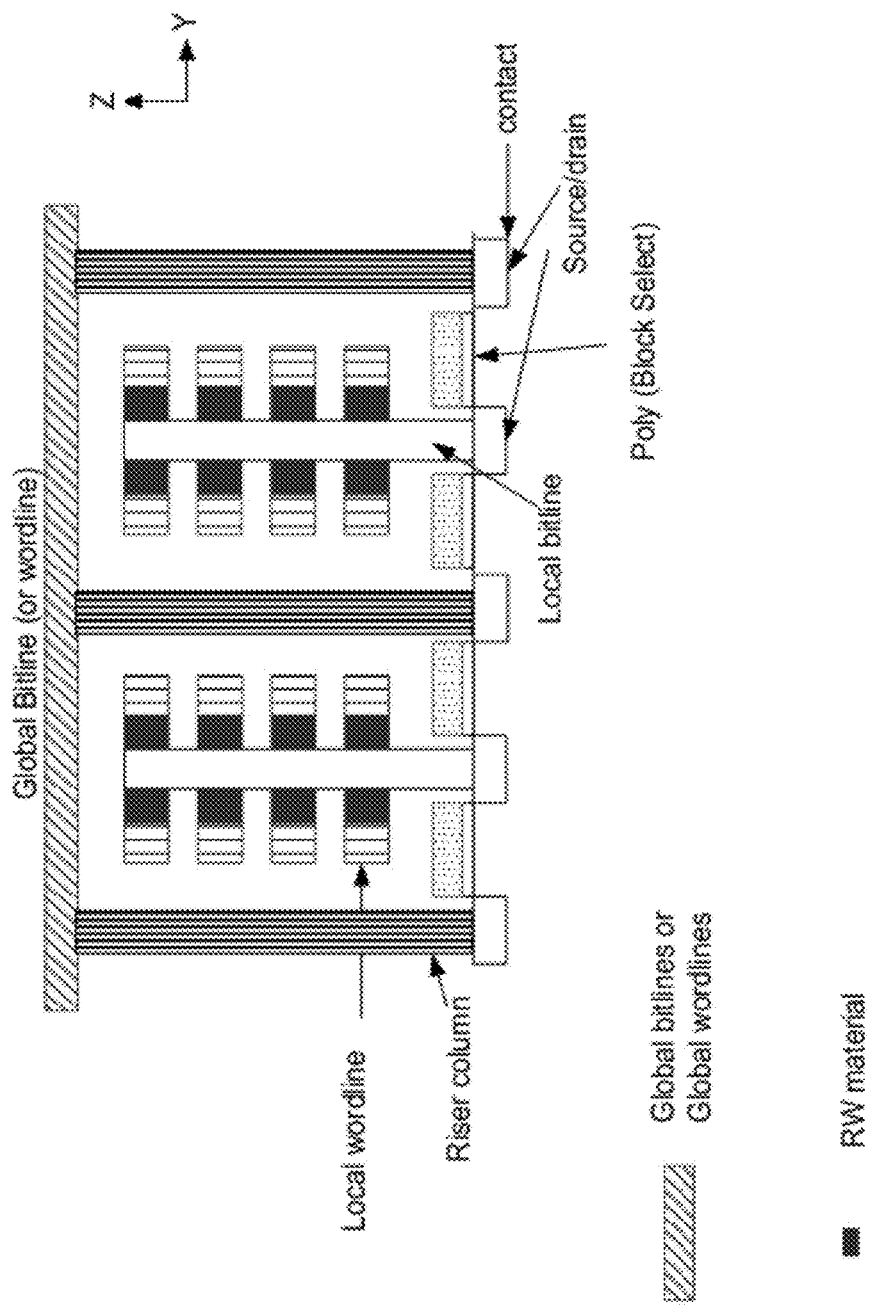
FIG. 32 illustrates a cross section of the BEOL layout of FIG. 31 in the y-z plane.

FIG. 31 illustrates a BEOL (top portion of the 3D memory) layout for the word lines and the R/W elements according to a second architecture for the 3D array shown in FIG. 28. In the second BEOL architecture, the global lines (include global word lines and global bit lines) are formed on the top part of the 3D memory. The global lines are aligned with the pillars of vertical local bit lines. A unit cell has dimension XF*YF. XF is limited by bitline pillar to bitline spacing (~2F). YF is limited by local WL to local WL to R/W material to BL pillar and also additional space for a contact (~3.5F). These give a cell size of ~7F2 for each layer. Each bit line pillar make contact with a global line FIG. 32 illustrates a cross section of the BEOL layout of FIG. 31 in the y-z plane. Essentially, a local bit line or word line sits on one terminal of a select transistor and makes a connection via the select transistor and a riser column with one of the global lines on the top of the 3D memory.

Figure 33:
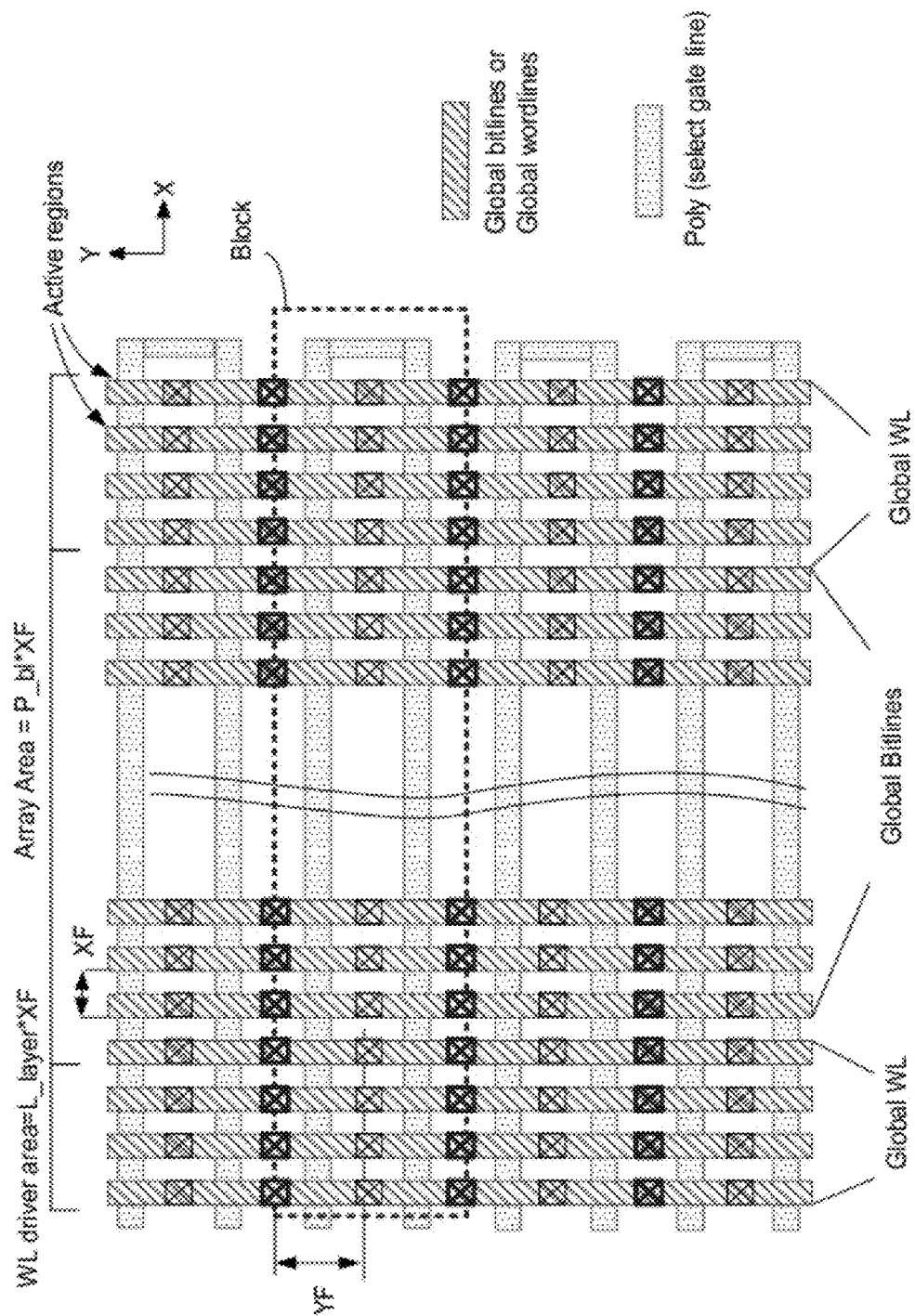
FIG. 33 illustrates a first embodiment of the FEOL layout of a unit block when the BEOL has the second architecture of FIG. 31.

FIG. 33 illustrates a first embodiment of the FEOL layout of a unit block when the BEOL has the second architecture of FIG. 31. There are two contacts on either sides of a local bit line pillar and they are connected to the same global line. Thus, M again equals 2.

The first embodiment of the second architecture shown in FIG. 33 is similar to the first embodiment of the first architecture shown in FIG. 30A. In the same manner, the second and third embodiments of the first architecture shown respectively in FIG. 30B and FIG. 30C can readily be adapted to the second architecture.

Figure 34:
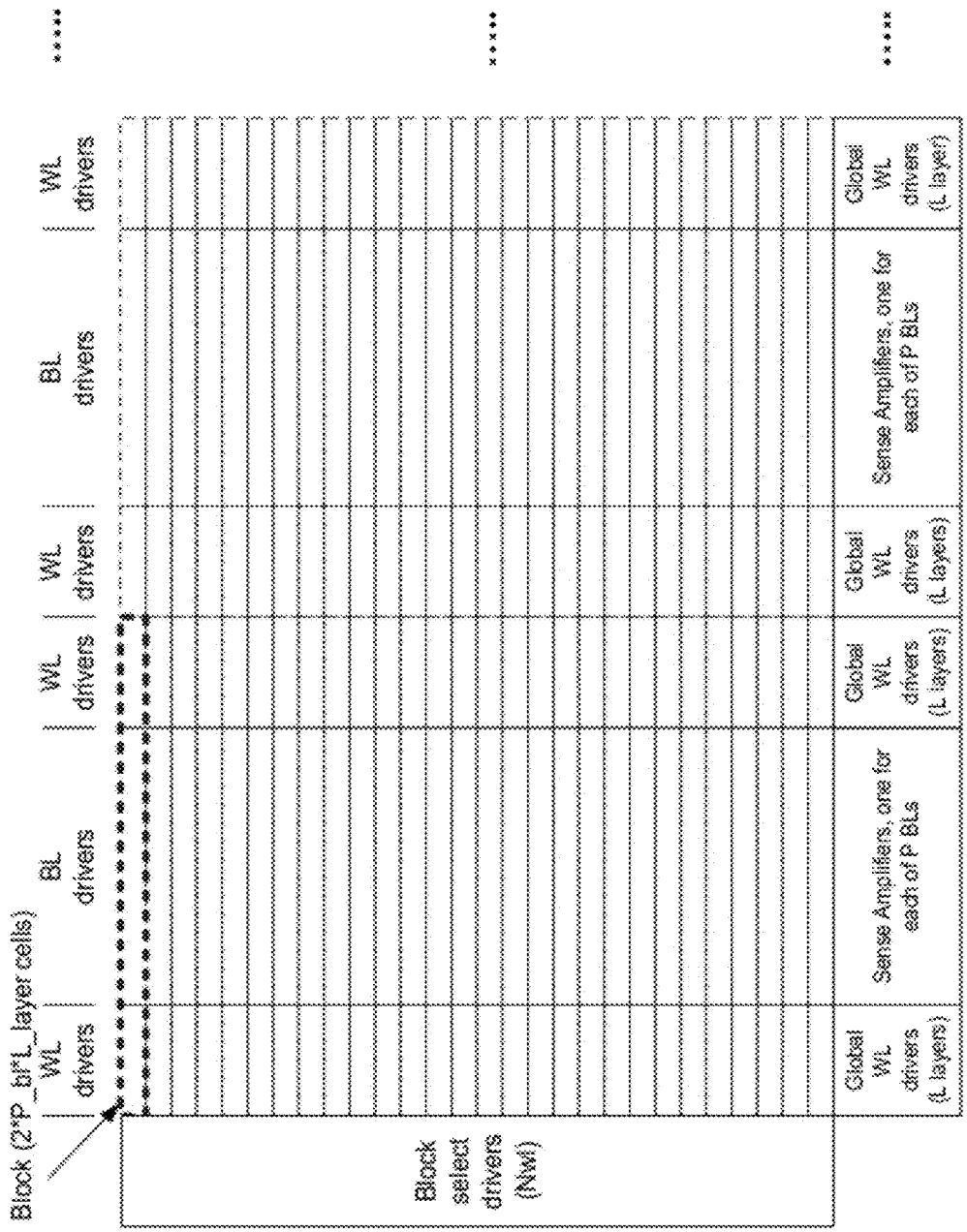
FIG. 34 illustrates a schematic top view of the entire 3D array including peripheral circuits.

FIG. 34 illustrates a schematic top view of the entire 3D array including peripheral circuits. It will be seen that the present architecture of using global lines to decode both the local bit lines and word lines is highly scalable. The global wordline drivers, sense amplifiers and block select drivers can be on the same side or on alternate side of the array.

3D Array of Read/Write Elements with Low Current Structures

According to another aspect of the invention, a nonvolatile memory is provided with a 3D array of read/write (R/W) memory elements. Each R/W memory element can be set or reset to at least one of two resistive states. The reading of an R/W memory is by detecting a corresponding current resulting from one these resistive states. It is preferable to operate with low current and high resistive states. The resistance of these resistive states depends also on the dimension of the R/W elements. Since each R/W element is formed at a crossing between a word line and a bit line, the dimension is predetermined by the process technology. This aspect of the invention provides another degree of freedom to adjust the resistance of the R/W memory element. This is accomplished by providing an electrode in the form of a sheet with reduced cross-sectional contact in the circuit path from the word line to the bit line. This allows the R/W memory element to have a much increased resistance and therefore to operate with much reduced currents. The sheet electrode is formed with little increase in cell size.

According to one embodiment, the bit lines oriented in the vertical direction serve multiple layers of 2D arrays. Each layer is a 2D array of R/W elements with the word lines in the horizontal or lateral direction. Each R/W element is formed in a lateral direction between a word line and a bit line at a crossing through a pair of contacts. Furthermore, at least one of the contacts has a structure with preadjustable cross-sectional area so as to realize low current R/W elements.

In one preferred embodiment, one of the contacts is in the form of a sheet electrode connecting between the R/W element and a bit line. The sheet electrode has a preadjustable cross-sectional area substantially reduced from that of the R/W element if the latter were to intersect with the bit line directly.

In another preferred embodiment, the sheet electrode is itself a part of the R/W element. Its reduced cross-section allows the R/W element to operate with reduced current.

Operating a 3D memory array of low current R/W elements has the advantage of saving power and reducing any potential differentials along a word line due to its finite resistance. Maintaining a more uniform voltage across a word line helps to reduce leakage currents between the different R/W elements in the 3D array.

Figure 35:
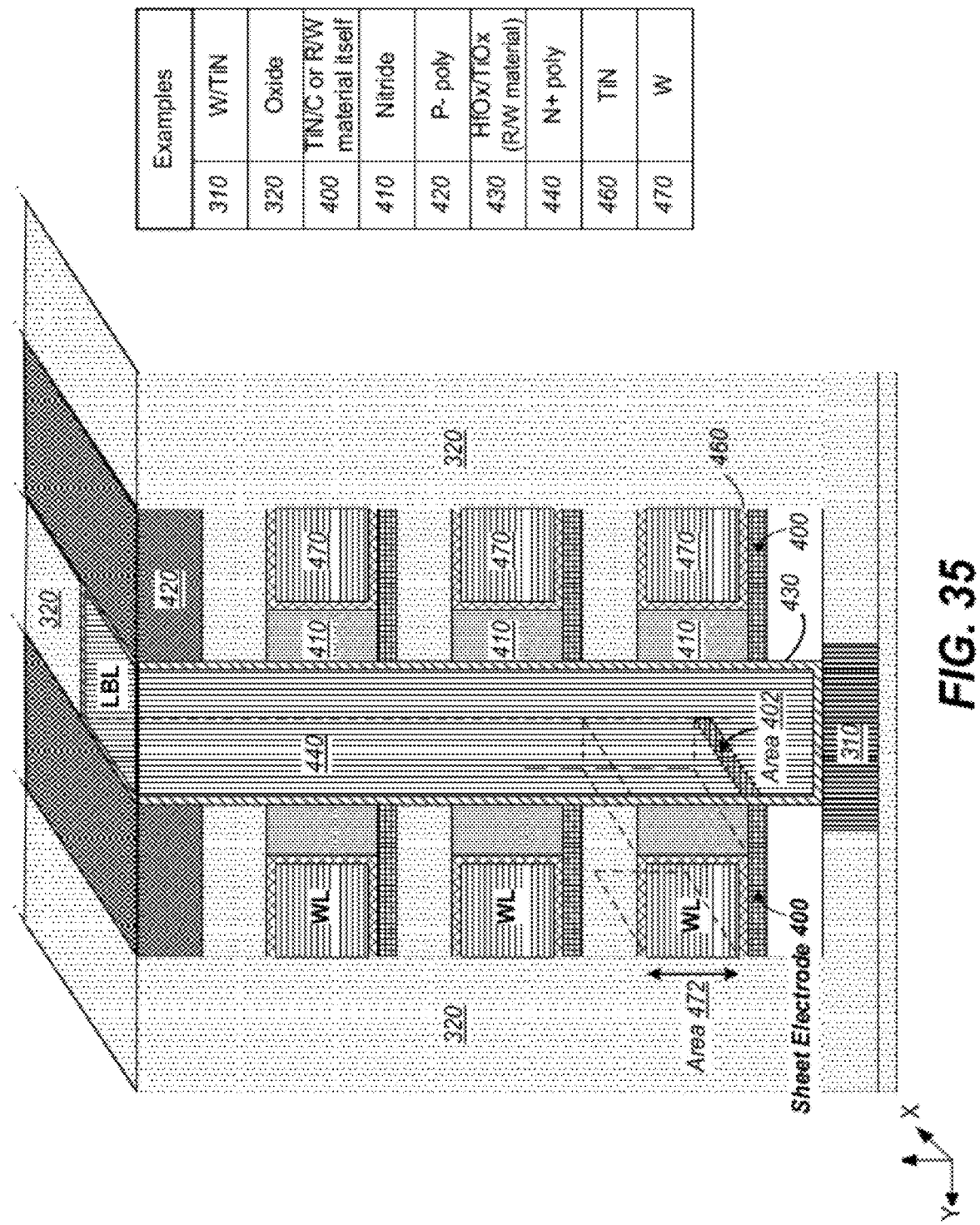
FIG. 35 illustrates a preferred 3D memory structure with vertical local bit lines and horizontally formed active R/W memory elements.

FIG. 35 illustrates a preferred 3D memory structure with vertical local bit lines and horizontally formed active R/W memory elements. The 3D memory structure is defined with respect to an x-y-z coordinate system. The local bit lines such as LBL 440 are in the z-direction, the word lines such as WL 470 are in the x-direction.

The 3D structure can be regarded as comprising two portions. A base portion, commonly referred to as FEOL ("Front End Of (Manufacturing) Line"), is supported by a semiconductor substrate on which active elements may be formed (not shown, but see for example, FIGS. 1, 7, 23 and 27).

FIG. 35 shows a second portion above the base portion that is referred to as BEOL ("Back End Of (Manufacturing) Line"). BEOL is where the multiple layers of R/W material, word lines and vertical local bit lines are formed. The local bit lines such as LBL 440 are connected to the structures in the FEOL portion via respective contact pads 310. Along the z-direction, a stack of memory element layers is formed. At each layer each row of local bit lines 440 is surrounded by a pair of word lines WL 470.

The bit line 440 is preferably formed from N+ polysilicon. In a preferred embodiment, the resistive R/W memory element is formed by an HfOx layer 430. Preferably, a layer 460 of TiN is also formed on the word line 470 to act as a barrier layer for the word line. The HfOx layer 430 is deposited on the side of the bit line 440.

R/W materials that can be used on RRAM devices such as the 3D memory of the present invention have also been described earlier in connection with FIG. 6. In general, the device is a capacitor like structure with the switching material between first and second electrodes (conductors). The first electrode which acts as an anode includes one of the following: Al (reactive), Pt, Pd, Au, Ag, TiN, TaN, TaCN, Ti(reactive)/TiN, Ni, C, Co. The second electrode which acts as a cathode includes one of the following: Pt, Pd, Au, Ag, Cu, TiN, TaN, TaCN, W, n+Si.

The switching materials fall mainly into one of two categories. The first category is Complex Oxides having a structure of Me doped oxides where Me:Me1Me2 . . . Ox. Examples are: PCMO (PrCaMnO), LCMO (LaCaMnO), LaSrGaMg(Co)O, (CeO2)x(GdO0.5)y, Cu:MoOx/GdOx, Nb:STO (Nb:SrTiO), . . . , Cu:ZrOx, . . . , Y(Sc)SZ (Yt(Sc) Stabilized ZrOx), doped Y(Sc)SZ: YTiZrO, YZrON, . . . .

The second category is Binary oxides having a structure TMOs (Transition Metal Oxides) having a structure of single layers or dual layers: Me1Ox/Me2Ox . . . . Examples are: WOx, HfOx, ZrOx, TiOx, NiOx, AlOx, AlOxNy, . . . , ZrOx/ HfOx, AlOx/TiOx, TiO2/TiOx, . . . , GeOx/HfOxNy, . . . .

In previous embodiments, the R/W element circuit is formed by having the R/W element adjacent to both the bit line and the word line to form part of a circuit so that the TiN layer 460 has one side contacting the word line and the other side contacting the HfOx layer 430 on the bit line. However, this will entail any current path through the circuit to have a contact area 472 defined by intersecting the word line with the bit line at their crossing. This contact area 472 can not be altered without changing the dimensions of the word line and bit line themselves.

The present structure essentially has more of an offset between the word line and the bit line at their crossing. This creates a gap between the TiN layer 460 and the HFOx layer 430. An additional electrode 400, in the form of a sheet electrode, is furnished to provide the connection between the word line 470 (cladded by a TiN layer 460 to reduce metal interaction with outside) and the HFOx/TiOx layer 430 which constitutes the R/W material. Preferably, the additional electrode 400 serves as the anode electrode of the R/W element as described above.

The sheet electrode 400 has two broadside surfaces and four edgeside surfaces. The thickness of the sheet electrode 400 can be adjusted to obtain a pre-specified cross-sectional area 402 for one of the edgeside surfaces. The sheet electrode 400 is connected in series in the inline circuit including the R/W element between a word line and a bit line pillar at each crossing. The sheet electrode 400 is connected at a first terminal where electric current flows through a broadside surface and at a second terminal where electric current flows through an edge side surface. In this way, by controlling its thickness, the dimensions of the sheet electrode can be adjusted to have a cross-sectional area 402 for electric current to flow independent of the dimensions of the word line and bit line which are normally fixed by a particular semiconducting processing. For example, this cross-sectional area can be adjusted to be substantially smaller than that of area 472 that would have been the cross-sectional area in previous embodiments, thereby providing an independent parameter for controlling the current flow through the circuit.

The space between the offset is filled with an insulator 410 such as a nitride. In one embodiment, the sheet electrode 400 is formed with its plane or one of its broadside surfaces in contact with the TiN layer 460 adjacent the word line 470 and one of its edgeside surfaces with cross-sectional area 406 in contact with the R/W material layer 430 adjacent the bit line pillar 440. As described earlier, while previous structures have the contact cross-sectional area 472, the edgeside surface of the sheet electrode now has substantially smaller contact cross-sectional area 402.

In one embodiment, the addition electrode 400 is constituted from a conductive material such as metal or TiN or carbon.

In an alternative embodiment, the addition electrode 400 is itself the R/W element constituting from metal oxides such as HfOx or TiOx. In that case, the R/W material cladding 430 on the local bit line pillar 440 is optional.

The embodiment described is for the broadside of the additional sheet electrode 400 to be formed adjacent a surface of the word line in the x-y plane (together with any intervening layer such as layer 460. While the word line is offset from the bit line pillar, the sheet electrode has its edgeside surface adjacent the bit line pillar to complete the electric circuit from the word line to the bit line.

The point is to introduce a controllable cross-sectional area for controlling the current in the electric circuit between the word line and the bit line. Thus, other embodiments where the sheet electrode is also disposed in series in the electric circuit but with its broadside coupled to the bit line pillar and its edgeside coupled to the word line are also contemplated.

Thus, for the 3D memory, various memory layers (3 are shown) of R/W elements are formed about each vertical local bit line 330 along the x-direction so that they are coupled on one side to respective bit lines 440 via a sheet electrode 400 and on the other side to respective word lines WL 470. Similar R/W elements and word lines are formed on the opposite side of each bit line along the x-direction.

Other volumes of the BEOL portion are filled by a dielectric such as an oxide 320. In this way a 3D R/W array is formed similar to that illustrated schematically in FIG. 19.

Figure 36A:
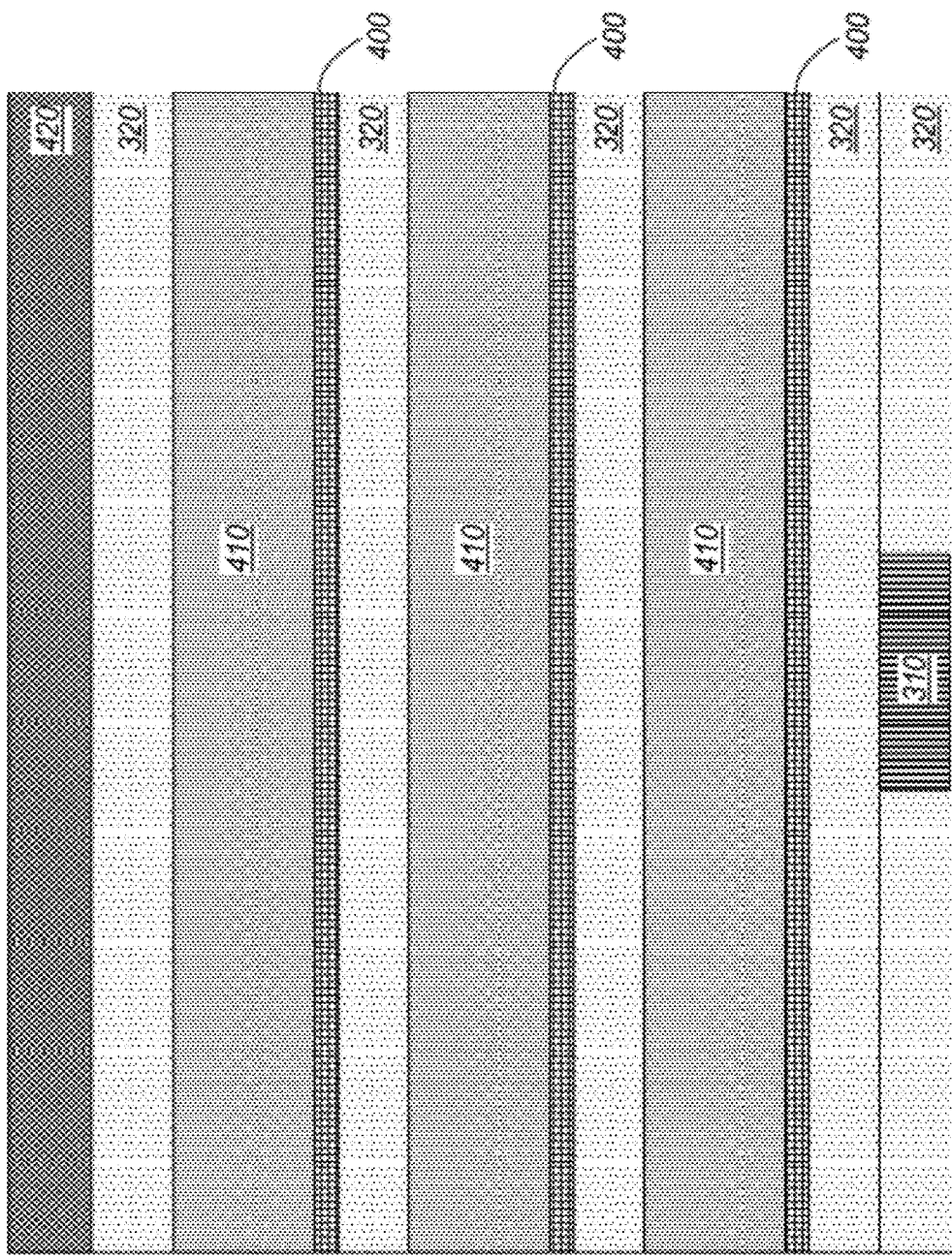
FIG. 36A illustrates the formation of the BEOL portion as a multi-layer structure being formed on top of the FEOL base layer (not shown).
Figure 36B:
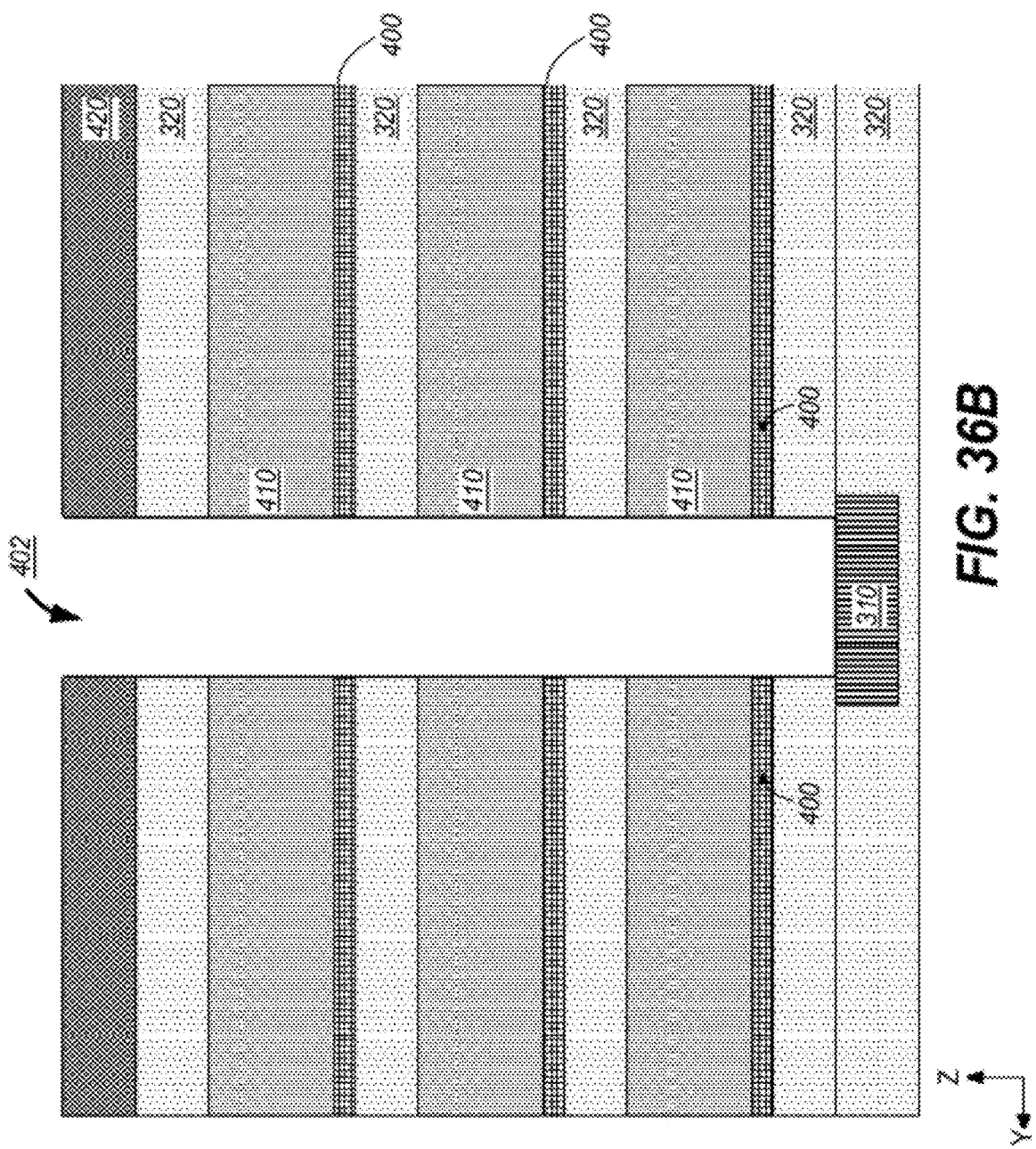
FIG. 36B illustrates the formation of trenches 402 where the plurality of local bit lines are to be formed in the 3D structure of FIG. 35.
Figure 36C:
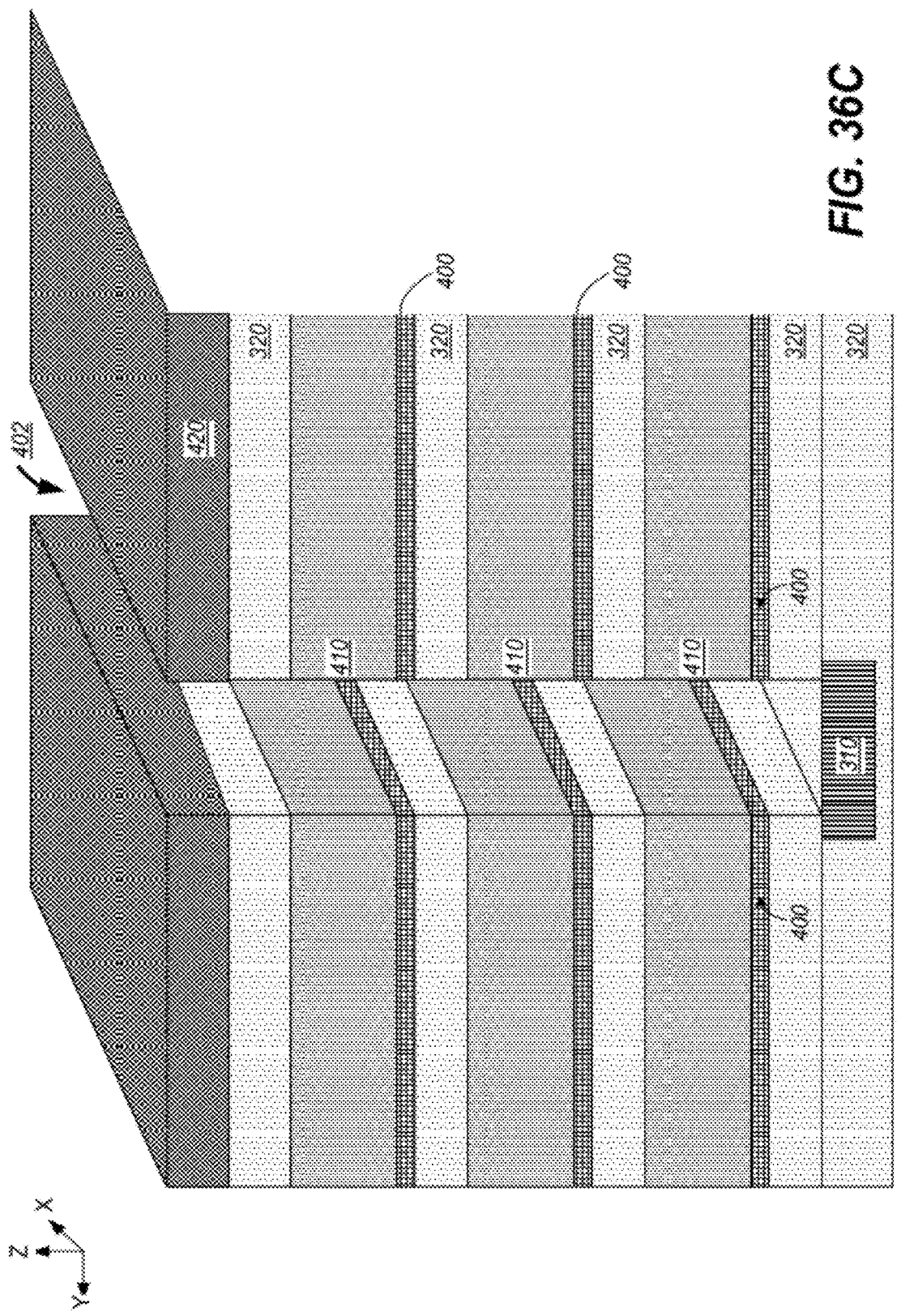
FIG. 36C is a perspective view of the structure shown in FIG. 36B in which trenches 402 are cut along the x-direction where a row of bit lines will eventually be formed.

FIGS. 36A-36C illustrate the formation of the BEOL (top) portion of 3D memory shown in FIG. 35 at various processing stages.

FIG. 36A illustrates the formation of the BEOL portion as a multi-layer structure being formed on top of the FEOL base layer (not shown). A gross structure is formed as a sandwich of multiple alternate layers of sheet electrode layer 400, sacrificial material layer 410 and an oxide layer 320.

A metal pad of preferably W or TiN is formed on a first base layer of oxide 320 for connection to a local bit line column to be formed. The layer of oxide is then planarized to be flushed with that of the metal pads. A second base layer of oxide 320 is then deposited. This is followed by successively depositing a triplet of layers comprising the sheet electrode layer 400, the sacrificial material layer 410 and the oxide layer 320. This triple layer will eventually constitute one layer of memory structure. In general, there will one such triplet for every layer of memory structure the 3D memory will have. The sandwich is capped by a protective layer 420.

In one preferred embodiment, the sheet electrode layer 400 is a deposit of TiN or alternatively WN, TaN, TaCN, Al, W, or carbon. The sacrificial layer 410 is a deposit of nitride as it can easily be etched away and replaced by other structures. The protective layer 420 is P− poly or alternatively, hard-mask or advanced-patterning layers such as carbon.

FIG. 36B illustrates the formation of trenches 402 where the plurality of local bit lines are to be formed in the 3D structure of FIG. 35. Essentially a hard mask ("HM") deposition and lithography is set up so that vertical trenches running along the x-direction in the 3D structure can then be etched away to form the trenches where the local bit lines are to be formed. The trenches are lined up with contact pads in the x-direction so that local bit lines will be formed to make contacts with the contact pads.

FIG. 36C is a perspective view of the structure shown in FIG. 36B in which trenches 402 are cut along the x-direction where a row of bit lines will eventually be formed. The space in between the bit lines will be filled with oxide. Thus, along the trench is alternately filled with bit line and oxide columns. There are two ways to achieve this structure, namely a trench process and a damascene process. In the trench process, the trench is first filled with the bulk of bit line material and then spaces are cut in between and filled with oxide. In the Damascene process, the trench is first filled with oxide and the spaces are opened up in between and filled with bit lines.

FIGS. 37A-37I illustrate the formation of the local bit line structures in the trenches of FIG. 36C using the trench process.

Figure 37A:
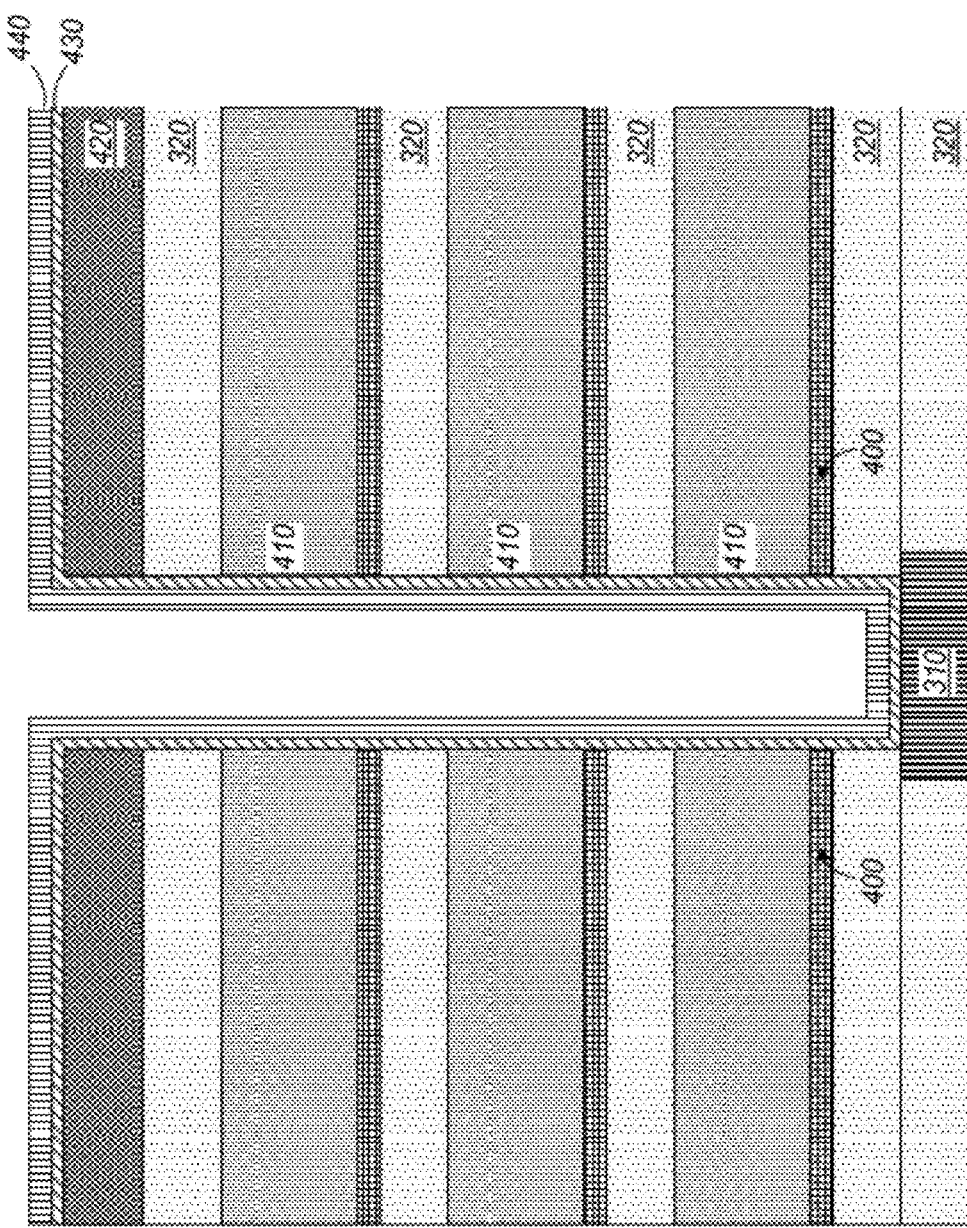
FIG. 37A illustrates the trench process where an extended bit line structure first fills the trench and then spaces are excavated from the filled trench to create the spaced apart, individual bit lines.

FIG. 37A illustrates the trench process where an extended bit line structure first fills the trench and then spaces are excavated from the filled trench to create the spaced apart, individual bit lines. The excavations will eventually be refilled with oxide.

A first layer of R/W material 430 such as HfOx or TiOx is deposited by ALD (atomic layer deposition). This is followed by a protective layer of N+ poly 440 by LPCVD.

Figure 37B:
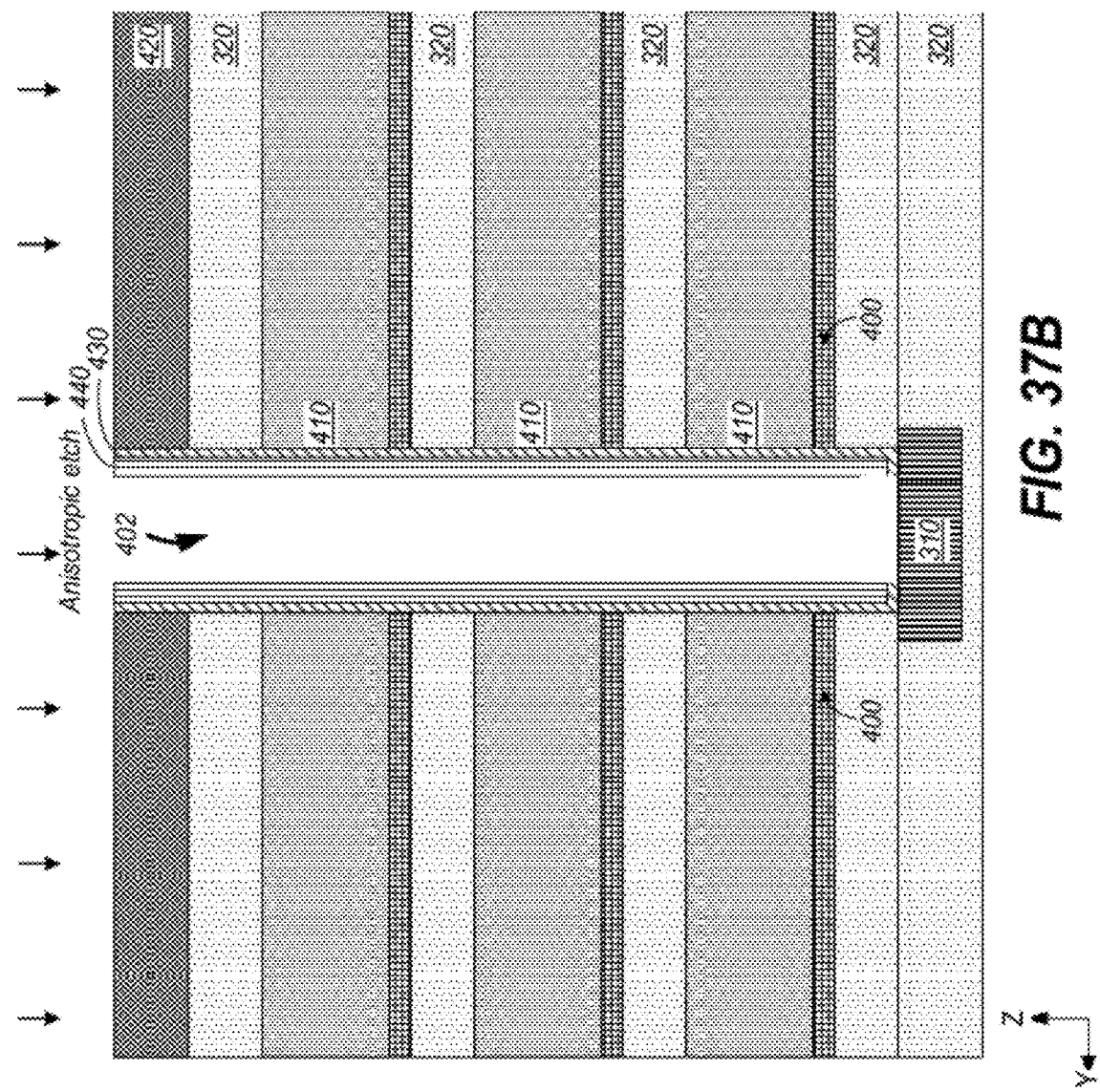
FIG. 37B illustrates that the bottom surface of the trench/excavation is etched away to expose the metal pad 310.

FIG. 37B illustrates that the bottom surface of the trench/excavation is etched away to expose the metal pad 310. This is accomplished by an anisotropic etch through the openings of trenches 402.

Figure 37C:
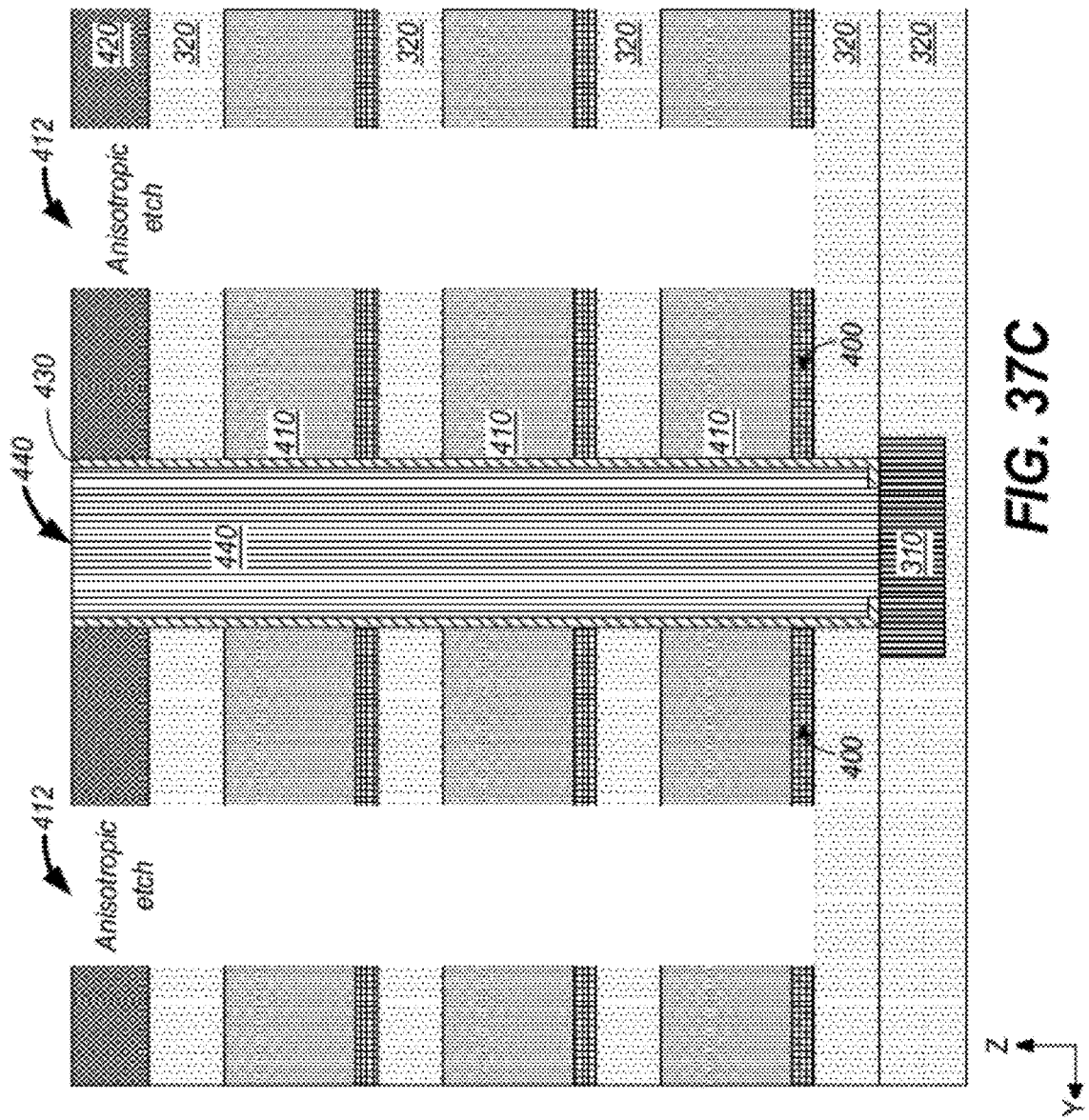
FIG. 37C illustrates the formation of the bulk bit line structures in the trenches followed by opening portals on either side of each bit line structure.

FIG. 37C illustrates the formation of the bulk bit line structures in the trenches followed by opening portals on either side of each bit line structure. After HM removal, a BOE ("buffered oxide etch) helps to clean the structure exposing the P− poly layer 420 as a top layer. The local bit lines 440 are then formed (in the form of a slab along the x-direction) by filling the trenches with N+ poly using LPCVD. The N+ poly is then planarized.

After the bit line structures are formed, portals 412 are opened on both sides of the bit line structures to access the stratified 3D structure laterally. This allows the structures in each layer, such as R/W elements and word lines, to be formed for all layers in parallel. The formation of the stratified 3D structure is accomplished by an anisotropic etch RIE (reactive ion etching) through the portals 412.

Figure 37D:
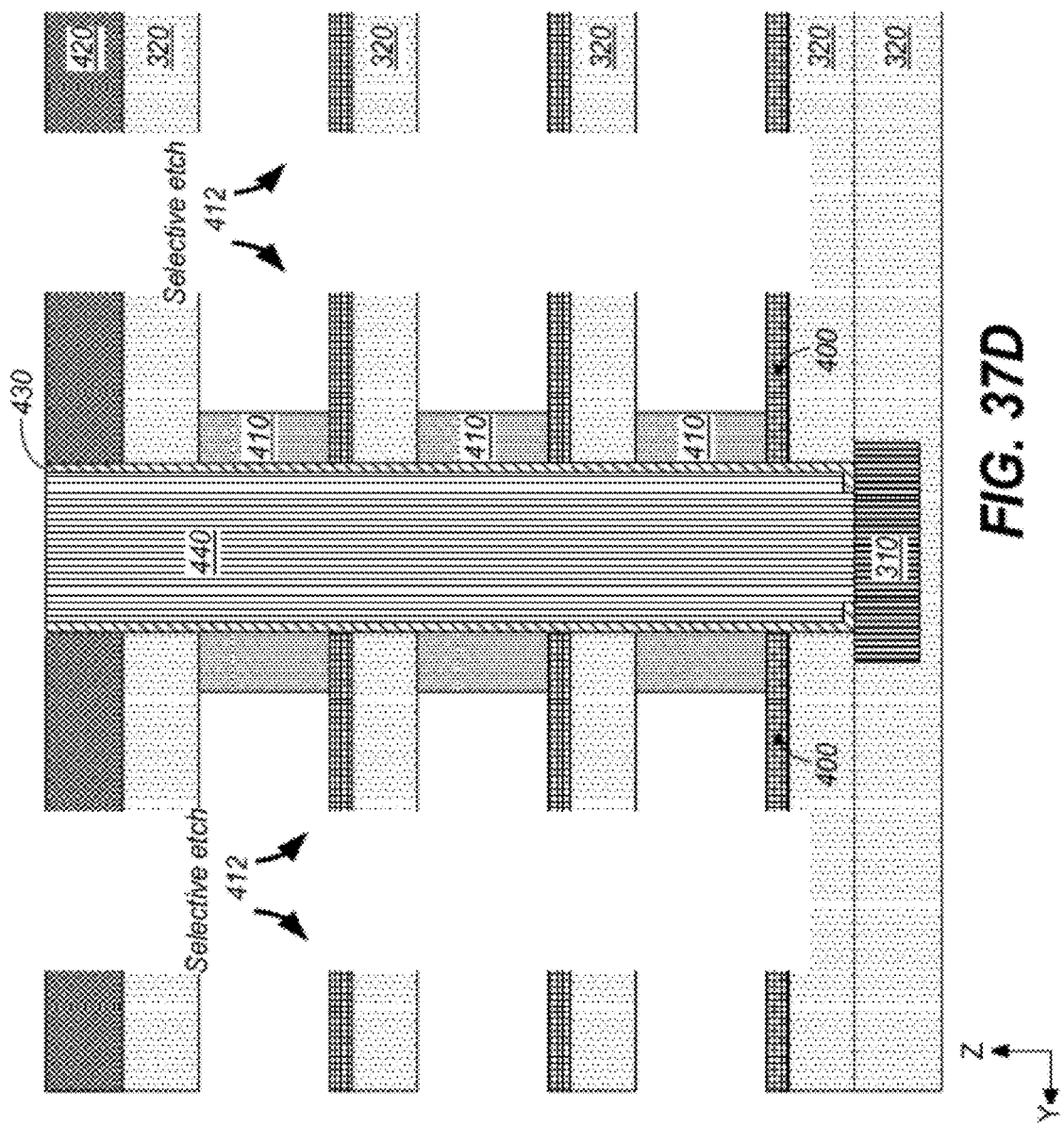
FIG. 37D illustrates the formation of recessed spaces for forming the word line structures in each layer.

FIG. 37D illustrates the formation of recessed spaces for forming the word line structures in each layer. The recessed spaces for all layers are created in parallel. This is accomplished by a selective etch through the portals 412 where the sacrificial nitride layer 410 are recessed toward the bit line 440.

Figure 37E:
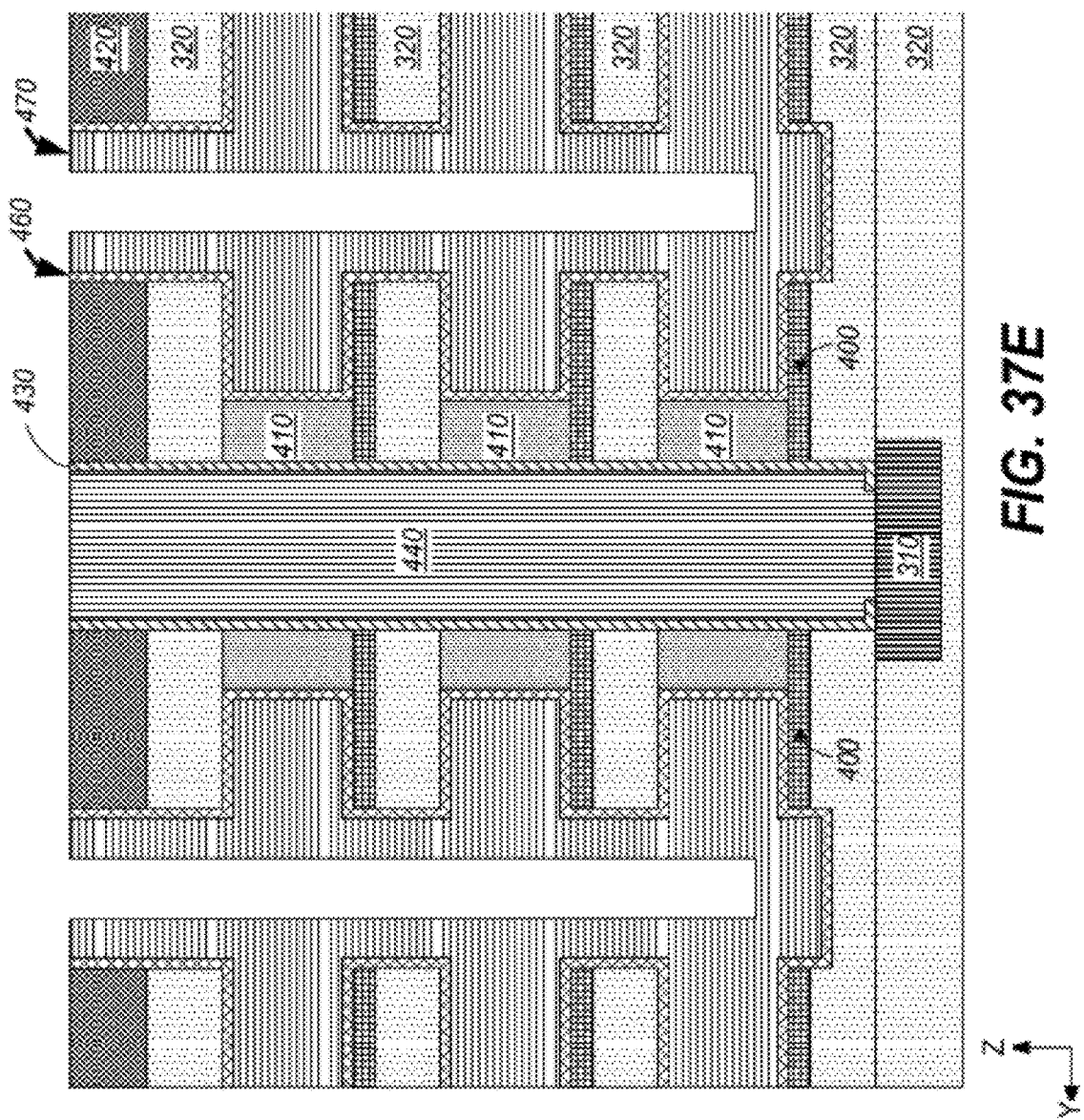
FIG. 37E illustrates the formation of the R/W layer followed by the word line for each of the recessed spaces.

FIG. 37E illustrates the formation of the R/W layer followed by the word line for each of the recessed spaces. The recessed space is first BOE (Buffered Oxide Etched) etched. Then the layer 460 is deposited using ALD (atomic layer deposition).

Next, the word lines can be formed by filling the recessed spaces with a layer 470 of, for example, titanium W. This is accomplished by CVD or ALD. In general, the metallization is optimized for its conductivity within the constraint of the expected process temperature. For example, aluminum or copper could also be deposited. In other embodiments, high-temperature metals can also be contemplated such as a thin layer of TiN followed by a bulk layer of W (tungsten) by Chemical Vapor Deposition.

Figure 37F:
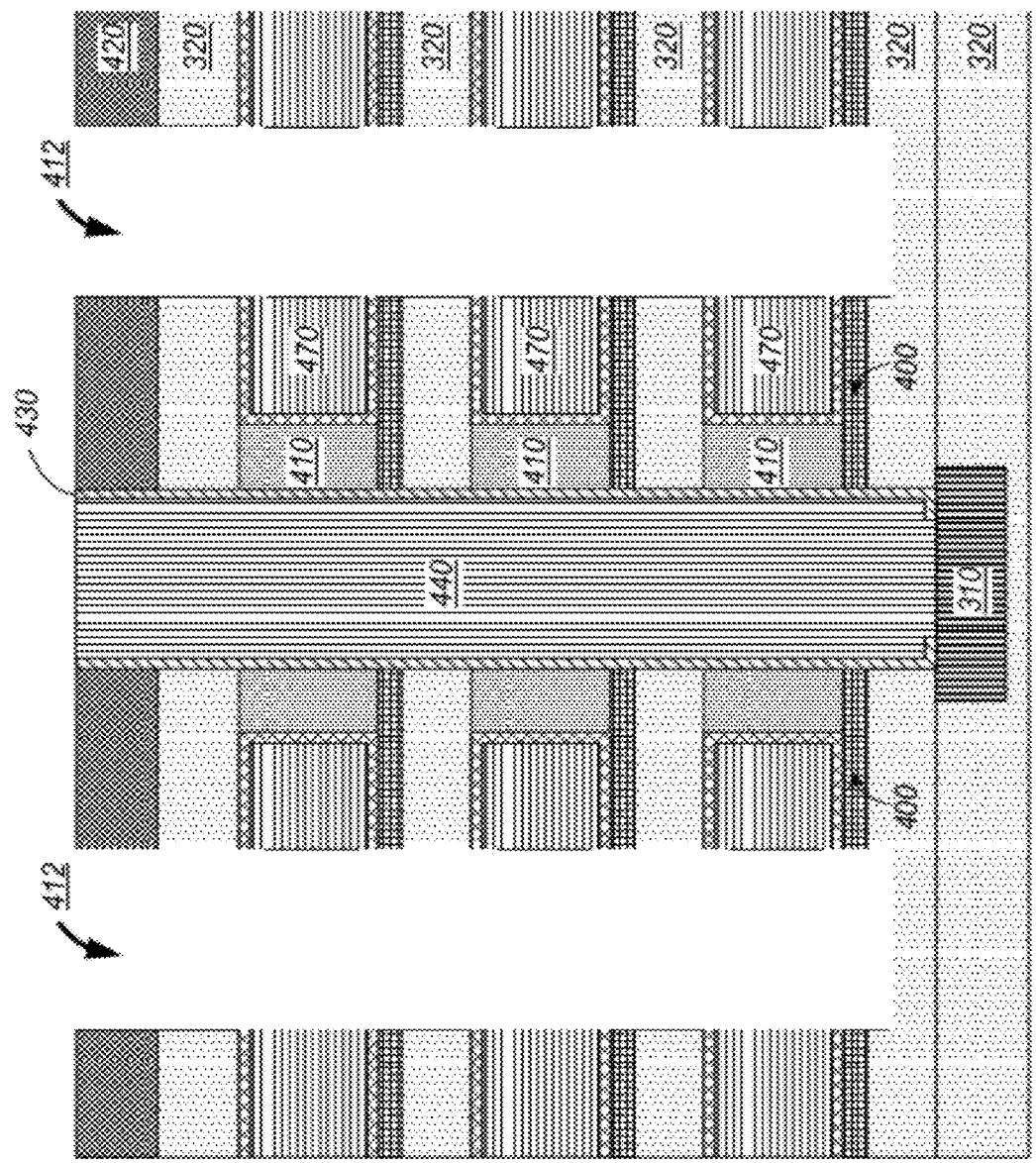
FIG. 37F illustrates that the excesses from the various depositions in FIG. 37E can be etched back.

FIG. 37F illustrates that the excesses from the various depositions in FIG. 37E can be etched back. For example, the layer 470 of W can be etched back with an anisotropic etch. The layer 460 can be etched back with an isotropic etch.

Figure 37G:
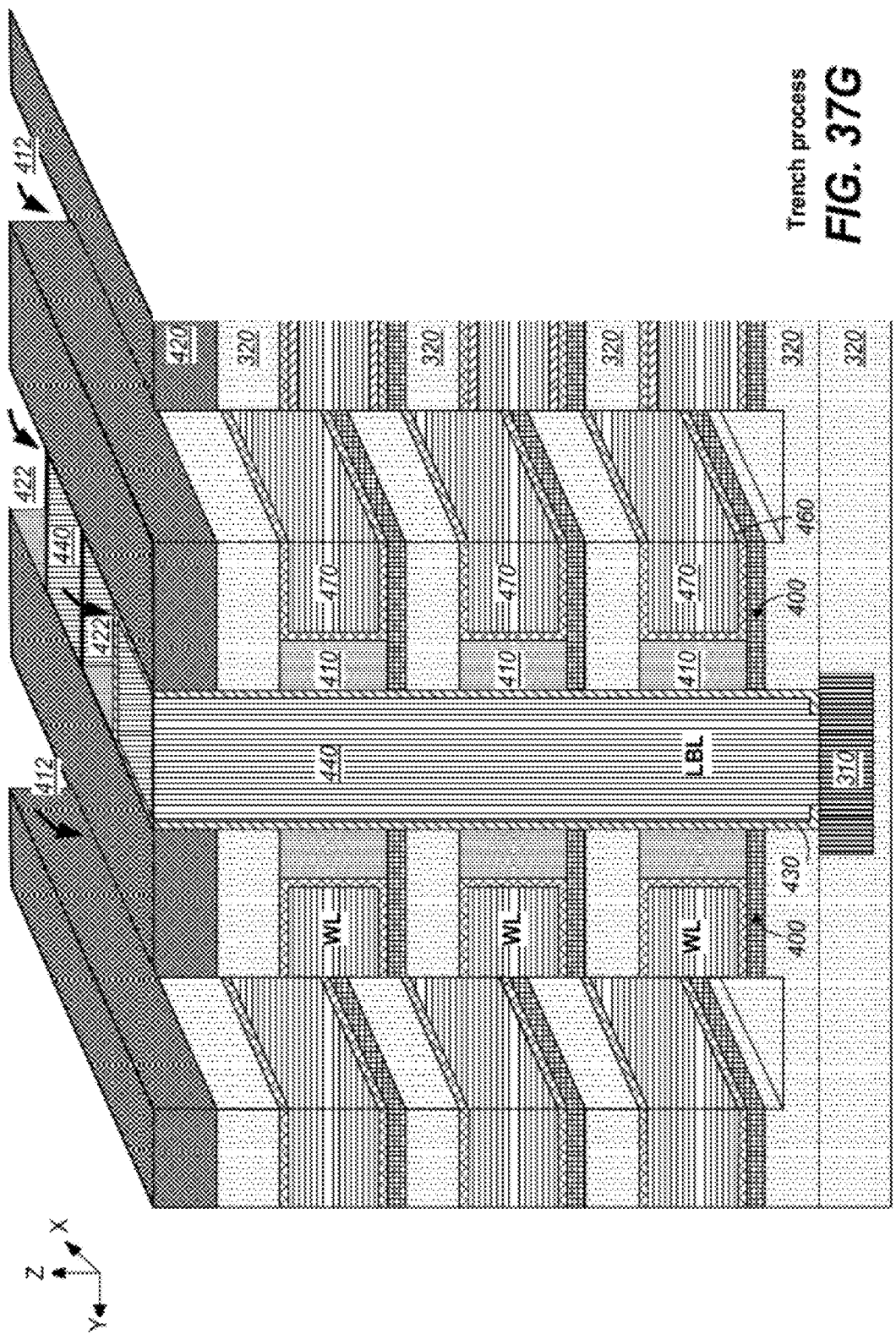
FIG. 37G illustrates the formation of the individual local bit line columns in the trench process by first removing portions 422 of the local bit line slab along the x-direction.

FIG. 37G illustrates the formation of the individual local bit line columns in the trench process by first removing portions 422 of the local bit line slab along the x-direction. This is accomplished by RIE after the portals 412 have been filled with oxide and planarized by CMP.

Figure 37H:
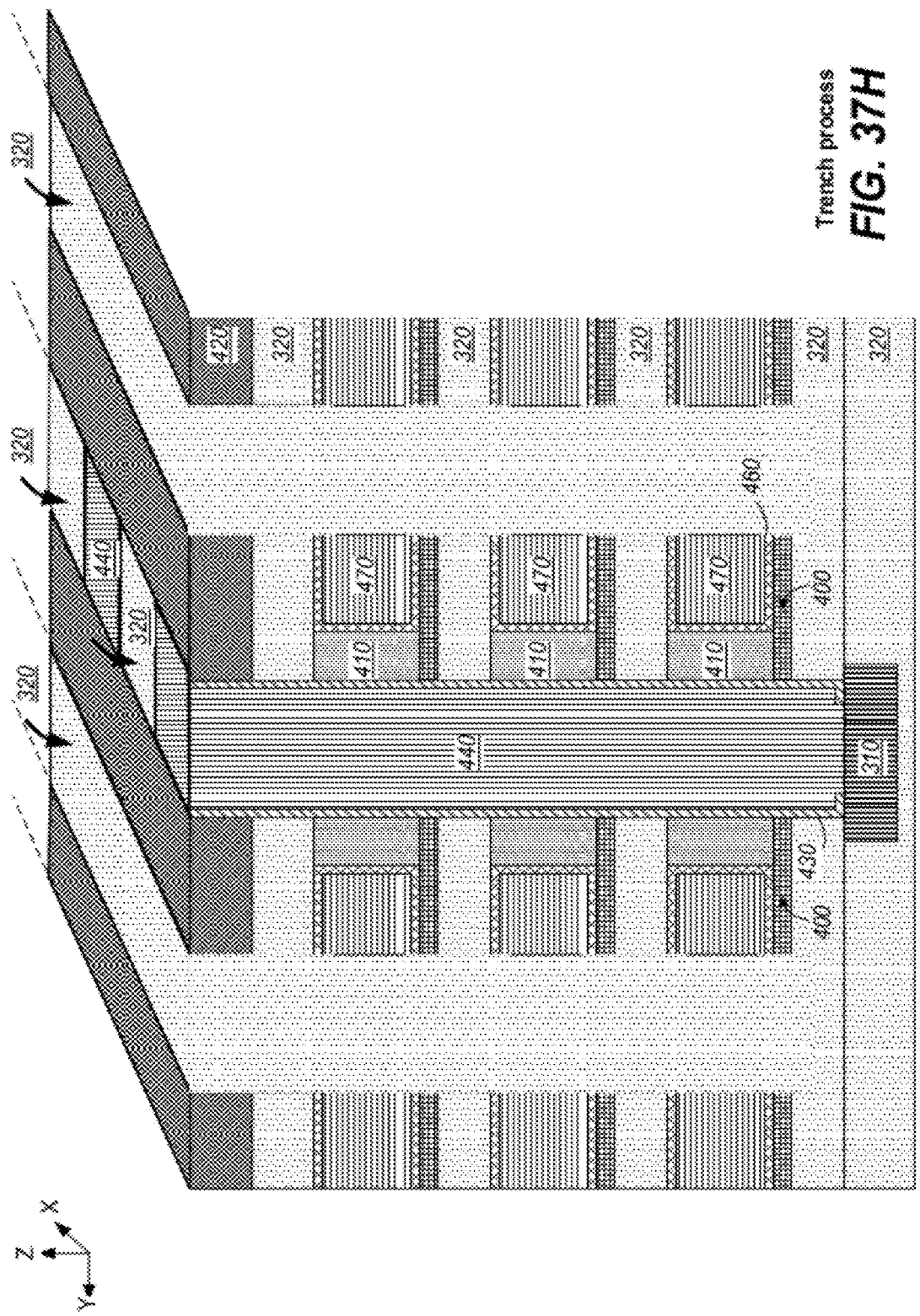
FIG. 37H illustrates that resulting voids in the portions 422 and 412 of FIG. 37G have been filled with oxide 320.

FIG. 37H illustrates that resulting voids in the portions 422 and 412 of FIG. 37G have been filled with oxide 320. The top surface is planarized by chemical and mechanical polishing.

FIG. 37I illustrates a cross-sectional view along the x-direction of the 3D memory with sheet electrodes that has been fabricated by the trench process.

FIGS. 38A-38D illustrate the formation of the local bit line structures in the trenches of FIG. 36C using the damascene process.

FIG. 38A illustrates the damascene process where the trench shown in FIG. 36C is first filled with oxide 320.

Figure 38B:
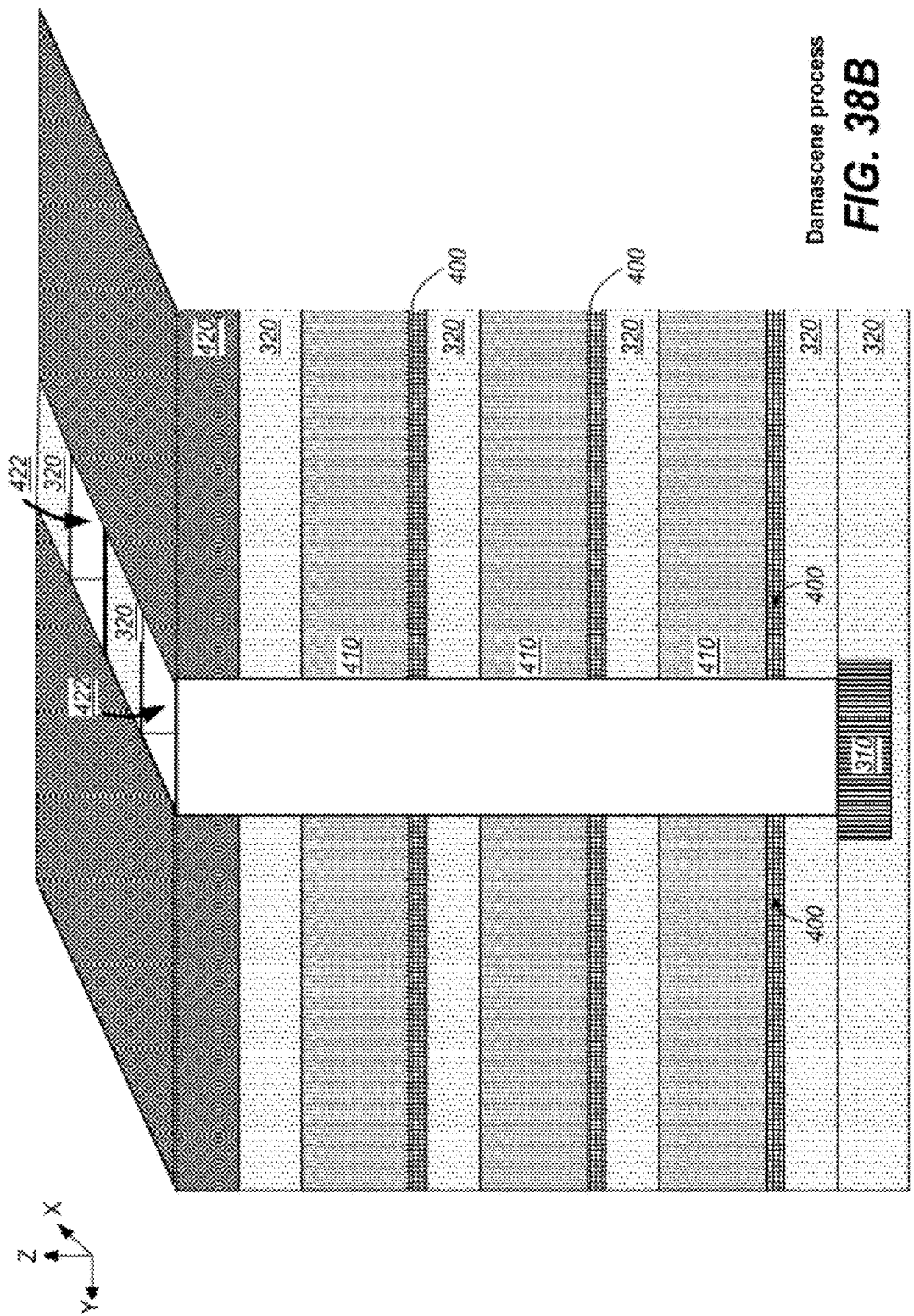
FIG. 38B illustrates that spaces 422 for each vertical bit lines are excavated from the oxide filled trench.

FIG. 38B illustrates that spaces 422 for each vertical bit lines are excavated from the oxide filled trench.

Figure 38C:
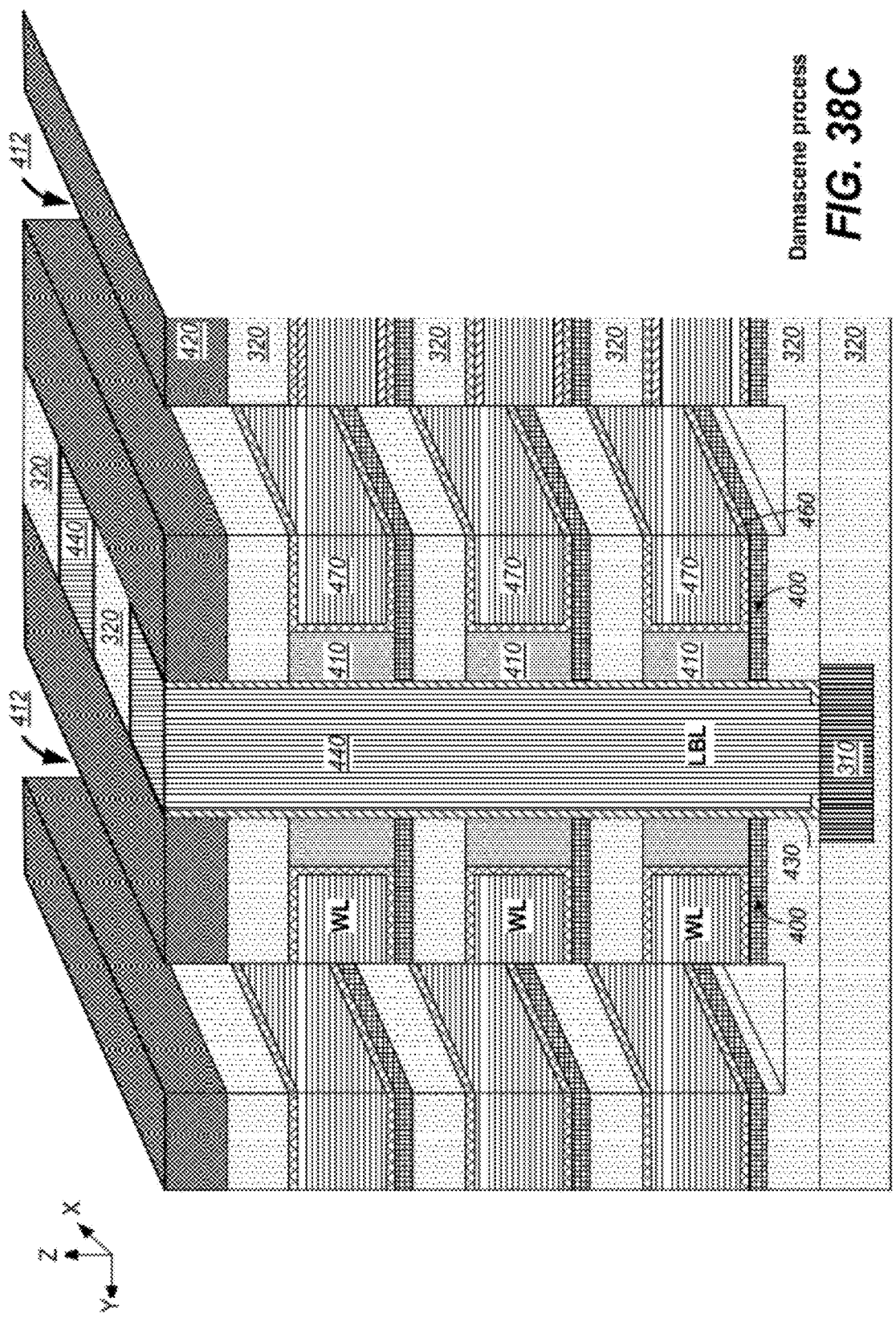
FIG. 38C illustrates that similar to that of the processes shown in FIG. 37A to FIG. 37C, the R/W element 430 and the bit line 440 are formed within each of the excavated spaces 422 shown in FIG. 38B.

FIG. 38C illustrates that similar to that of the processes shown in FIG. 37A to FIG. 37C, the R/W element 430 and the bit line 440 are formed within each of the excavated spaces 422 shown in FIG. 38B.

This is followed by opening of the portals 412 similar to the process shown in FIG. 37C. Thereafter, the word lines are formed similar to the processes shown in FIG. 37D to FIG. 37F.

Figure 38D:
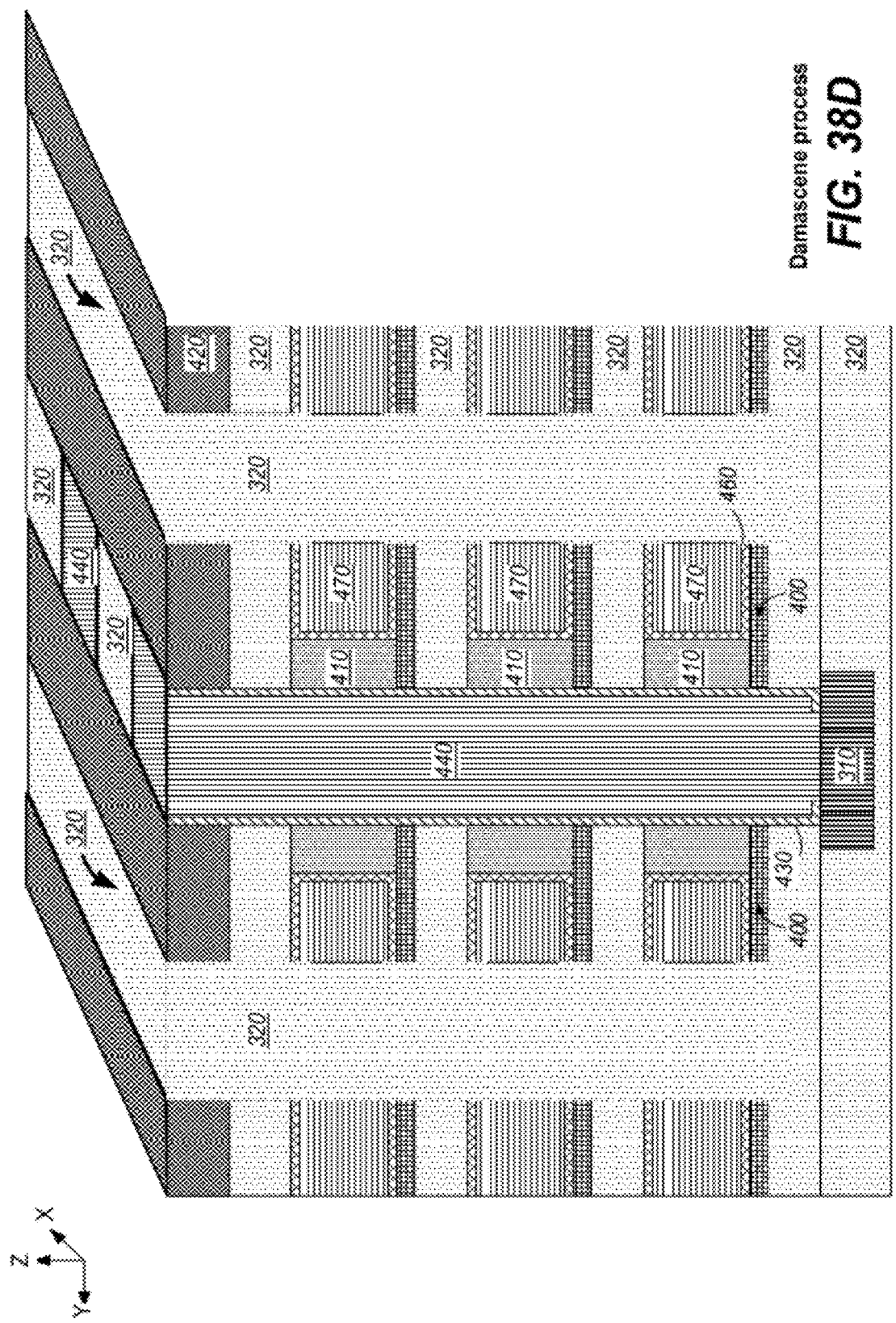
FIG. 38D illustrates filling in the portal with oxide 320 by CVD. This is followed by planarization.

FIG. 38D illustrates filling in the portal with oxide 320 by CVD. This is followed by planarization. In this way, the 3D memory structure shown in FIG. 35 is obtained.

The formation of metal lines and contacts for accessing the word lines 340 of the 3D memory is similar to that showed in FIG. 23 and is omitted here for not overly complicating the illustrations. Essentially, the word lines are accessed by contacts from either top or bottom of the 3D memory structure. Each word line is connected to a metal line at a surface of the 3D memory structure by a vertical riser column.

Preferably, the word lines at different layers are accessed by the risers using a terraced configuration similar to that shown in FIG. 26A.

3D Array of Read/Write Elements with Vertical Bit Lines and Select Devices

According to another aspect of the invention, a nonvolatile memory is provided with a 3D array of read/write (R/W) memory elements accessible by an x-y-z framework of an array of local bit lines or bit line pillars in the z-direction and word lines in multiple layers in the x-y plane perpendicular to the z-direction. An x-array of global bit lines in the y-direction is switchably coupled to individual ones of the local bit line pillars along the y-direction. This is accomplished by a select transistor between each of the individual local bit line pillars and a global bit line. Each select transistor is a pillar select device that is formed as a vertical structure, switching between a local bit line pillar and a global bit line. The pillar select devices, unlike previous embodiments where they are formed within a CMOS layer, are in the present invention formed in a separate layer (pillar select layer) above the CMOS layer, along the z-direction between the array of global bit lines and the array of local bit lines.

Figure 39:
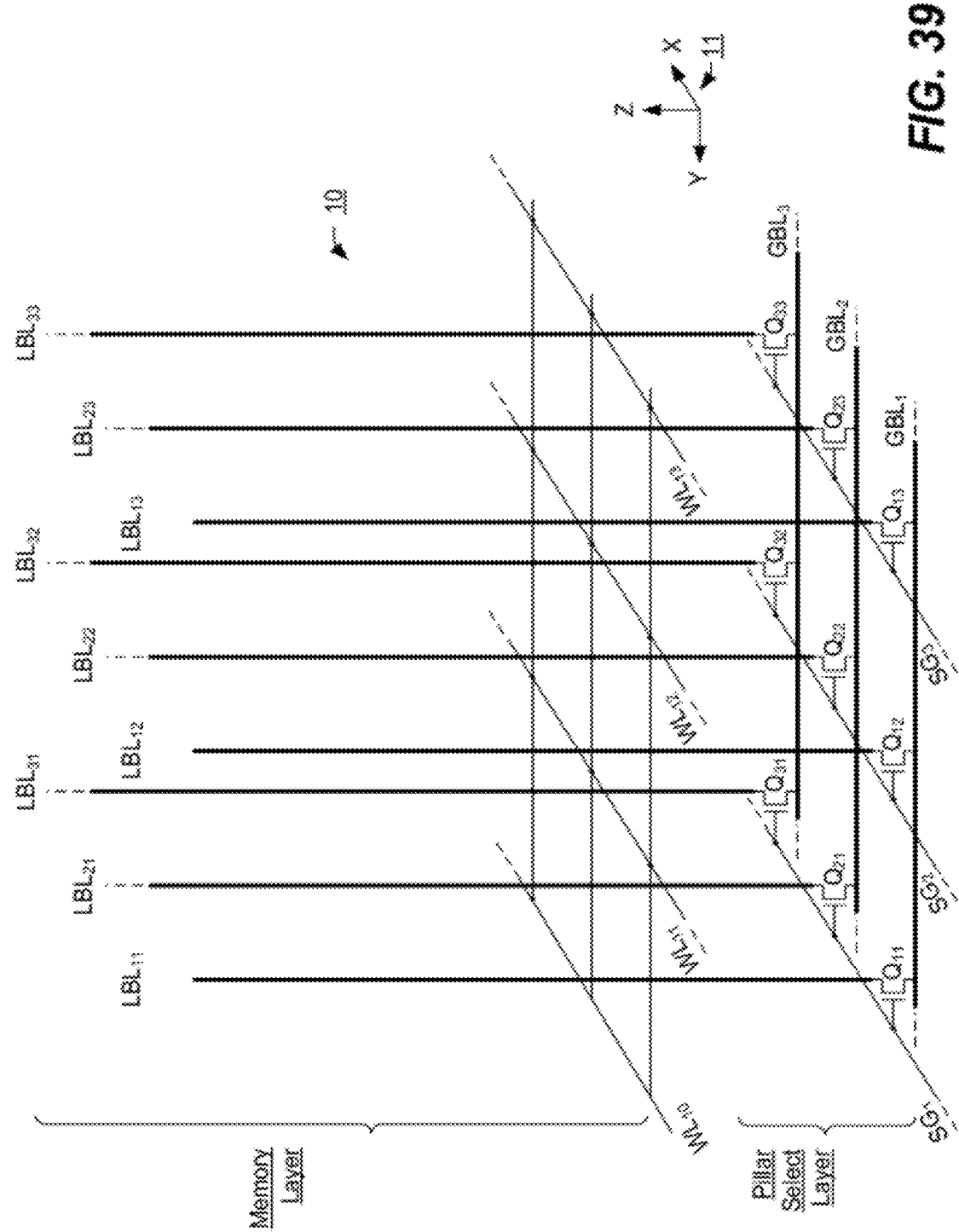
FIG. 39 illustrates schematically the 3D memory comprising of a memory layer on top of a pillar select layer.

FIG. 39 illustrates schematically the 3D memory comprising of a memory layer on top of a pillar select layer. The 3D memory 10 is formed on top of a CMOS substrate (not shown explicitly) where structures in the CMOS are referred to as being in the FEOL ("Front End of Lines") layer similar to that shown in FIG. 23. However, unlike FIG. 23, the select devices switching individual bit lines to individual global bit lines are now formed on top of the FEOL layer in the BEOL ("Back End of Lines". Thus, the BEOL comprises of the pillar select layer with the memory layer on top of it. The select devices such as $Q_{11}, Q_{12}, \ldots, Q_{21}, Q_{22}, \ldots$, etc are formed in the pillar select layer. The memory layer is similar to that illustrated in FIG. 23, comprising of multiple layers of word lines and R/W elements. For simplicity, FIG. 38 shows only one layer of word lines, such as $WL_{10}, W_{11}, \ldots$, etc without showing the R/W elements that exist between each crossing of a word line and a bit line.

Figure 40B:
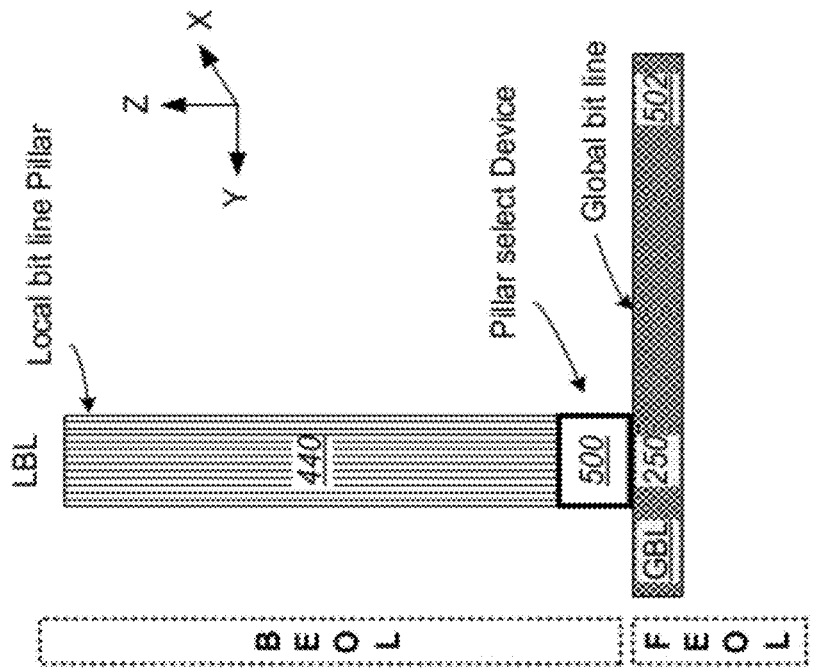
FIG. 40B illustrates the structure of the pillar select device in relation to the local bit line and the global bit line.
Figure 40A:
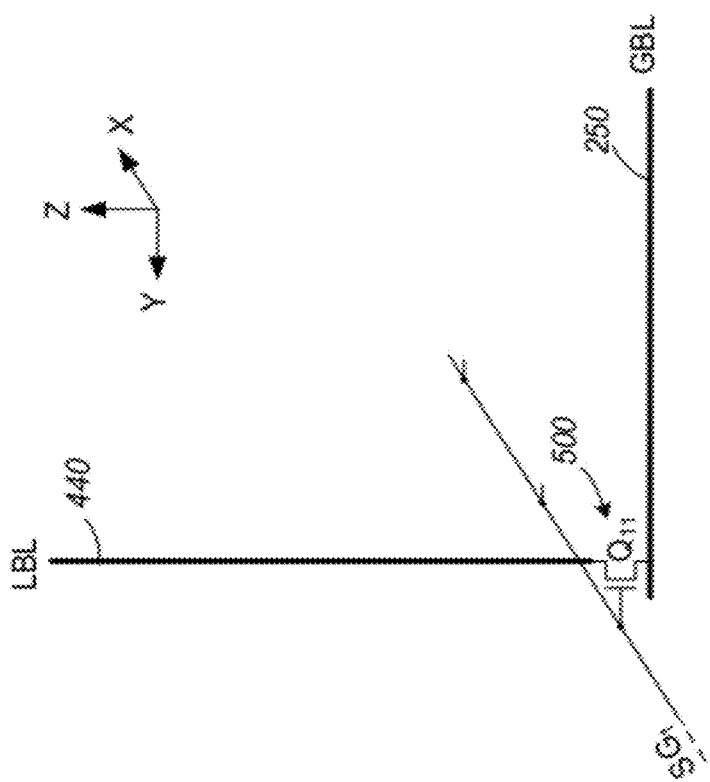
FIG. 40A illustrates a schematic circuit diagram of a given pillar select device switching a local bit line to a global bit line.

FIG. 40A illustrates a schematic circuit diagram of a given pillar select device switching a local bit line to a global bit line. In the example, the local bit line LBL 440 is switchable to the global bit line GBL 250 by a select transistor 500 such as $Q_{11}$. The gate of the select transistor $Q_{11}$ is controllable by a signal exerted on a block select line $SG_1$.

FIG. 40B illustrates the structure of the pillar select device in relation to the local bit line and the global bit line. The global bit line such as GBL 250 is formed in the FEOL as part of the metal layer-1 or metal layer-2 502. The pillar select device in the form of the select transistor 500 is formed in the BEOL layer on top of the GBL 250. The local bit line LBL 440, in the form of a pillar, is formed on top of the pillar select device 500. In this way, the pillar select device 500 can switch the local bit line pillar LBL to the global bit line GBL.

Figure 41:
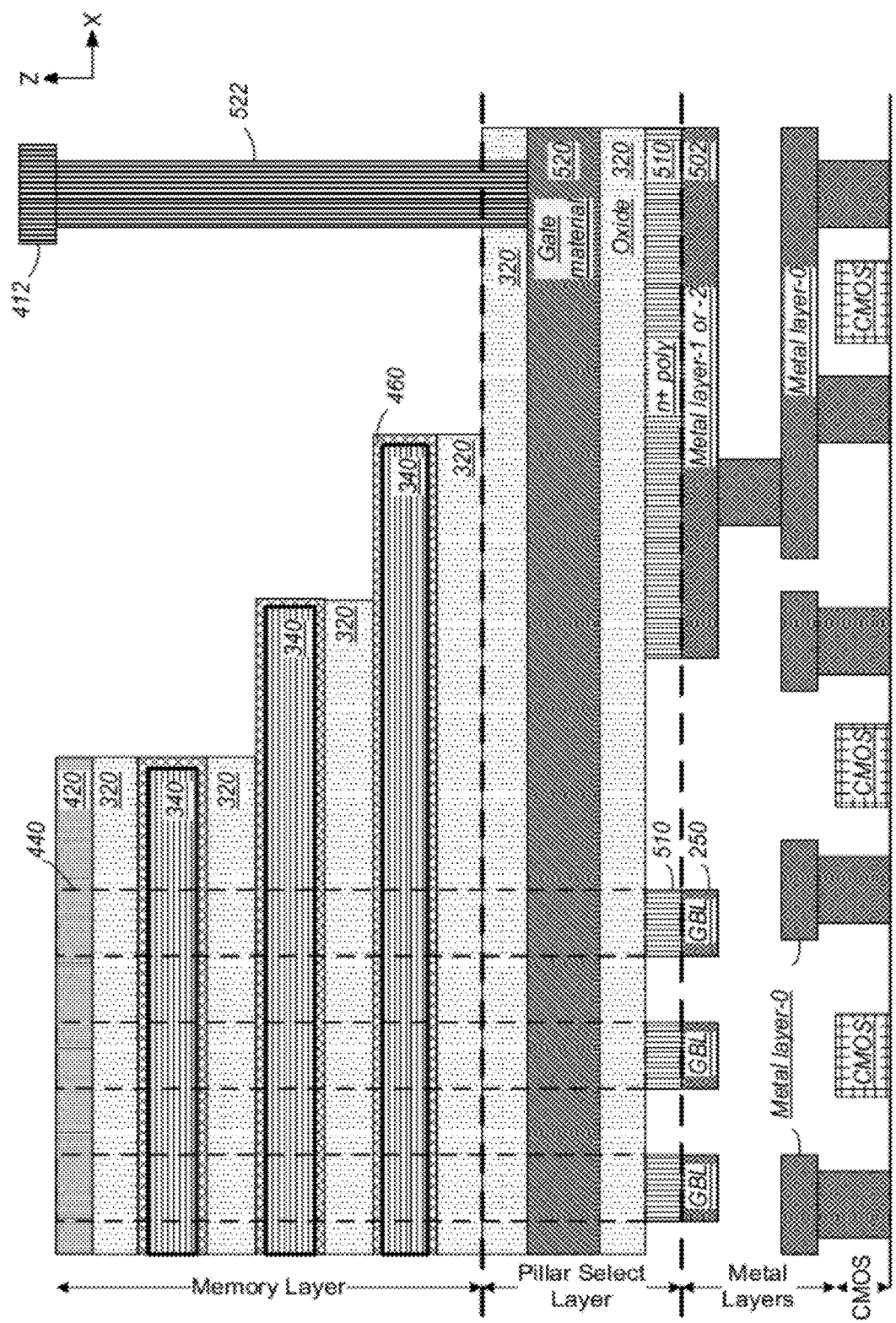
FIG. 41 illustrates the pillar select device in the overall scheme of the 3D memory device in a cross-sectional view from the y-direction along the global bit lines and perpendicular to the word lines.

FIG. 41 illustrates the pillar select device in the overall scheme of the 3D memory device in a cross-sectional view from the y-direction along the global bit lines and perpendicular to the word lines. Essentially, the 3D memory device comprises three gross layers: a CMOS and metal layer; a pillar select layer; and a memory layer. The 3D memory device is fabricated on top of the CMOS and metal layer. In the CMOS and metal layer, the CMOS provides a substrate for forming CMOS devices and for supporting the other gross layers on top of it. On top of the CMOS there may be several metal layers, such as metal layer-0, metal layer-1 and metal layer-2. The global bit lines GBL 250 are formed as one of these metal layers. For example, GBL 250 is metal layer-1 or metal layer-2.

The pillar select layer is where the pillar select device is formed between each local bit line pillar 440 (depicted as a column with broken line) and a global bit line 250. A layer 510 of N+ poly is formed on top of the global bit line 250. The layer 510 will eventually provide N+ dopants for creating the drain of the pillar select device. This is followed by a sandwich comprising an oxide layer 320, a gate material layer 520 and another oxide layer 320. The gate material layer 520 will form the block select line such as $SG_1$ shown in FIG. 39 and FIG. 40A. The block select gate 520 is accessible by a riser (zia) 522 to metal lines 412 on the top surface of the 3D memory device. Similar to the scheme shown in FIG. 27, the metal line 412 can also serve as a bridge and in turn be accessed by metal wires in the metal layers at the base portion through another zia configuration.

The memory layer comprises multiple layers of word lines 340 and R/W elements (not shown). Examples of the memory layer have been given earlier.

Figure 42:
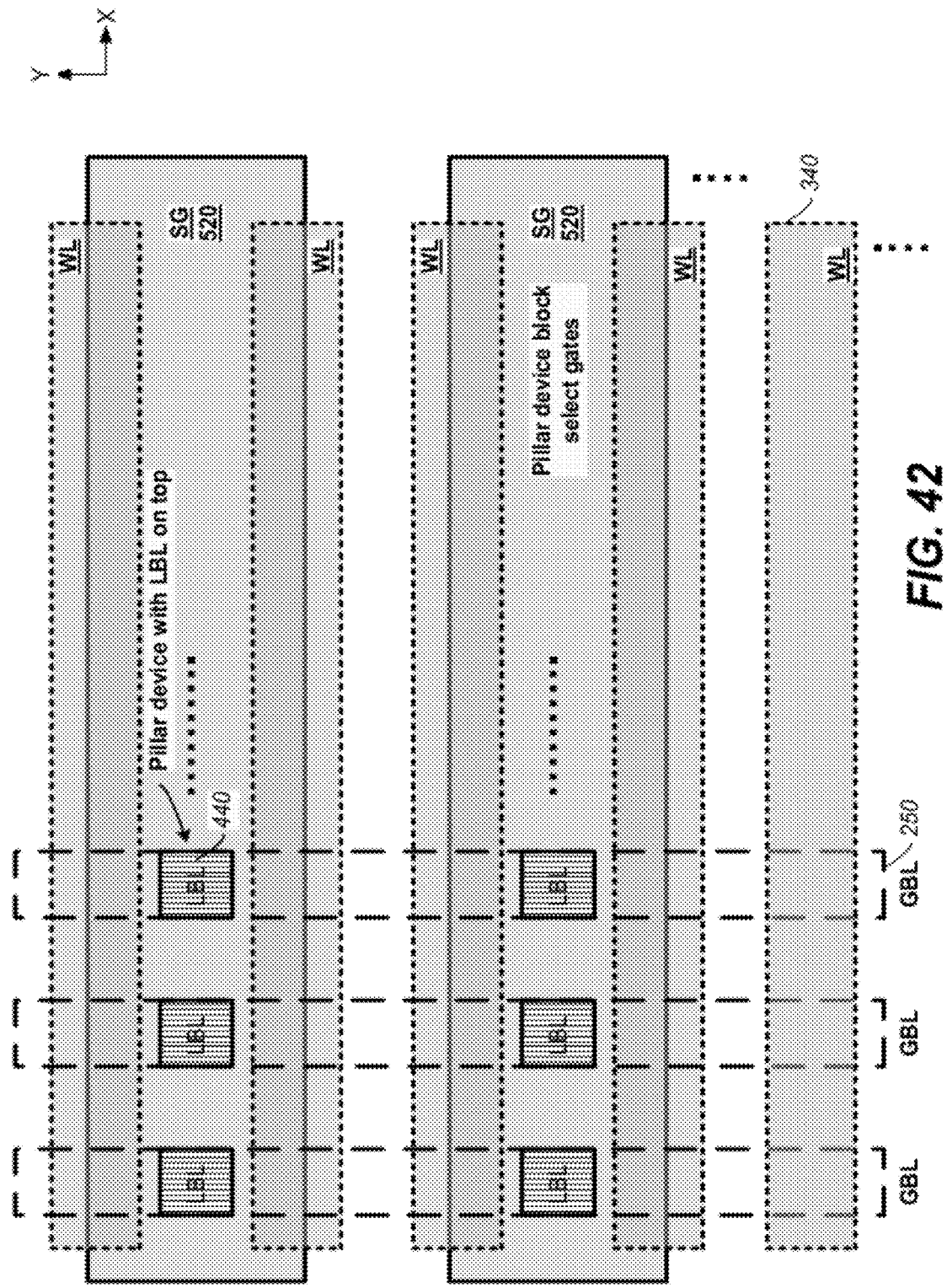
FIG. 42 illustrates a top (z-direction) view of a 2D layout of local bit lines, word lines, global bit lines and pillar device block select gates for one layer of the 3D memory.

FIG. 42 illustrates a top (z-direction) view of a 2D layout of local bit lines, word lines, global bit lines and pillar device block select gates for one layer of the 3D memory. A 2D array of local bit line LBL pillar is shown with each pillar 440 on its end. Below each LBL pillar is a pillar select device (not shown) which switchably connects each LBL pillar 440 to a corresponding global bit line GBL 250. Each row of LBL pillars in the x-direction has their row of pillar select devices switched in parallel by pillar device block select gates SG 520. In the preferred embodiment, the pillar device block select gate SG 520 is formed on all sides of each select device in the x-y plane of the row of pillar select devices in the x-direction. This effectively improves the field effect exerted by the select gate SG 520 on the row of pillar select devices and improves switching efficacy.

At each crossing between a word line WL 340 and a local bit line 440 is an R/W element (not shown.) At each memory layer, a block of R/W elements is formed by those R/W elements associated with a row of local bit lines cooperating with a pair of word lines. This block is selected by asserting a signal on the pillar device block select gates SG 520.

FIG. 43A-FIG. 43J illustrate the formation of the pillar select device at the BEOL (top) portion of 3D memory shown in FIG. 41 at various processing stages.

Figure 43A:
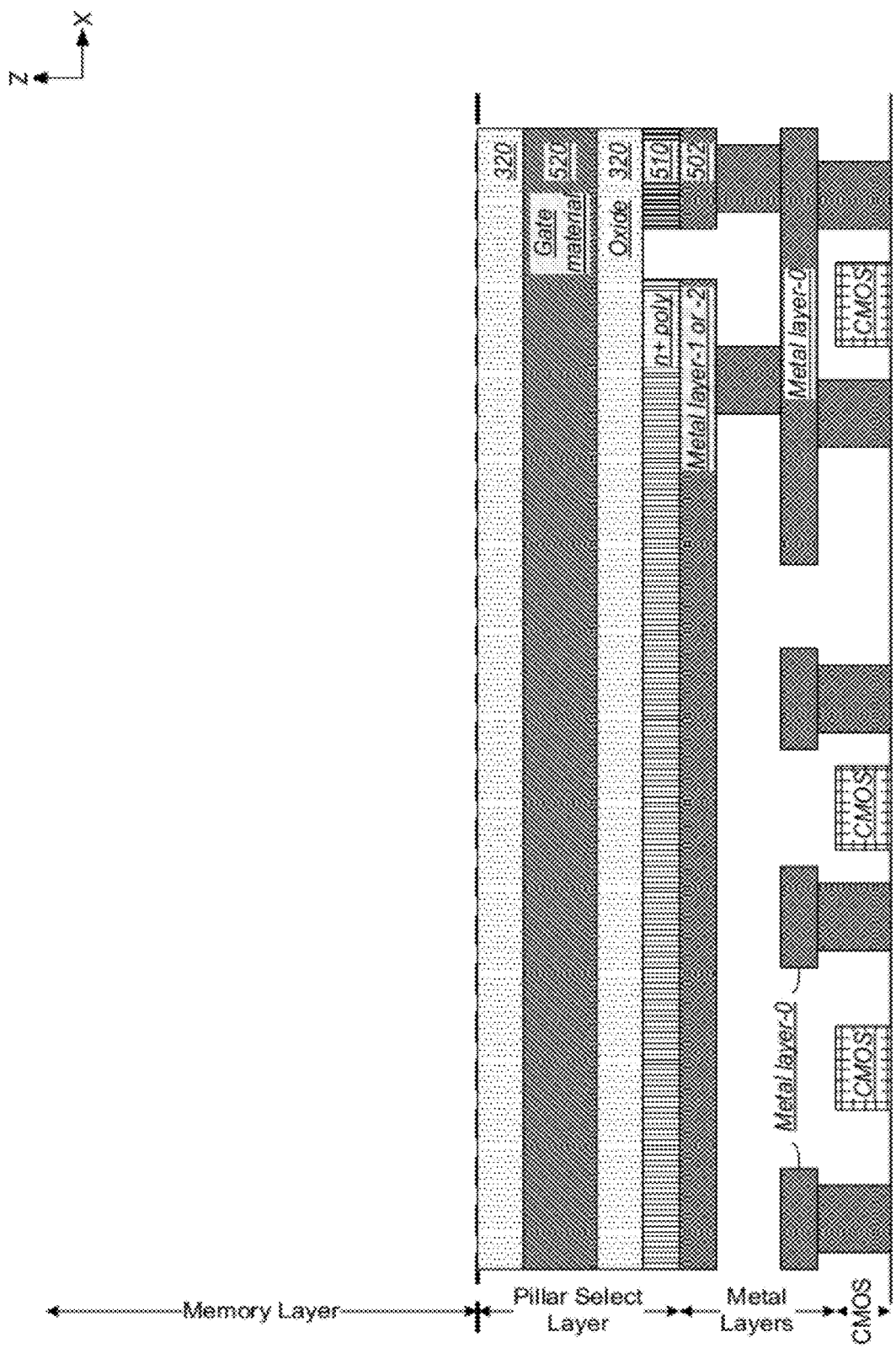
FIG. 43A illustrates a first stage of fabricating the pillar select layer.

FIG. 43A illustrates a first stage of fabricating the pillar select layer. As described in connection with FIG. 41, a layer 510 of N+ poly is formed on top of the global bit line 250. This is followed by a sandwich comprising an oxide layer 320, a gate material layer 520 and another oxide layer 320. The gate material layer 520 is, for example, metal or doped polysilicon. This gate material will form the block select line such as $SG_1$ shown in FIG. 38 and FIG. 39A.

Figure 43B:
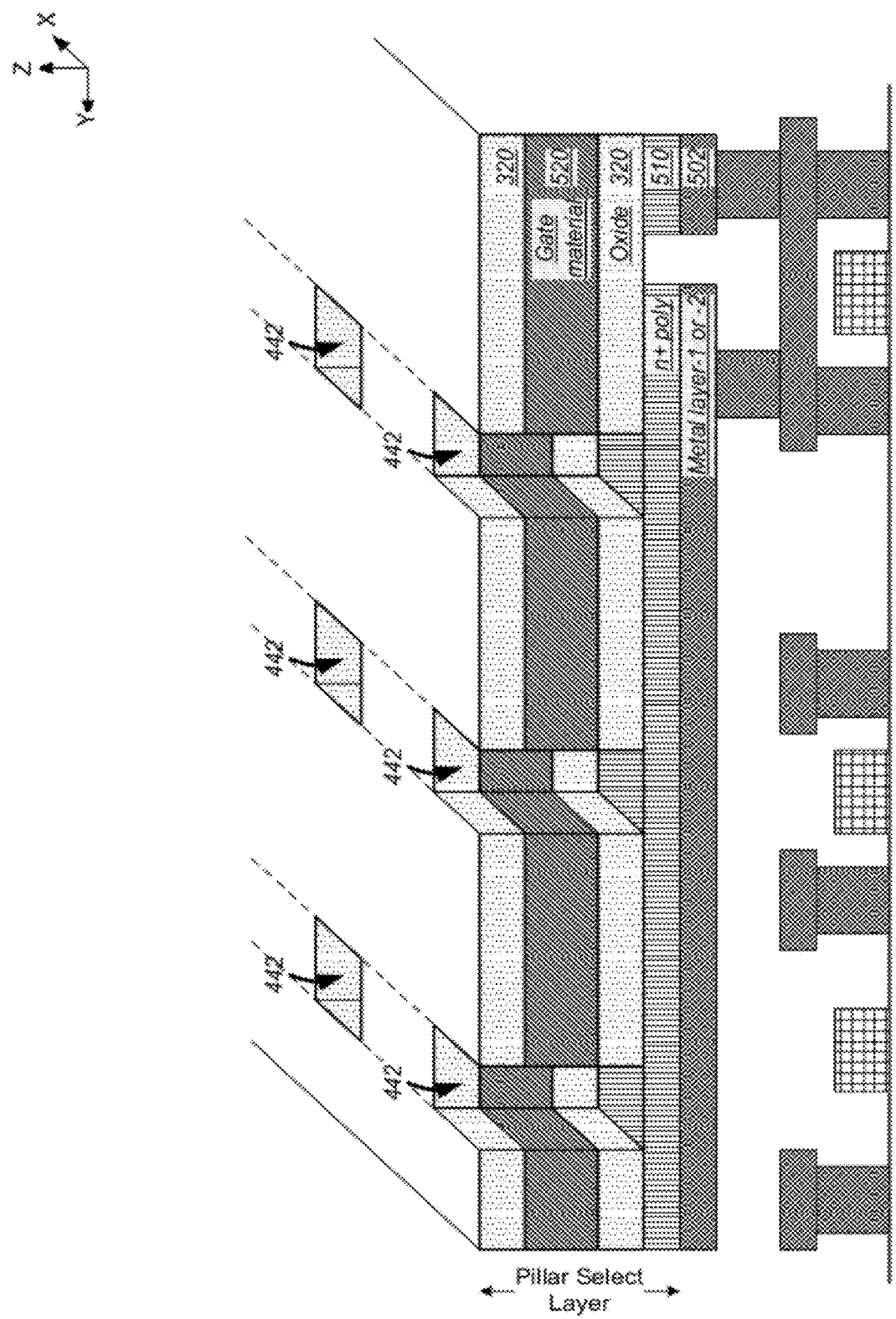
FIG. 43B illustrates a damascene process in which excavations are made in the pillar select layer sandwich by a hard mask and RIE process to form the pillar holes 442.

FIG. 43B illustrates a damascene process in which excavations are made in the pillar select layer sandwich by a hard mask and RIE process to form the pillar holes 442.

Figure 43C:
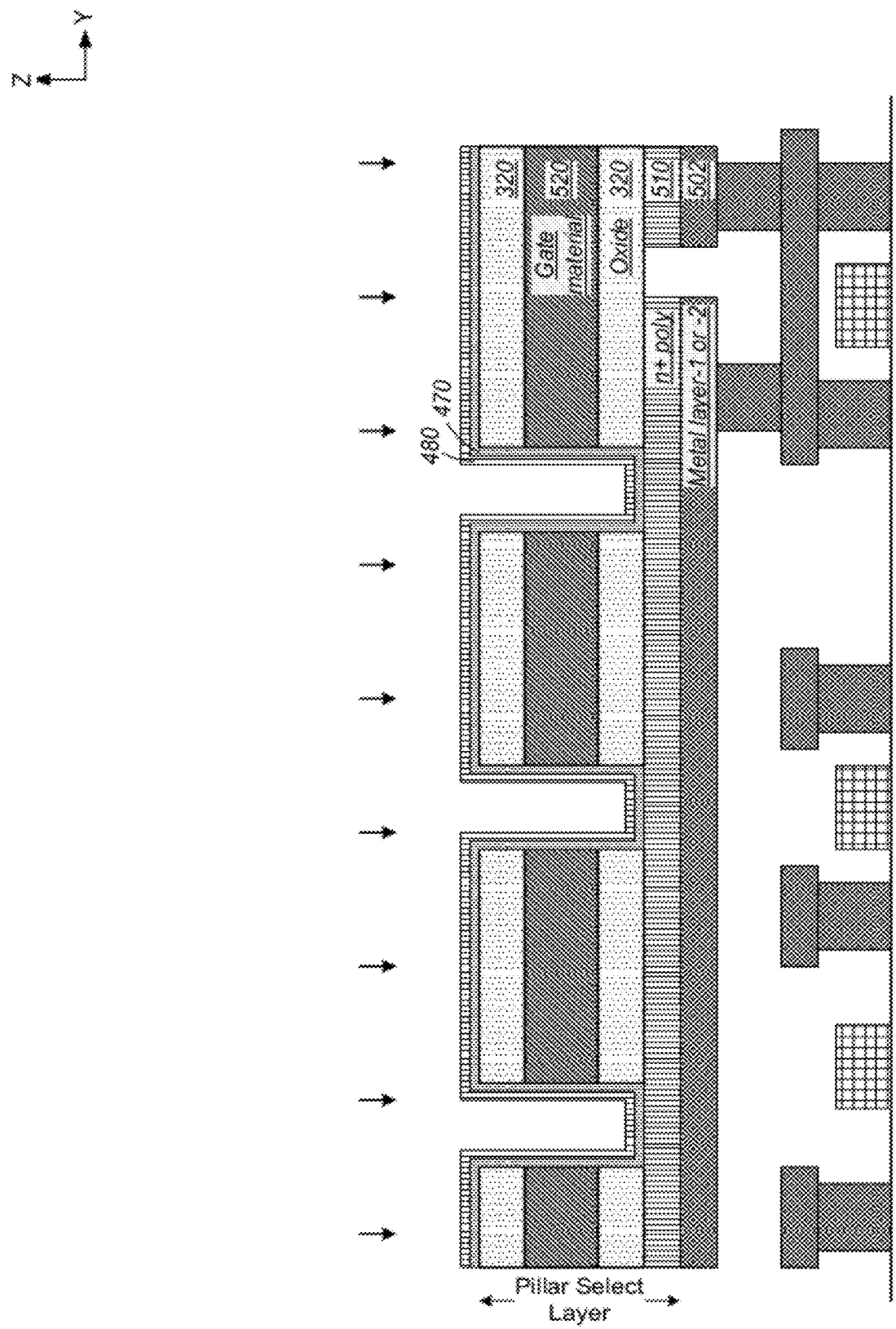
FIG. 43C illustrates the deposition of a gate oxide layer 470 followed by a poly layer 480.

FIG. 43C illustrates the deposition of a gate oxide layer 470 followed by a poly layer 480.

Figure 43D:
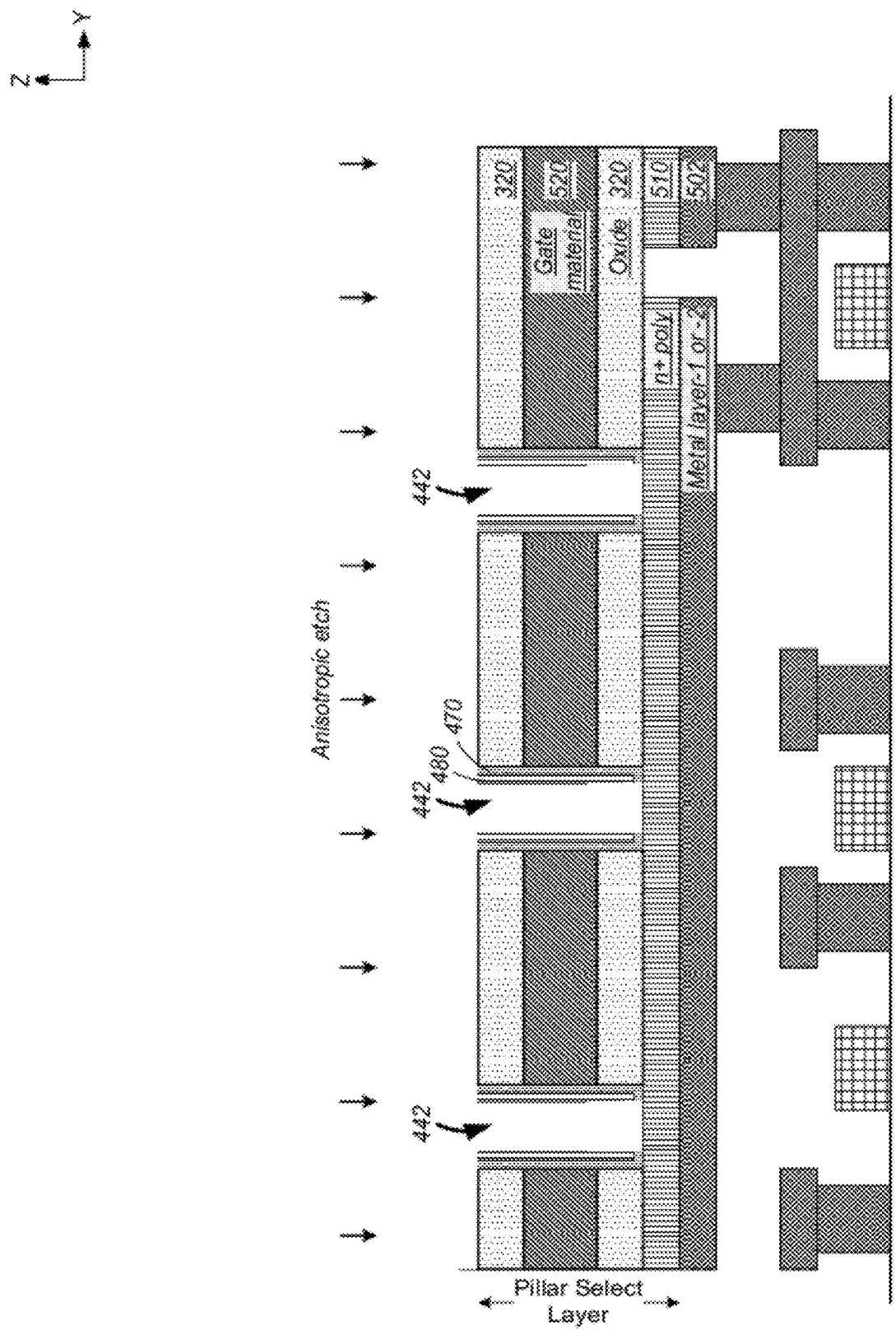
FIG. 43D illustrates an anisotropic etch in which the bottom of the pillar holes 442 is etched through to the n+ poly layer 510.

FIG. 43D illustrates an anisotropic etch in which the bottom of the pillar holes 442 is etched through to the n+ poly layer 510.

Figure 43E:
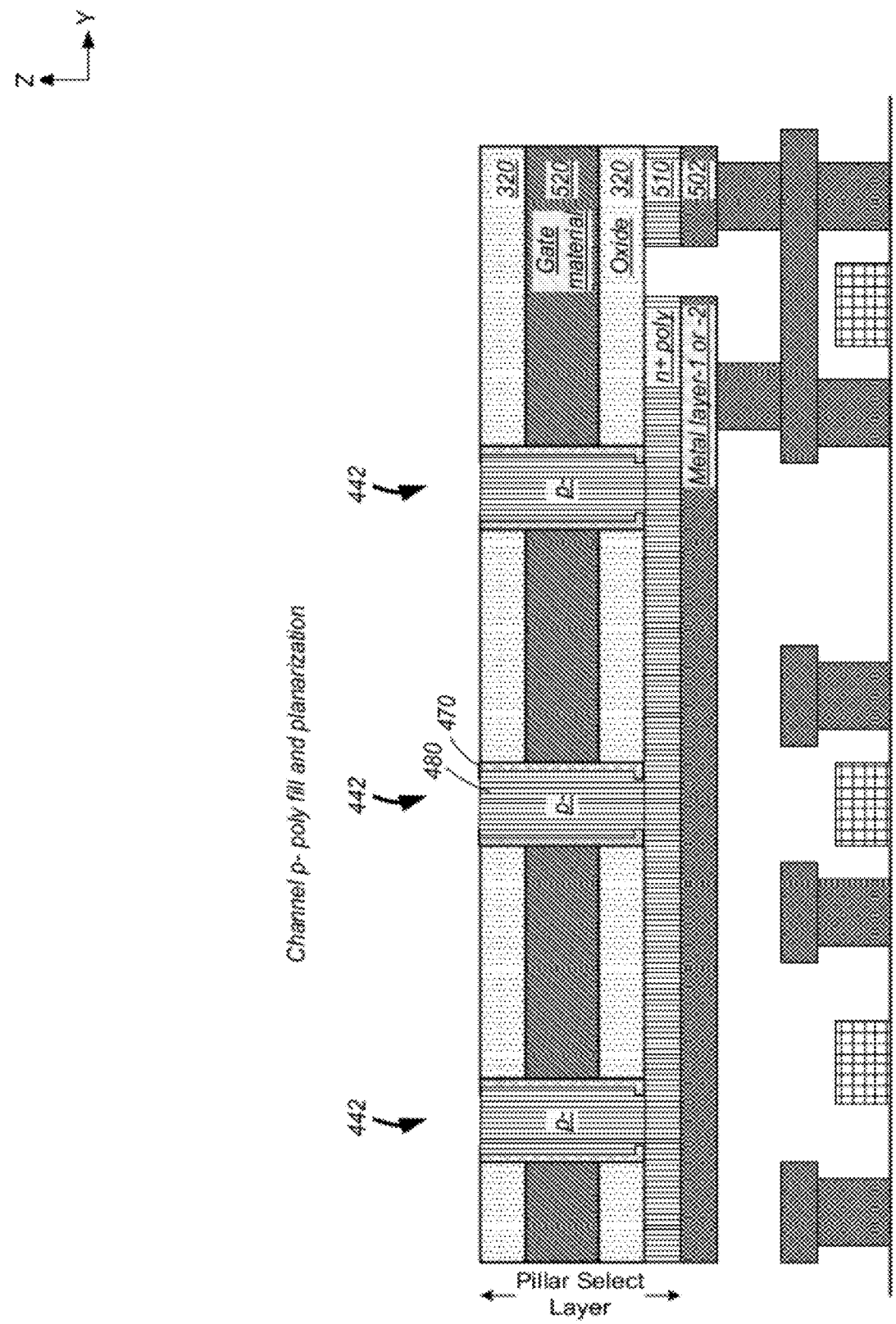
FIG. 43E illustrates the pillar holes being filled with P– poly. The pillar holes 442 are filled with P– poly which is a suitable channel material.

FIG. 43E illustrates the pillar holes being filled with P– poly. The pillar holes 442 are filled with P– poly which is a suitable channel material. This is finished with a planarization process.

Figure 43F:
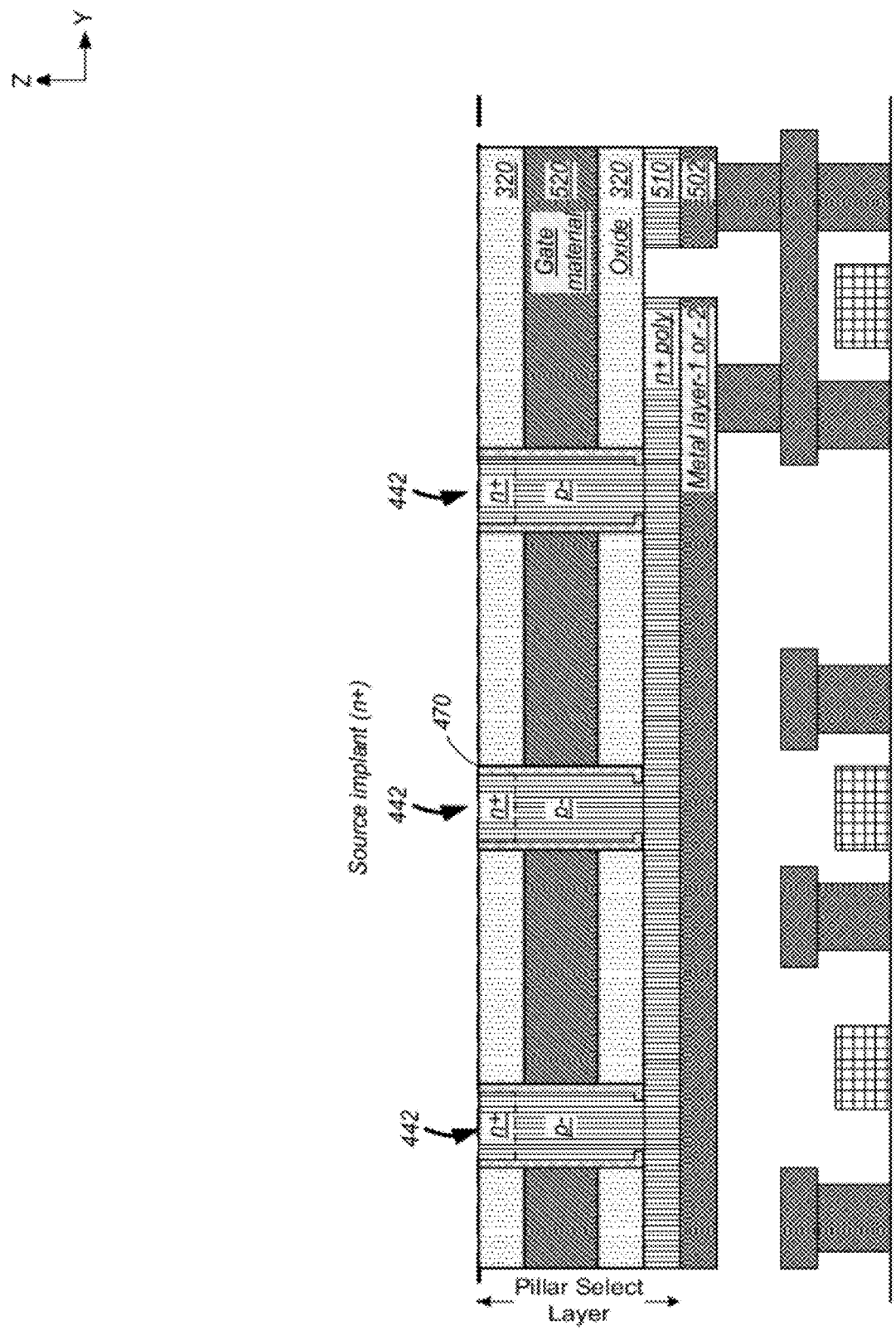
FIG. 43F illustrates creating a source region in the filled-in P-poly. This is accomplished by a blanket source implant of n+ through the filled in pillar holes 442.

FIG. 43F illustrates creating a source region in the filled-in P-poly. This is accomplished by a blanket source implant of n+ through the filled in pillar holes 442.

Figure 43G:
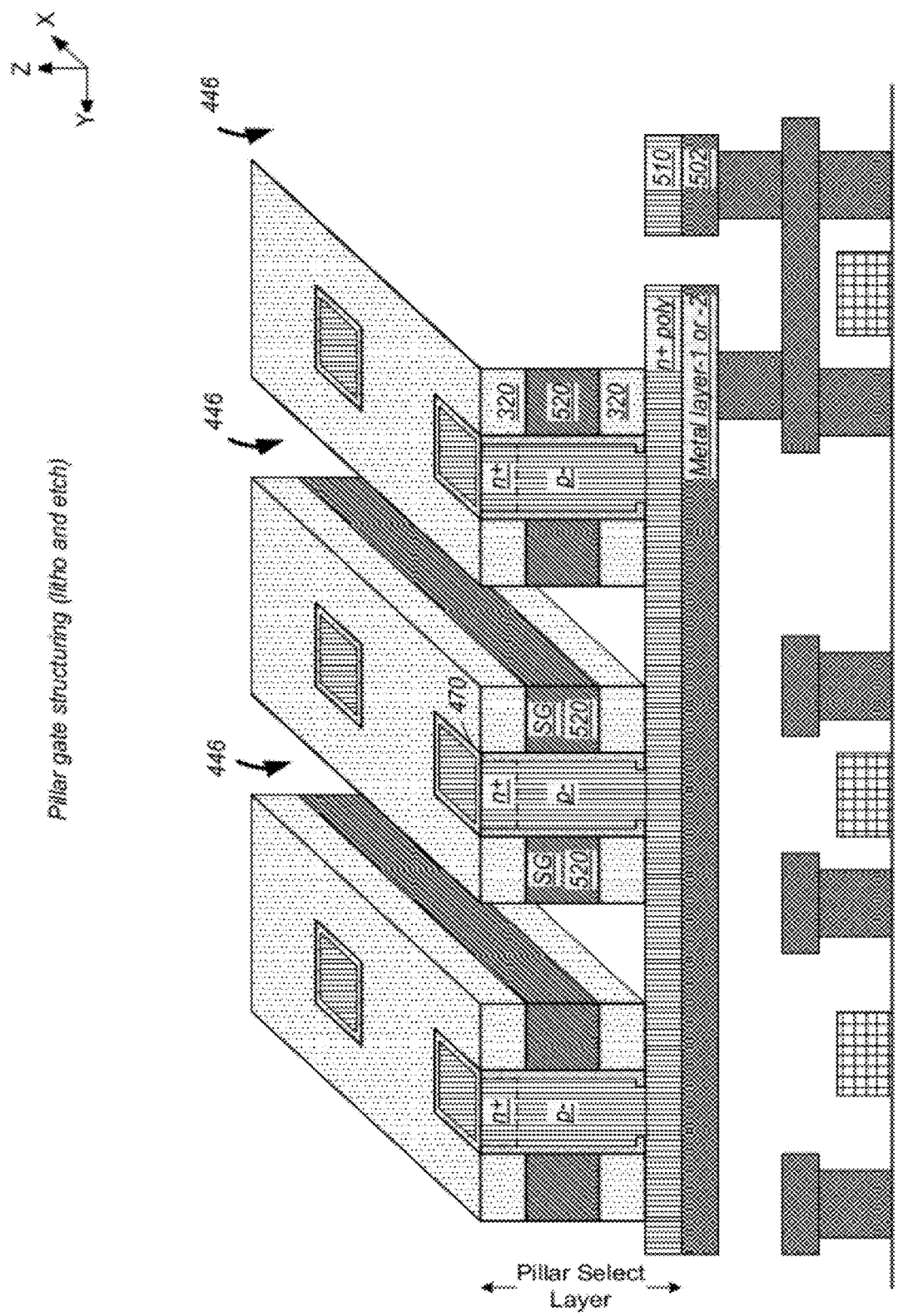
FIG. 43G illustrates a perspective view of the pillar select layer after trenches are cut.

FIG. 43G illustrates a perspective view of the pillar select layer after trenches are cut. The trenches 446 are cut to isolate the individual rows of pillars and to structure the pillar gates. This is accomplished by litho and etch processes.

Figure 43H:
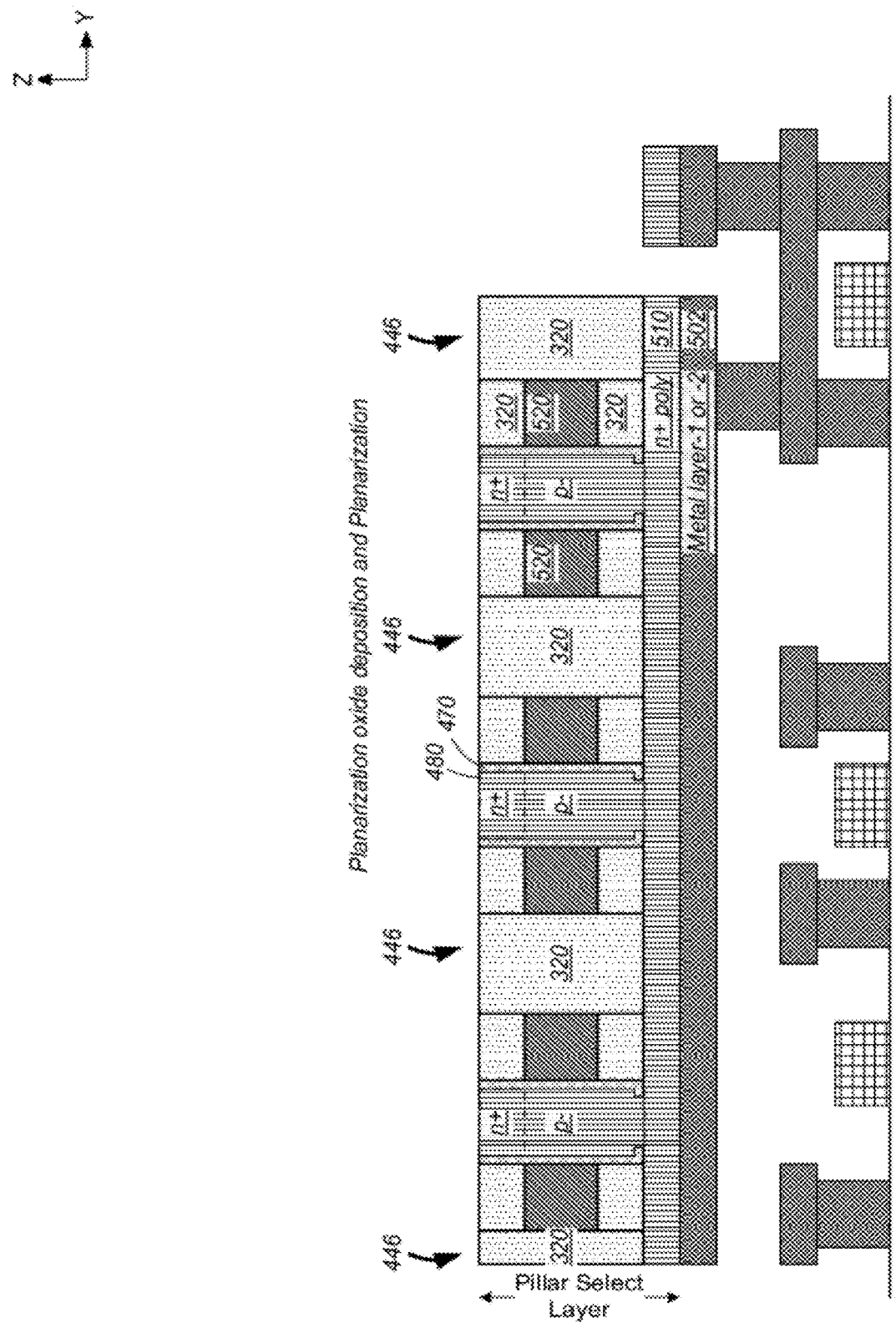
FIG. 43H illustrates filling the trenches with oxide.

FIG. 43H illustrates filling the trenches with oxide. The isolation trenches 446 are filled with oxide 320 followed by planarization.

Figure 43I:
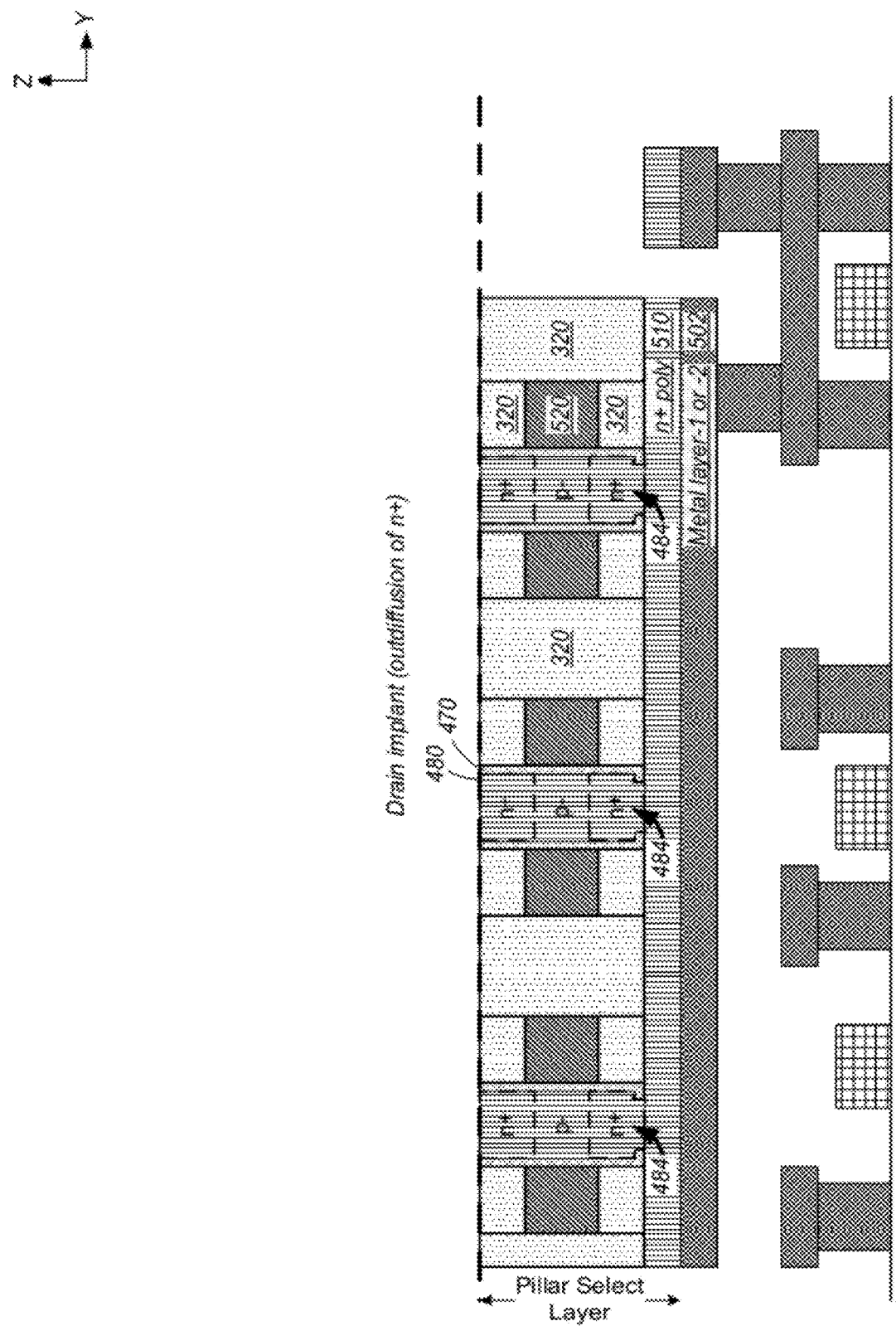
FIG. 43I illustrates the formation of the drain of the pillar select device.

FIG. 43I illustrates the formation of the drain of the pillar select device. The P– poly filling the pillar hole has its bottom end 484 doped with n+ to form the drain. This is accomplished by out diffusion of n+ implant from the n+ poly layer 510.

Thus, between each local bit line pillar and the metal line is formed a pillar select device in the form of a NPN transistor controlled by select gate control line 520 (see also FIG. 41.)

Figure 43J:
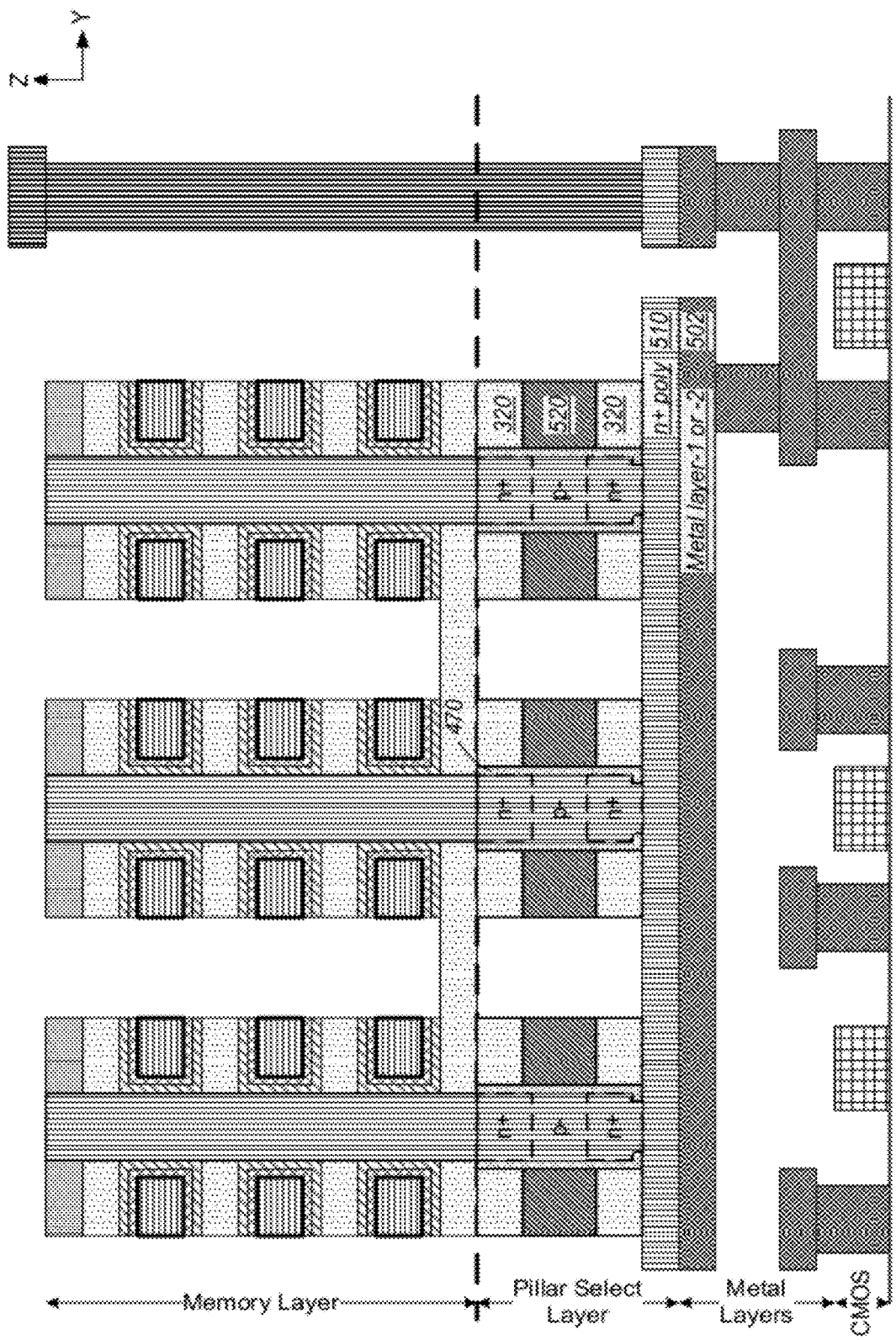
FIG. 43J illustrates an overall scheme of metal lines being formed on top of the CMOS substrate followed by the pillar select layer and the memory layer.

FIG. 43J illustrates an overall scheme of metal lines being formed on top of the CMOS substrate followed by the pillar select layer and the memory layer. After the pillar select layer has been formed as described in FIG. 43A-FIG. 43J, the memory layer is then formed on top of it. Examples of the formation of the memory layer have been given earlier.

3D Vertical Bit Line Memory Array with Fanout Word Lines

According to another aspect of the invention, a 3D memory having multiple layers of 2D array of R/W elements in the x-y plane are accessible by word lines among each layer and an array of vertical local bit lines in the z-direction common to all layers. A first set of metal lines acting as global bit lines are switchably connected to allow access to a selected group, such as a row, of vertical local bit lines. A second set of metal lines acting as global word lines are switchably connected to allow access to a selected group of word lines in each one of the layers.

In particular, the word lines in each group are in the form of the fingers of a comb with are joined at their common spine. For example, each comb may have 8 parallel word line fingers which are all switchably connected to a global word line. This configuration is expedient for laying out relatively short word lines while reducing the number of word line drivers and interconnects to the metal lines. In general, multiple combs of such word lines are laid out on each layer of 2D array.

Having relatively short word lines is advantageous in helping to minimize the voltage differential across the length of the word line. This in turn will help minimize the current leakage across the resistive mesh tied to the word line.

Figure 44:
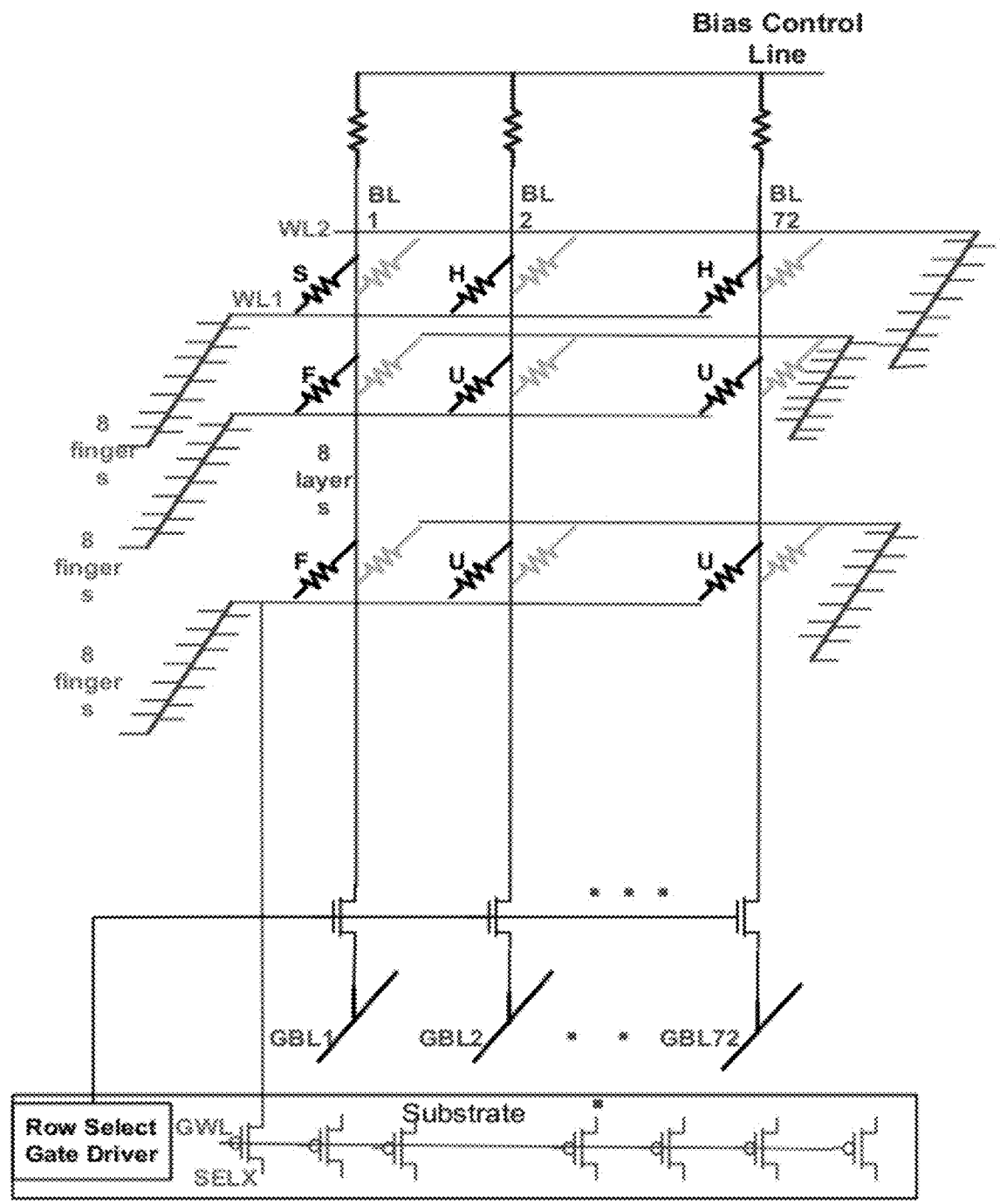
FIG. 44 illustrates a bias control line driving the row of individual bit lines BL1, BL2, . . . , BL72 via a network of resistors.

FIG. 44 illustrates a perspective view of a 3D memory array having 8 layers of 2D array of word lines and R/W elements. Each 2D array intersects an array of z-oriented local bit lines. Each layer contains multiple word line combs and each word line being a finger of a comb is parallel to a row (in the x-direction) of z-oriented local bit lines. In the example shown, the word line WL1 is one of the fingers of a word line combs at the top layer 1. An R/W element is disposed between each crossing of WL1 with each of a row of local bit lines BL1, BL2, ..., BL72.

Each word line comb is switchably connected to a corresponding metal global word line via a zia configuration similar to that shown in FIG. 26B and FIG. 27. Typically, access by the zia to the different layers of word line comb is by terracing the different layers as shown in FIG. 26B. Then each word line comb is connected via a zia configuration to a metal pad on the substrate of the CMOS. A select transistor SELX (similar to $Q_{11}$ in FIG. 27) selectively connects the word line comb to a metal global word line (not shown). In general the global word line can be oriented parallel or perpendicular to the word lines. The select transistor also acts as a word line driver and is preferably formed in the substrate. The select transistor is controlled by a word line group selection line (GWL in FIG. 44) which is oriented perpendicular to the global word line (not shown). In a one embodiment the word line group selection line enables one select transistor for at least one comb on each of the layers driven from one side of the 2D array and a similar number for interdigitated combs driven from the other side of the 2D array as shown in FIG. 44. In one embodiment the word line group selection line comprises the gate structure of the select transistors SELX, and is formed substantially parallel to the word lines and spans in the x direction many or even all the 2D Arrays in a generalized 3D array described in more detail below. Since the present example combines 8 word lines to share one driver, there is an eight-fold saving in space. Also, single-device drivers are sufficient because of the small matrix (where the unselected leakage is small, array tau ~1 ns.)

One example of the layout in a layer is to have an x-y array of vertical bit lines which is 72×16K. In other words, the x-y array has 16K rows and each row contains 72 vertical bit line intersections. Word lines each belonging to a finger of a comb run parallel to each row. If there are 8 layers, it is preferable to have 8 fingers in each comb to keep the scaling ratio constant. Thus there are a total of 2K word line combs in each layer. In a preferred embodiment, the word line combs can be grouped into interleaving odd and even combs to relieve layout space.

The pillar shaped local bit lines are each selected by a FET or JFET below each pillar but above the substrate shown as a vertically oriented select device in FIG. 44. This vertically oriented select device is controlled by a row select gate driver line. Thus, BL1 is switchably connected to the global bit line GBL1, BL2 to GBL2, etc. Typically, the entire row is switched together by a row select gate line.

Given the relative short word lines the 2D array in each layer has an aspect ratio that is much shorter in the row direction than that in the column direction. A generalized 3D array can be formed by laying out multiple such 2D arrays along the row direction. A single row select gate line can select many or even all similar rows of the multiple arrays.

In one example a single row select gate line spans 32 of the multiple arrays and selects all similar rows in the 32 2D arrays. In order to save support area the Global bit line spans a large number of rows, the word line group selection line spans a large number of columns. The other lines associated with the arrays span an intermediate of smaller number of cells in the x, y or z direction for selection flexibility and electrical limitations. The vertical bit line spans the fewest number of cells due to a signal to thermal noise ratio limit among other considerations. The word line spans an intermediate number of columns due a tradeoff between the desire to reduce leakage currents and a desire to reduce word line driver area. The row select gate driver line spans a larger number of columns to reduce the area for circuitry that controls the row select driver and allow flexibility in the number of 2D arrays selected. To achieve all the desired characteristics of support circuit density, performance, power dissipation, signal to noise ratio and leakage currents the span of the lines in increasing magnitude is ordered as local bit line span less than word line span less than row select gate driver span, all less than the span of the global bit line, the global word line and the word line group selection line.

Two levels of metal interconnection are provided for block support circuits, global word lines, and word line group selection, which drive the gate of the word line drivers. A third level of metal is provided for the global bit line.

According to another aspect of the invention, the group of vertical bit lines running along each word line is shunt with a resistor networks driven by a given bias voltage to provide biasing along the row. This helps compensate further any voltage differentials that may exist along the word line in order to control current leakage. In particular it helps to take off some of the current from the selected word line so that the IR voltage drop along the selected word line is correspondingly reduced.

FIG. 44 also illustrates a bias control line driving the row of individual bit lines BL1, BL2, ..., BL72 via a network of resistors. Although not shown explicitly, the same bias control line is also driving all other rows of bit lines associated with the same word line comb. In this example, it will be a total of 8 rows. Topologically, the bias control line can be regarded as yet another word line comb except the R/W elements are replaced by resistors.

For example, during read operations, the selected bit line is at about 0.5V, the selected word line is at 0V ground, the unselect word line is a 0.5V. The bias control line is set to the same voltage as the unselected word line so that it draws negligible current from the selected bit line. During program operations, the selected word line is at −2V, the selected bit line is at +2V and the unselected word line is at 0V ground. The bias control line is set to −3 to −4V.

CONCLUSION

Although the various aspects of the present invention have been described with respect to exemplary embodiments thereof, it will be understood that the present invention is entitled to protection within the full scope of the appended claims.

It is claimed:

1. A memory including memory elements arranged in a three-dimensional pattern defined by rectangular coordinates having x, y and z-directions and with a plurality of parallel planes stacked in the z-direction over a semiconductor substrate, the memory further comprising:
   a plurality of local bit lines elongated in the z-direction through the plurality of planes and arranged in a two-dimensional rectangular array of bit line pillars having rows in the x-direction and columns in the y-direction;
   a plurality of word lines elongated in the x-direction across individual planes and spaced apart in the y-direction between and separated from the plurality of bit line pillars in the individual planes, wherein the bit line pillars and word lines cross adjacent each other at a plurality of locations across the individual planes;
   a plurality of non-volatile re-programmable memory elements individually connected through circuits between the bit line pillars and the word lines adjacent the crossings thereof;
   a plurality of global conductive lines in the y-direction;
   a row of pillar select devices in the x-direction below a selected row of bit line pillar in the x-direction arranged to switch the selected row of bit line pillars to corresponding global conductive lines in the y-direction; and wherein:
   each pillar select device is a transistor above the semiconductor substrate and vertically aligned to a corresponding bit line pillar in the selected row of bit line pillars in the z-direction; and wherein:
   said plurality of parallel planes stacked in the z-direction has a top surface and a bottom surface; and
   a word line in a plane is accessed from the top surface via a conductive riser column connected to the word line.

2. The memory of claim 1, wherein:
   said row of pillar select devices in the x-direction is selected by a common select gate along the x-direction.

3. The memory of claim 1, wherein
   each pillar select device is vertically aligned in the z-direction and is controlled by a common select gate surrounding the vertically aligned transistor in the x-y plane.

4. The memory of claim 1, wherein
   said transistor comprises:
   a column of polysilicon in the z-direction having first, second and third portions from bottom to top;
   the first portion having n+ dopants;
   the second portion having p− dopants; and
   the third portion having n+ dopants.

5. The memory of claim 4, wherein
   a common select gate is adjacent to and surrounding the second portion in the x-y plane.

6. The memory of claim 1, wherein the individual memory elements include at least one of a carbon material or a phase change material.

7. The memory of claim 1, wherein the individual memory elements are characterized by a level of electrical conductance that changes in response to an electrical stimulus applied thereto.

8. The memory as in claim 1, wherein:
   the word lines are low melting-point metal including aluminum or copper.

9. The memory as in claim 1, wherein:
   the word lines are high melting-point metal including titanium.

10. The memory as in claim 1, wherein the individual memory elements are characterized by including a material that reversibly changes its level of electrical conductance between at least first and second stable levels in response to an electrical stimulus being applied through the first and second conductive lines between which the memory element is connected.

11. A memory including memory elements arranged in a three-dimensional pattern defined by rectangular coordinates having x, y and z-directions and with a plurality of parallel planes stacked in the z-direction over a semiconductor substrate, the memory further comprising:
   a plurality of local bit lines elongated in the z-direction through the plurality of planes and arranged in a two-dimensional rectangular array of bit line pillars having rows in the x-direction and columns in the y-direction;
   a plurality of word lines elongated in the x-direction across individual planes and spaced apart in the y-direction between and separated from the plurality of bit line pillars in the individual planes, wherein the bit line pillars and word lines cross adjacent each, other at a plurality of locations across the individual planes;
   a plurality of non-volatile re-programmable memory elements individually connected through circuits between the bit line pillars and the word lines adjacent the crossings thereof;
   a plurality of global conductive lines in the y-direction;
   a row of pillar select devices in the x-direction below a selected row of bit line pillar in the x-direction arranged to switch the selected row of bit line pillars to corresponding global conductive lines in the y-direction; and wherein:
   each pillar select device is a transistor above the semiconductor substrate and vertically aligned to a corresponding bit line pillar in the selected row of bit line pillars in the z-direction;
   said plurality of parallel planes stacked in the z-direction has a top surface and a bottom surface; and
   a common select gate for a row of pillar select devices is accessed from the top surface via a conductive riser column connected to the common select gate.

12. The memory of claim 11, wherein:
   said row of pillar select devices in the x-direction is selected by a common select gate along the x-direction.

13. The memory of claim 11, wherein
   each pillar select device is vertically aligned in the z-direction and is controlled by the common select gate surrounding the vertically aligned transistor in the x-y plane.

14. The memory of claim 11, wherein
said transistor comprises:
a column of polysilicon in the z-direction having first, second and third portions from bottom to top;
the first portion having n+ dopants;
the second portion having p– dopants; and
the third portion having n+ dopants.

15. The memory of claim 14, wherein
a common select gate is adjacent to and surrounding the second portion in the x-y plane.

16. The memory of claim 11, wherein the individual memory elements include at least one of a carbon material or a phase change material.

17. The memory of claim 11, wherein the individual memory elements are characterized by a level of electrical conductance that changes in response to an electrical stimulus applied thereto.

18. The memory as in claim 11, wherein:
the word lines are low melting-point metal including aluminum or copper.

19. The memory as in claim 11, wherein:
the word lines are high melting-point metal including titanium.

20. The memory as in claim 11, wherein the individual memory elements are characterized by including a material that reversibly changes its level of electrical conductance between at least first and second stable levels in response to an electrical stimulus being applied through the first and second conductive lines between which the memory element is connected.

* * * * *